(12) United States Patent
Luo et al.

(10) Patent No.: US 12,382,833 B2
(45) Date of Patent: Aug. 5, 2025

(54) PIEZOELECTRIC MEMS VALVE FOR AN ELECTRONIC DEVICE

(71) Applicant: Apple Inc., Cupertino, CA (US)

(72) Inventors: Guo-Lun Luo, Santa Clara, CA (US); Gokhan Hatipoglu, Milpitas, CA (US); Peter C. Hrudey, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 16 days.

(21) Appl. No.: 18/095,870

(22) Filed: Jan. 11, 2023

(65) Prior Publication Data

US 2023/0270010 A1  Aug. 24, 2023

Related U.S. Application Data

(60) Provisional application No. 63/311,833, filed on Feb. 18, 2022.

(51) Int. Cl.
*H10N 30/20* (2023.01)
*F16K 31/00* (2006.01)
*H10N 30/87* (2023.01)

(52) U.S. Cl.
CPC ....... *H10N 30/2042* (2023.02); *F16K 31/006* (2013.01); *H10N 30/87* (2023.02)

(58) Field of Classification Search
USPC ........................ 251/11, 129.06; 310/330–332
See application file for complete search history.

(56) References Cited

U.S. PATENT DOCUMENTS 5,970,998 A * 10/1999 Talbot ................. F16K 99/0044
  251/129.02
6,590,267 B1   7/2003 Goodwin-Johansson et al.
7,227,296 B2 * 6/2007 Topliss ..................... G02B 7/04
  310/348
7,789,371 B2 * 9/2010 Gianchandani ..... F16K 99/0001
  251/129.01
8,011,388 B2 * 9/2011 Fuller ................. F16K 99/0001
  137/831
11,605,775 B2 * 3/2023 Kishimoto ........... H10N 30/853
11,884,535 B2 * 1/2024 Liang ................... H04R 19/005
(Continued)

OTHER PUBLICATIONS

"xMEMS Announces Montara Pro, the World's First MEMS Microspeaker with Integrated DynamicVent for Intelligent TWI Earbuds and Hearing Aids," BusinessWire, Retrieved from the Internet on Jan. 3, 2023, <https://www.businesswire.com/news/home/20220103005009/en/xMEMS-Announces-Montara-Pro-the-World%E2%80%99s-First-MEMS-Microspeaker-with-Integrated-DynamicVent-for-Intelligent-TWS-Earbuds-and-Hearing-Aids>, 5 pages.

(Continued)

*Primary Examiner* — Matthew W Jellett
(74) *Attorney, Agent, or Firm* — Aikin & Gallant, LLP

(57) ABSTRACT

A piezoelectric valve comprising: a fixed portion defining an opening; and a number of movable portions extending from the fixed portion over the opening and separated from one another by radially oriented slits, each movable portion of the number of movable portions comprising a first material layer and a second material layer, and at least one of the first material layer or the second material layer comprises a piezoelectric material that is operable to drive a displacement of the movable portion in a direction opposite to an adjacent movable portion sharing a same radially oriented slit upon application of a voltage.

23 Claims, 29 Drawing Sheets

(56) References Cited

U.S. PATENT DOCUMENTS

| | | | |
|---|---|---|---|
| 2020/0100033 A1* | 3/2020 | Stoppel | H04R 31/003 |
| 2020/0213770 A1* | 7/2020 | Duan | H04R 17/02 |
| 2021/0057634 A1* | 2/2021 | Kishimoto | H10N 30/874 |
| 2022/0014838 A1 | 1/2022 | Liang et al. | |
| 2022/0225032 A1 | 7/2022 | Liang et al. | |
| 2023/0060555 A1* | 3/2023 | Suzuki | H10N 30/306 |

OTHER PUBLICATIONS

"Products," xMEMS, retrieved from the Internet on Jan. 3, 2023, <https://xmems.com/products/>, 3 pages.

"VM1000," Vesper's Disruptive PEBL MEMS Technology, retrieved from the Internet on Jan. 3, 2023, <https://vespermems.com/products/vm1000/>, 6 pages.

\* cited by examiner

PIEZOELECTRIC MEMS VALVE FOR AN ELECTRONIC DEVICE

CROSS-REFERENCE TO RELATED APPLICATIONS

The application is a non-provisional application of co-pending U.S. Provisional Patent Application No. 63/311,833, filed Feb. 18, 2022 and incorporated herein by reference.

FIELD

An aspect of the disclosure is directed to a piezoelectric micro-electromechanical systems (MEMS) valve for an electronic device. Other aspects are also described and claimed.

BACKGROUND

Portable communications or listening devices (e.g., smart phones, earphones, etc.) have within them one or more transducers that convert an input electrical audio signal into a sound pressure wave output that can be heard by the user, or a sound pressure wave input into an electrical audio signal. The transducer (e.g., a speaker) can be used to, for example, output sound pressure waves corresponding to the voice of a far end user, such as during a telephone call, or to output sound pressure waves corresponding to sounds associated with a game or music the user wishes to play. Due to the relatively low profile of the portable devices, the transducers also have a relatively low profile, which in turn, can make it difficult to maintain optimal sound quality.

SUMMARY

An aspect of the disclosure is directed to a dynamic valve that can be used to control an amount of leak through an acoustic port between electronic device inner cavities and/or the inner cavities and an ambient environment surrounding the electronic device. Representatively, in the case of earphones, in some cases a perfect seal (high impedance or resistance) is desired, whereas in other cases a very open path (low impedance or resistance) is desired. Representatively, in some cases, where the earphone fits relatively tightly within the ear and forms a seal with the ear canal, or at least a partial seal, user's may experience an undesirable occlusion effect. For example, during active noise control (ANC) or noise cancellation, the user may want the in-ear device to be isolated with passive isolation and ANC (closed valve) but when outdoors it may be desirable for transparency (open valve) so there is a more natural and lower occlusion effect when speaking. The valve therefore allows for the acoustic resistance of the port and/or pressure level of the associated cavity(s) to be dynamically controlled and/or changed during system operation for improved sound performance.

Representatively, in some aspects, the disclosure is directed to a piezoelectric valve including a fixed portion defining an opening; and a number of movable portions extending from the fixed portion over the opening and separated from one another by radially oriented slits, each movable portion of the number of movable portions comprising a first material layer and a second material layer, and at least one of the first material layer or the second material layer comprises a piezoelectric material that is operable to drive a displacement of the movable portion in a direction opposite to an adjacent movable portion sharing a same radially oriented slit upon application of a voltage. In some aspects, the first material layer may include an inactive material layer and the second material layer may include the piezoelectric material. In other aspects, the first material layer may include the piezoelectric material and the second material layer may further include a piezoelectric material. In some aspects, the displacement of the number of movable portions transitions the valve to an open position allowing a fluid to flow through the opening. In still further aspects, at least three movable portions of the number of movable portions are operable to be displaced in a first direction and at least three adjacent movable portions of the number of movable portions are operable to be displaced in a second direction opposite to the first direction. In some aspects, each movable portion comprises a cantilever having a tapered shape. In other aspects, each movable portion comprises a polygon shape. The polygon shape may include a first side having a different length than a second side. In some aspects, the number of movable portions are arranged in a spiral. In some aspects, each movable portion comprises a length dimension extending to a center of the opening, the inactive material layer extends along the entire length of the movable portion and the piezoelectric material layer extends along less than the entire length of the movable portion and causes the inactive material layer to bend upon application of the voltage. In still further aspects, a corrugation is formed in a surface of each movable portion. In some aspects, a sensing member coupled to the movable portion to sense a position of the movable portion.

In other aspects, the disclosure is directed to a piezoelectric valve comprising: a fixed portion defining an opening; and a number of interdigital cantilevers coupled to the fixed portion and extending over the opening, each interdigital cantilever of the number of interdigital cantilevers comprises a first material layer and a second material layer, and at least one of the first material layer or the second material layer comprises a piezoelectric material that drives a displacement of the number of interdigital cantilevers upon application of a voltage, and wherein adjacent interdigital cantilevers of the number of interdigital cantilevers are displaced in opposite directions. In some aspects, the first material layer comprises an inactive material layer and the second material layer comprises the piezoelectric material. In other aspects, the first material layer comprises the piezoelectric material and the second material layer further comprises a piezoelectric material. In some aspects, each interdigital cantilever of the number of interdigital cantilevers comprises a tapered shape or a rectangular shape. In some aspects, the number of interdigital cantilevers comprises a first set of interdigital cantilevers that extend from a first side of the opening all move in a first direction and a second set of interdigital cantilevers that extend from a second side of the opening and all move in a second direction upon application of the voltage. In some aspects, each interdigital cantilever of the number of interdigital cantilevers are arranged in pairs that are coupled together at least one end. In some aspects, each interdigital cantilever of the number of interdigital cantilevers are arranged in sets of a first interdigital cantilever, a second interdigital cantilever and a third interdigital cantilever, and the first interdigital cantilever is coupled to one end of the second interdigital cantilever and another end of the second interdigital cantilever is coupled to the third interdigital cantilever.

In another aspect, the disclosure is directed to a piezoelectric valve comprising: a fixed portion defining an opening; and a number of movable plates extending from the fixed portion over the opening and separated from one another by slits, each movable plate of the number of movable plates comprising a first material layer and a second material layer, and at least one of the first material layer or the second material layer comprises a piezoelectric material that is operable to drive a displacement of edges of the movable plates in opposite directions. In some aspects, the first material layer comprises an inactive material layer and the second material layer comprises the piezoelectric material. In some aspects, the first material layer comprises the piezoelectric material and the second material further comprises a piezoelectric material. In some aspects, each movable plate of the number of movable plates comprises four edges and the second material layer comprises the piezoelectric material in a rectangular shape that is arranged parallel to at least one of the four edges of each movable plate. In some aspects, the number of movable plates comprises at least four movable plates arranged in a two by two array. In some aspects, the displacement of the edges comprises at least two edges of a first movable plate moving out of plane in a first direction and at least two edge of a second movable plate moving out of plane in a second direction opposite to the first direction.

In still further aspects, the disclosure is directed to a piezoelectric valve comprising: a fixed portion defining an opening; and a rotational plate extending over the opening and coupled to the fixed portion by a number of anchor portions, each anchor portion of the number of anchor portions a first material layer and a second material layer, and at least one of the first material layer or the second material layer comprises a piezoelectric material that drives a rotation of the rotational plate upon application of a voltage. In some aspects, the first material layer comprises an inactive material layer and the second material layer comprises the piezoelectric material. In still further aspects, the first material layer comprises the piezoelectric material and the second material further comprises a piezoelectric material. In some aspects, the rotational plate comprises a middle portion rotatably coupled to the number of anchor portions and opposing ends that move in plane or out of plane relative to the middle portion upon rotation of the rotational plate to close or open the opening. In some aspects, the opposing ends comprise a number of movable members separated by slits that open or close upon application of the voltage.

In still further aspects, the disclosure is directed to a portable electronic device comprising: an enclosure having an enclosure wall that forms an interior chamber and a port to an ambient environment; and a piezoelectric valve coupled to the port and comprising a number of movable members operable to be deformed in opposite directions upon application of a voltage to modify an acoustic resistance of the port. In some aspects, the adjacent movable portions are deformed in opposite directions. In some aspects, each movable member of the number of movable members comprises a polygon shape. In some aspects, the number of movable members comprise at least two sets of interdigital cantilevers. In some aspects, the number of movable members comprises a rotatable plate having at least two deformable ends. In some aspects, each movable member of the number of movable members comprises at least two material layers and at least two electrode layers, and at least one of the two material layers comprises a piezoelectric material operable to drive the deformation of each movable member upon application of the voltage. In some aspects, the application of the voltage deforms the number of movable members to an out of plane open position that uncovers the port and decreases the acoustic resistance. In some aspects, each movable member of the number of movable members comprises an anisotropic stress that deforms the movable member out of plane to an open position in the absence of any voltage, and the application of the voltage deforms the movable member to an in plane closed position. In some aspects, a contrast ratio of the acoustic resistance between the number of movable members in the deformed configuration in which the port is open and a non-deformed configuration in which the port is closed is 1000 times or more. In some aspects, the enclosure comprises an earpiece enclosure that encloses a transducer coupled to the interior chamber.

In still further aspects, the disclosure is directed to a micro-electromechanical systems (MEMS) package comprising: a MEMS package comprising a substate and a lid coupled to the substrate; a piezoelectric valve coupled to the substrate and comprising a number of movable members operable to be deformed in opposite directions upon application of a voltage to modify an acoustic resistance of an acoustic port; and a first stopper defined by the substrate and a second stopper defined by the lid, the first stopper and the second stopper being aligned with the number of movable members and operable to prevent an undesirable deflection of the number of movable members. The MEMS package may further be combined with an earpiece enclosure that encloses the MEMS package and a transducer coupled to an interior chamber and the acoustic port defined by the earpiece enclosure.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect in this disclosure are not necessarily to the same aspect, and they mean at least one.

DETAILED DESCRIPTION

In this section we shall explain several preferred aspects of this disclosure with reference to the appended drawings. Whenever the shapes, relative positions and other aspects of the parts described are not clearly defined, the scope of the disclosure is not limited only to the parts shown, which are meant merely for the purpose of illustration. Also, while numerous details are set forth, it is understood that some aspects of the disclosure may be practiced without these details. In other instances, well-known structures and techniques have not been shown in detail so as not to obscure the understanding of this description.

The terminology used herein is for the purpose of describing particular aspects only and is not intended to be limiting of the disclosure. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
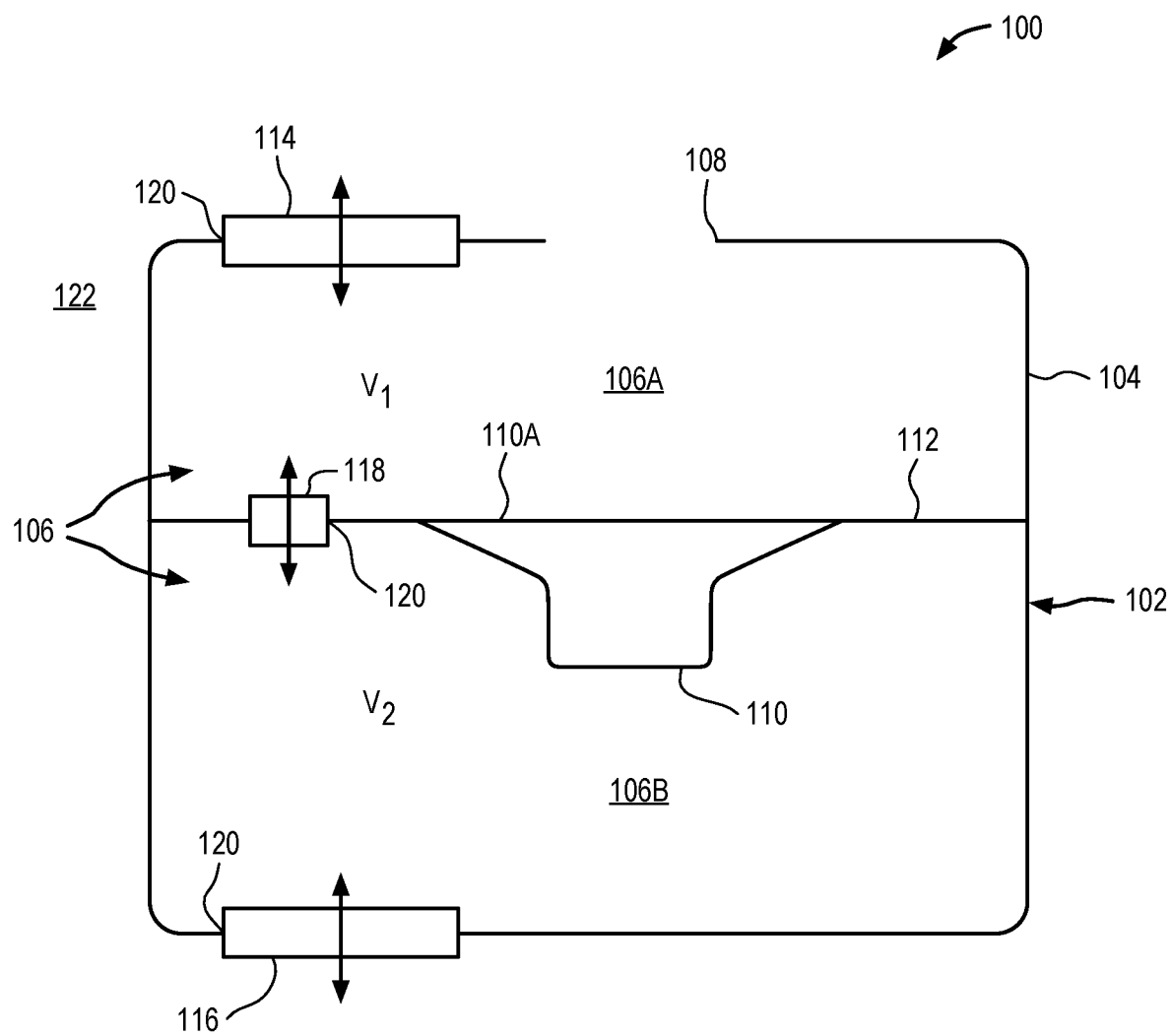
FIG. 1 illustrates a cross-sectional side view of one aspect of a portable electronic device and/or transducer assembly having a valve.

FIG. 1 illustrates a cross-sectional side view of one aspect of a valve assembly for a transducer positioned within a portable electronic device. The electronic device 100 may include a housing, casing or outer enclosure 102 that defines or closes off a chamber in which the constituent electronic components of electronic device 100 are contained. In some aspects, it is contemplated that device 100 may be a portable or mobile communications device, an in-ear device, portable time piece or any other device within which a transducer may be implemented. Enclosure 102 may include an enclosure wall 104 that separates a surrounding environment from an encased space or interior chamber 106 formed within enclosure 102. In some cases, the enclosure wall 104 completely isolates or seals the entire, or a portion of, interior chamber 106 from the surrounding environment. For example, the enclosure wall 104 may form a water-proof or acoustically isolated portion of interior chamber 106 which is impermeable to water and/or air. The interior chamber 106 may be of a sufficient volume and/or size to accommodate the constituent components of electronic device 100. The enclosure wall 104 may also include one or more of an acoustic port 108. The acoustic port 108 may be, for example, a sound output port through which sound from a speaker positioned within interior chamber 106 may be output. In other aspects, where a microphone is positioned near enclosure acoustic port 108, it could be a sound input port to allow for input of sound to the microphone.

Representatively, in one aspect shown in FIG. 1, enclosure acoustic port 108 is an acoustic port that is acoustically open to a transducer 110 positioned within interior chamber 106. In some aspects, transducer 110 may be any type of electroacoustic transducer capable of converting an electrical audio signal into a sound or a sound into an electrical audio signal. Representatively, transducer 110 may be a speaker or a micro-speaker, for example, a miniaturized version of a loudspeaker that uses a moving coil motor to drive sound output. Thus, in some aspects, transducer 110 may be referred to herein as a micro-speaker. In other aspects, where transducer 110 converts sound into an electrical audio signal, it may further be referred to herein as a microphone. In some aspects, transducer 110 may be coupled to an interior wall 112 and be considered to divide interior chamber 106 into a front volume chamber 106A and a back volume chamber 106B around transducer 110. In the case where transducer 110 is a speaker, front volume chamber 106A may form a chamber having a first volume (V1) around the sound output face or surface 110A of transducer 110. The front volume chamber 106A (and first volume V1) may be considered acoustically coupled to, or otherwise open to, acoustic port 108. In this aspect, sound pressure waves output from surface 110A of transducer 110 may pass through front volume chamber 106A and out to the surrounding ambient environment 122 through acoustic port 108. Back volume chamber 106B may have a second volume (V2) and surround the back side of transducer 110 (e.g., the side of transducer 110 opposite surface 110A).

It is recognized that, for example, a size, volume, pressure or other aspects of front volume chamber 106A or back volume chamber 106B may impact the acoustic performance of transducer 110. Thus, modifying the size, volume and/or pressure of front volume chamber 106A and/or back volume chamber 106B may be used to tune the acoustic performance of transducer 110. For example, in some cases, it may be desirable for front volume chamber 106A and/or back volume chamber 106B to be isolated or sealed (e.g., high impedance or resistance) from the ambient environment 122 to achieve the desired acoustic performance. In other cases, it may be desirable for front volume chamber 106A and/or back volume chamber 106B to have a very open path (e.g., low impedance or resistance) and have some amount of leak to the surrounding ambient environment 122. In still further aspects, it may be desirable for front volume chamber 106A to have a leak, or otherwise be open to, back volume chamber 106B.

With this in mind, valve assemblies or valve(s) 114, 116 and/or 118 may further be provided to vent an associated chamber. Valve 114, 116, and/or 118 may open and/or close a vent or opening 120 from front volume chamber 106A and/or back volume chamber 106B to the ambient environment 122, or a vent or opening 120 between front and back volume chambers 106A-B. Representatively, valve 114 may open and/or close opening 120 formed through wall 104 between front volume chamber 106A and ambient environment 122. In other words, when valve 114 is open, front volume chamber 106A can leak or vent to ambient environment 122 and when valve 114 is closed, the leak or venting is prevented. A leak or venting may be desired from front volume chamber 106A where, for example, device 100 is an in-ear earpiece sealed within the user's ear but a more open feel is desired. Valve 116 may open and/or close opening 120 through wall 104 between back volume chamber 106B and ambient environment 122. In other words, when valve 116 is open, back volume chamber 106B can leak or vent to ambient environment 122, and when valve 116 is closed, the leak or venting is prevented. Valve 118 may open and/or close opening 120 through wall 112 between front volume chamber 106A and back volume chamber 106B. In this aspect, when valve 118 is open, front volume chamber 106A can leak or vent to back volume chamber 106B, and when valve 118 is closed, the leak or vent is prevented. In still further aspects, it is contemplated that one or more of valves 114, 116, 118 could be used to open and/or close an opening (e.g., opening 120) which is to another type of acoustic chamber, for example, an opening to an acoustic resonator or attenuator coupled to one or more of the previously discussed chambers or ports of the transducer. In general, regardless of the chambers and/or volumes connected/isolated using valves 114, 116, 118, it may be understood that when one or more of valves 114, 116, 118 are closed, the acoustic resistance is considered high, it is hard for air (or fluid) to go through the valve, and pressure levels in the chambers/volumes connected by the valves 114, 116, 118 may be different. On the other hand, when one or more of valves 114, 116, 118 are open, the acoustic resistance is considered low, air (or fluid) can easily pass through the valves 114, 116, 118, and the pressure levels in the chambers/volumes connected by the valves 114, 116, 118 may be the same. In some aspects, it is further contemplated that a contrast ratio of acoustic resistance between fully open (on) or fully closed (off) needs to be large, e.g., 1000 times or above. In addition, the opening area through valves 114, 116, 118 may be tuned by applying various voltages operable to open/close the valves more/less.

In one aspect, one or more of valves 114, 116, 118 may be electromechanical valves that open and/or close in response to the application of a voltage. For example, valves 114, 116, 118 may be piezoelectric valves that can be dynamically actuated upon application of a voltage to control the amount of leak. In some aspects, one or more of valves 114, 116, 118 may be micro-electromechanical systems (MEMS) actuators or valves. In still further aspects, it is contemplated that the area of the actuators, valves and/or device within which they are implemented may be as small as possible, e.g., 2 mm×2 mm. Valves 114, 116, 118 may be the same, or may be different. In some aspects, one or more of valves may offer the advantages of bistability, low power consumption switching from on/off states, digitization for controlling a percentage or amount of open area for venting, and/or silent operation. A number of representative configurations for valves 114, 116, 118 will now be described in reference to FIGS. 2-50.

Figure 2:
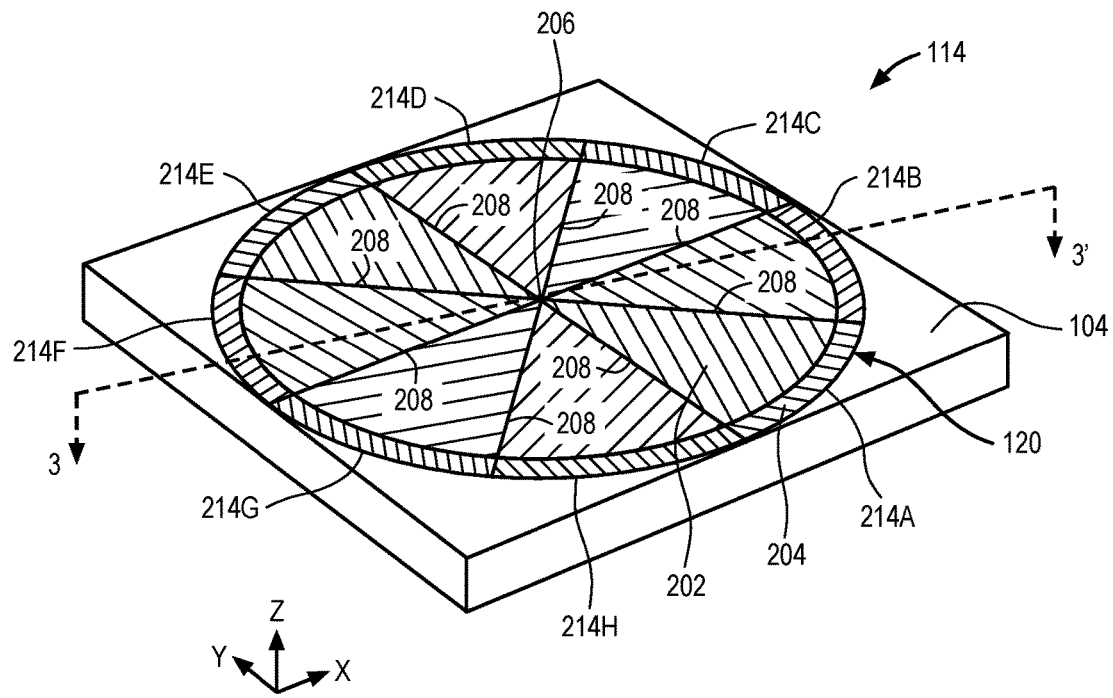
FIG. 2 illustrates a perspective view of one aspect of a valve of the portable electronic device and/or transducer assembly of FIG. 1 in a closed position.

Representatively, FIG. 2 illustrates a magnified top perspective view of a representative valve from FIG. 1. In this aspect, FIG. 2 shows valve 114 used to open/close opening 120 formed in enclosure wall 104 in a closed or non-actuated position. It should be understood, however, that although valve 114 is specifically discussed, one or more of valves 116 and/or 118 may be the same as valve 114 such that the description provided herein also applies to any other valves connecting different chambers and/or volumes as disclosed in FIG. 1. From this view, it can be seen that valve 114 includes a number of movable portions or members 214A, 214B, 214C, 214D, 214E, 214F, 214G, 214H that are positioned over opening 120 to open/close opening 120 as desired. It can further be understood that in the closed position shown in FIG. 2, movable portions or members 214A, 214B, 214C, 214D, 214E, 214F, 214G, 214H are considered substantially flat (e.g., not deformed) and in plane (e.g., the x-y plane) such that they cover opening 120. In some aspects, members 214A-H may be flaps or cantilevers that are connected to the enclosure wall 104 (or fixed portion 104) at one end and meet at center 206 of opening 120 at the other end. Each of members 214A-H may have a tapered or triangular shape and be separated from one another by slits 208. Members 214A-H and/or slits 208 may be considered radially arranged or orientated in that they are arranged like rays and converge at the center 206 of opening 120. It should be understood, however, that while a circular shaped opening 120 and/or tapered members 214A-H are shown, other shapes and sizes of openings 120 and/or members 214A-H are contemplated (e.g., triangular, rectangular, circular, etc.). The size and shape of opening 120 and members 214A-H should be complimentary such that the members 214A-H are of a sufficient size and/or shape to cover the opening 120 in the closed configuration and uncover the opening 120 in the open configuration. It further may be understood that in some aspects, each of members 214A-H may be individually controlled by application of a voltage such that some may be open (e.g., not covering opening 120) while others may be closed (e.g., covering opening 120) depending on the desired level of venting. The opening and/or closing of members 214A-H may be driven in parallel or separately controlled by the application of a voltage to give a variable impedance and/or resistance control. For example, in some aspects, the application of an electric voltage may be used to open one or more of members 214A-H and termination of the voltage results in members 214A-H returning to the closed, or resting, state.

Representatively, in some aspects, each of movable members 214A-H may include an inactive material layer 202 and an active material layer 204 that deforms upon application of a voltage. For example, in some aspects, the inactive material layer 202 may be a single-crystal silicon or oxide MEMS material that is formed into a shape of the movable members 214A-H using a MEMS processing operation. The active material layer 204 may be a piezoelectric material that is formed or applied to a portion of the inactive material layer 202 using a MEMS processing operation. In some aspects, active material layer 204 may be formed or applied to less than an entire area of the inactive material layer 202 in a pattern found optimal for deformation of the inactive material layer 202. For example, in some aspects, active material layer 204 is formed or applied around only a perimeter or area of inactive material layer 202 near the enclosure wall (or fixed portion) 104 as shown in FIG. 2. In this aspect, when a voltage is applied to the active material layer 204 of one or more of movable members 214A-H, the active material layer 204 deforms and causes a further deformation of the inactive material layer 202 extending to the center 206 of opening 120 to open the valve. In some aspects, a small opening, slit or vent 210 may remain at center 206 between the ends of movable members 214A and 214F even when they are in the closed position as shown to allow for separation of the members when actuated to the open position.

Figure 3:
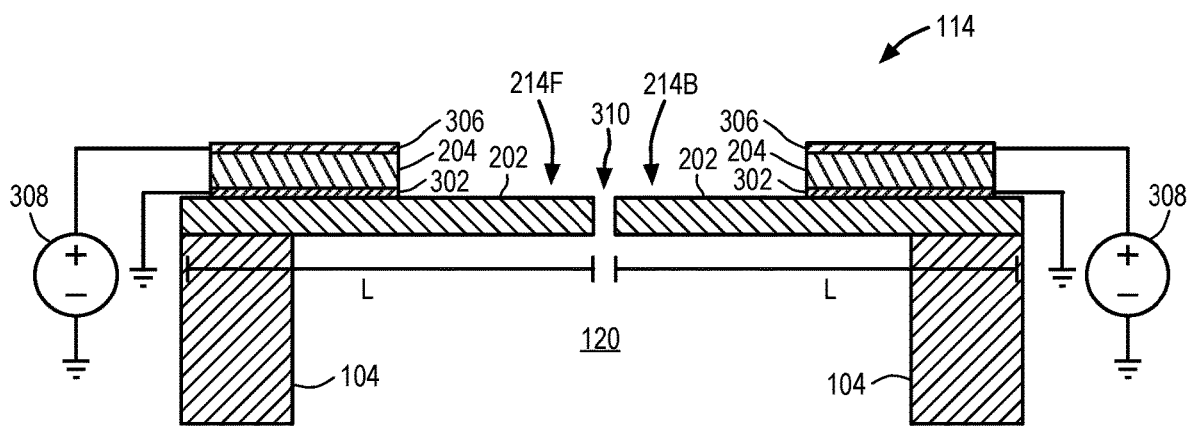
FIG. 3 illustrates a cross-sectional side view of one aspect of a valve of a portable electronic device and/or transducer assembly of FIG. 2.

One representative stack-up of the layers forming movable members 214A-H will now be described in more detail in reference to FIG. 3. FIG. 3 illustrates a cross-sectional side view along line 3-3' of FIG. 2. From this view, it can be seen that the enclosure (or fixed portion) 104 defines opening 120. In some aspects, the enclosure (or fixed portion) 104 may be a substrate material formed to have opening 120 using MEMS processing techniques. For example, enclosure or fixed portion 104 may be formed using a MEMS processing technique from a material including, but not limited to, silicon, glass, quartz, sapphire or the like. Movable members 214B and 214F may be substantially in plane (or flat) in this closed position and include a stack-up of the inactive material layer 202, bottom conductive or electrode layer 302, active layer 204 and top conductive or electrode layer 306. In addition, although not shown, in some aspects, an optional seed layer for achieving good piezoelectric crystalline structure during the deposition process may be formed between inactive material layer 202 and bottom electrode layer 306. Inactive material layer 202 may be formed at one end on portion 104 and extend toward the center 206 of opening 120 as shown. The inactive material layer 202 may be considered as defining, occupying, or otherwise extending, the entire length dimension (L) of the movable members 214B and 214F. In some aspects, inactive material layer 202 may be a layer with some elasticity that is relatively thin, for example, from about 0.5 micrometers to about 10 micrometers. For example, the inactive material layer 202 may be formed using MEMS processing techniques from a material including, but not limited to, silicon, silicon oxide, silicon nitride, aluminum nitride (AlN), scandium aluminum nitride (ScAlN), zinc oxide (ZnO), lead zirconate titanate (PZT), and/or alternate transition metal "dopants" for improving the piezo efficiency of AlN, and/or other materials that can be used as, or to support, a piezoelectric layer to balance the residual stress, etc.

The bottom conductive or electrode layer 302 may be formed on the inactive layer 202 according to any MEMS processing technique. In some aspects, conductive or electrode layer 306 may be made of any material suitable for forming an electrode, for example a metal material including, but not limited to, molybdenum (Mo), platinum (Pt), aluminum (Al), gold (Au), or the like, or another conductive material including, but not limited to, indium tin oxide (ITO), carbon film or a conductive epoxy.

The active material layer 204 may be formed, applied or otherwise stacked on top of conductive or electrode layer 302 (e.g., directly) and inactive material layer 202 (e.g., indirectly), using a MEMS processing technique. Active material layer 204 may cover or otherwise occupy less than an entire length dimension (L) of movable members 214B and 214F as shown. For example, as previously discussed, active material layer 204 may be applied in a pattern, shape or arrangement that optimizes a displacement of inactive material layer 202, and in turn movable members 214A-H. In one aspect, the optimized pattern for active material layer 204 may be around only a perimeter area of movable members 214B and 214F. For example, active material layer 204 may be formed on a portion of the inactive material layer 202 near the fixed portion or enclosure wall 104 and extend radially inward to center 206 over less than half the length (L), or less than one quarter the length (L), of the inactive material layer 202. In some aspects, active material layer 204 may be a relatively thin (e.g., 0.5-5 micrometers) piezoelectric layer or plate. In this aspect, active material layer 204 may be made of a material including, but not limited to, aluminum nitride (AlN), scandium aluminum nitride (ScAlN), zinc oxide (ZnO), potassium sodium niobate (KNN), polyvinylidene fluoride (PVDF), lead zirconate titanate (PZT), any type of doped PZT (e.g., PMN-PT, PMN-PZT, PZN-PT, Sm-doped PZT) or the like. In addition, it should be understood that the piezoelectric materials should not be limited to sputtered or physical vapor deposition (PVD) films, but could also be deposited by other methods to enhance piezoelectric crystal quality (including but not limited to pulsed laser deposition (PLD), chemical vapor deposition (CVD), metal organic chemical vapor deposition (MOCVD), atomic layer deposition (ALD)).

The top conductive or electrode layer 306 may be formed on the active material layer 204 according to any MEMS processing technique. In some aspects, conductive or electrode layer 306 may be made of any material suitable for forming an electrode, for example a metal material including, but not limited to, molybdenum (Mo), platinum (Pt), aluminum (Al), gold (Au), or another conductive material including, but not limited to, indium tin oxide (ITO), carbon film or a conductive epoxy.

To actuate movable members 214B and 214F, an input driving voltage 308 may be applied to the bottom or top conductive or electrode layers 302, 306. Representatively, in one aspect, a voltage (e.g., +10V or −10V) may be applied to the top electrode layer 306 of members 214B and 214F, and the bottom electrode layer 302 of members 214B and 214F may be ground (e.g., 0V). Alternatively, in other aspects, a voltage (e.g., +10V or −10V) may be applied to the bottom electrode layer 306, and the top electrode layer 302 may be ground (e.g., 0V). The application of the voltage to members 214B and 214F causes active layer 204 to deform to an out of plane configuration or position (e.g., an open position). This deformation of active layer 204, in turn, causes the inactive layer 202 attached to the active layer 204 to also deform (e.g., curve or bend) to an out of plane configuration (e.g., above or below the resting plane of members 214A-H) depending on the voltage applied. It should also be understood that although only members 214B and 214F are described, the voltage application as previously discussed may also apply, and be used to deform, any of the movable members disclosed herein (e.g., any of members 214A-H).

Figure 4:
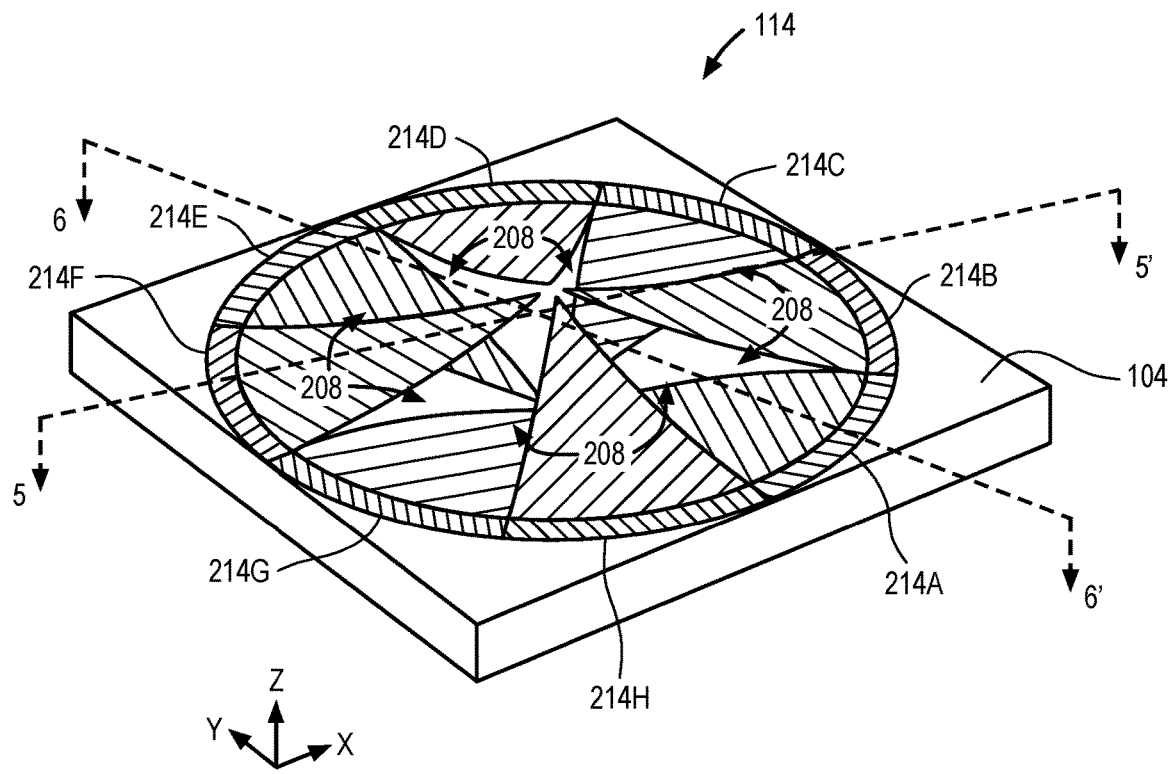
FIG. 4 illustrates a perspective view of one aspect of a valve of the portable electronic device and/or transducer assembly of FIG. 2 in an open position.

Representatively, referring now to FIG. 4-FIG. 6B, it can be seen that the applied voltage causes adjacent movable members 214A-H to move or deform out of plane (e.g., an x-y plane) in opposite directions to an open position. Representatively, as shown in FIG. 4, movable members 214A, 214C, 214E, 214G move or deform in a downward direction (below the resting plane of members 214A-H) and the adjacent movable members 214B, 214D, 214F and 214H move or deform in an upward direction (above the resting plane of members 214A-H). It should be understood that in this context, the term "adjacent" is intended to refer to movable members 214A-H sharing a same radially oriented slit 208. In other words, "adjacent" movable members 214A-H are those members which are circumferentially side by side, or otherwise considered next to one another in the circumferential direction, as opposed to diametrically opposed members. For example, movable member 214B would be considered adjacent to, and sharing the same slits 208 as, movable members 214A, 214C. Movable member 214B will therefore move in an opposite direction to movable members 214A and 214C. Movable member 214B would not, however, be considered adjacent to, for example, movable member 2154F. Rather movable member 214B is considered diametrically opposed to member 214F and would not be considered to share a same radially oriented slit 208. Thus, movable member 214B and/or movable member 21F are not considered adjacent members moving in opposite directions. In this aspect, as can be seen from FIG. 4, upon application of a voltage, half (or four) of the movable members (e.g., movable members 214A, 214C, 214E and 214G) may move in one direction (e.g., a downward direction) and the other half or remaining four of the movable members (e.g., movable members 214B, 214D, 214F and 214H) move in an opposite direction (e.g., an upward direction). The direction of movement of movable members 214A-H can be controlled by the driving voltages. For example, the application of opposite voltages will drive the adjacent members 214A-H in opposite directions. In this aspect, the opening area between two adjacent movable members 214A-H can be maximized.

Figure 5:
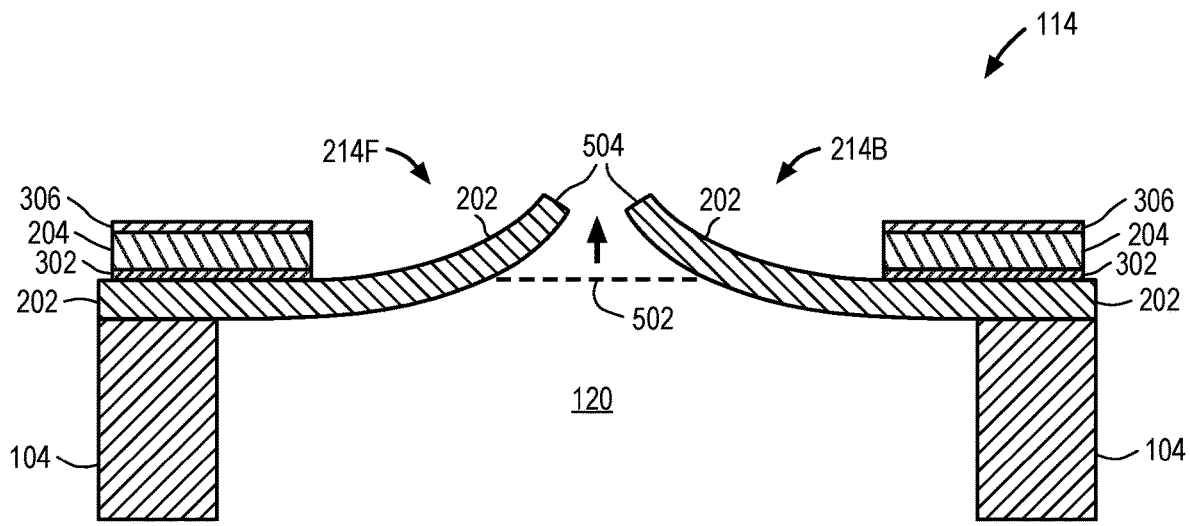
FIG. 5 illustrates a cross-sectional side view along line 5-5' of one aspect of a valve of a portable electronic device and/or transducer assembly of FIG. 4.
Figure 6A:
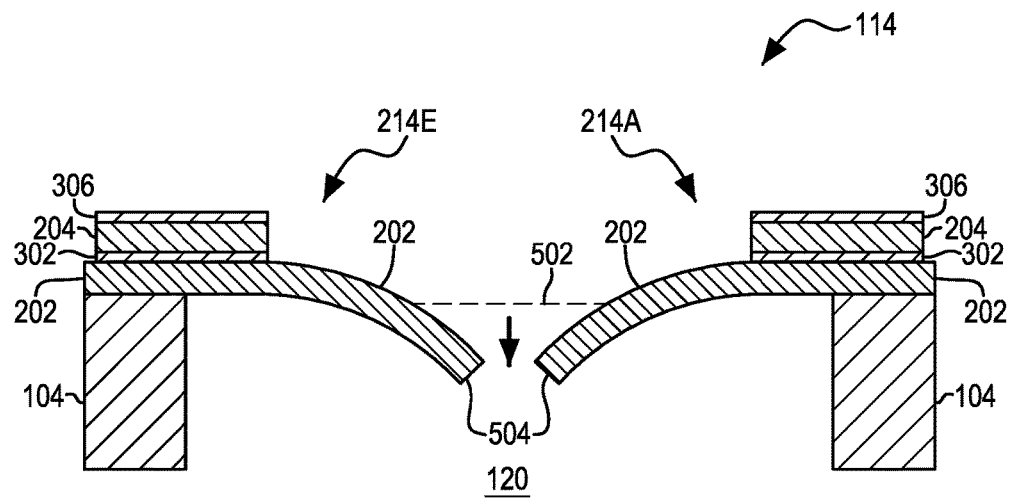
FIG. 6A illustrates a cross-sectional side view along line 6-6' of one aspect of a valve of a portable electronic device and/or transducer assembly of FIG. 4.

For example, FIG. 5 and FIG. 6A illustrate adjacent movable members moving in opposite directions upon application of a voltage. FIG. 5 and FIG. 6A are cross-sections along dashed lines 5-5' and dashed lines 6-6' of FIG. 4, respectively. Representatively, FIG. 5 is a cross-section through movable members 214B and 214F and FIG. 6A is a cross section through the adjacent movable members 214A and 214E. In particular, movable member 214B is considered adjacent to movable member 214A, and movable member 214F is considered adjacent to movable member 214E. As can be seen from FIG. 5, upon application of a voltage, movable members 214B and 214F move out of plane 502 in an upward direction, as illustrated by the arrow. On the other hand, as can be seen from FIG. 6A, the movable member 214A which is adjacent to movable member 214B, and movable member 214E which is adjacent to movable member 214F, move out of plane 502 in a downward direction, as illustrated by the arrow.

In addition, as can be seen from FIG. 5 and FIG. 6A, the movement or deformation of the movable members 214A-B and 214E-F occurs mainly at the free end defined by the inactive material layer 202. Representatively, as can be seen from FIG. 5, when the voltage is applied to the active material layer 204 of movable members 214B, 214F, the deformation of the active material layer 204 causes the free end, or end 504 distal to active material layer 204, to bend or curve out of plane in an upward direction. The portions of the movable members 214B, 214F near the fixed portion 104, however, remain relatively in plane 502. On the other hand, as can be seen from FIG. 6A, when the voltage is applied to the active material layer 204 of movable members 214A, 214E, the deformation of the active material layer 204 causes the free end, or end 504 distal to active material layer 204, to bend or curve out of plane in a downward direction. The portions of the movable members 214B and 214F near the fixed portion 104, however, remain relatively in plane 502. Thus, the members 214A-B and 214E-F are considered to have some kind of curve, bend, angle or the like when they move or deform such that they are no longer flat or straight (e.g., planar) as shown in the resting or inactive configuration of FIG. 3. The members 214A-B and 214E-F may remain in the out of plane open position as long as the voltage is applied. Once the voltage is terminated, the members 214A-B and 214E-F may deform back to the in plane closed position as shown in FIGS. 2-3.

Figure 6B:
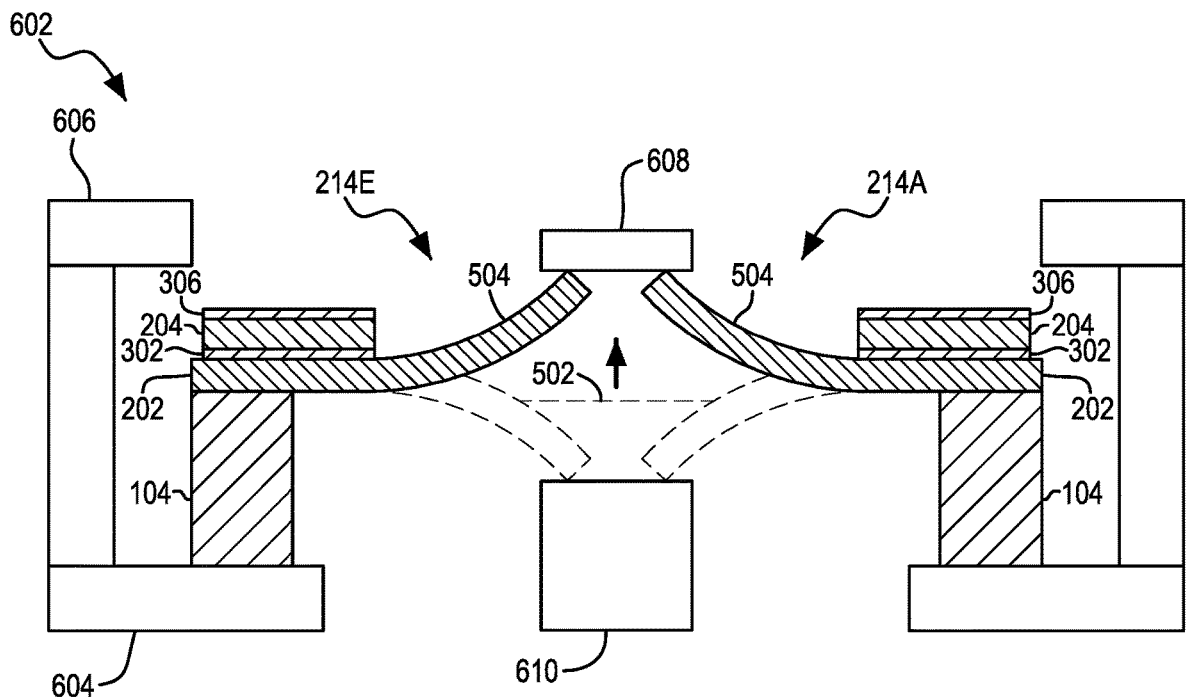
FIG. 6B illustrates a cross-sectional side view along line 6-6' of one aspect of a valve of a portable electronic device and/or transducer assembly of FIG. 4 implemented within a MEMS package assembly.

FIG. 6B illustrates a cross-sectional side view along line 6-6' of one aspect of a valve of a portable electronic device and/or transducer assembly of FIG. 4 implemented within a MEMS package assembly. Representatively, FIG. 6B illustrates the valve configuration of FIG. 6A integrated within a MEMS package assembly 602. In addition, stoppers 608 and 610 are formed by the MEMS package assembly to prevent an over deflection of movable members 214A, 214E during an unintended event, for example, a drop event. Representatively, the MEMS package assembly 602 may include a substrate 604 and a lid 606 coupled to the substrate 604. The valve 114 may be formed, or otherwise coupled to, the substrate 604. The lid 606 may be an enclosure or housing coupled to the substrate 604 and that extends over valve 114 to enclose valve 114. The lower stopper 610 may be formed by substrate 604 and may be a substantially rigid structure. The lower stopper 610 may be positioned below the ends 504 of movable members 214A, 214E and have a height suitable for preventing an over deflection of movable members 214A, 214E. Representatively, as illustrated by the dashed lines representing a downward deflection of members 214A, 214E, when members 214A, 214E move downward too far, they contact stopper 610 preventing members 214A, 214E from deflecting any further. The upper stopper 608 may be formed by lid 606 and may be a substantially rigid structure. The upper stopper 608 may be positioned above the ends 504 of movable members 214A, 214E and prevent an over deflection of movable members 214A, 214E. Representatively, when members 214A, 214E, when members 214A, 214E move upward too far, they contact stopper 608 preventing members 214A, 214E from deflecting any further. Stoppers 608, 610 on the packaging as disclosed herein may help to increase the MEMS structure robustness. The packaging 602 including stoppers 608, 610 may be formed of any suitable MEMS material and using any suitable MEMS process technique. In addition, it should be understood that while MEMS packaging 602 including stoppers 608, 610 is shown preventing over deflection of valve 114 of FIGS. 2-6A integrated therein, any of the valve assemblies disclosed herein may be integrated into the MEMS packaging 602 and/or otherwise incorporate stoppers 608, 610 to prevent over deflection.

Figure 7:
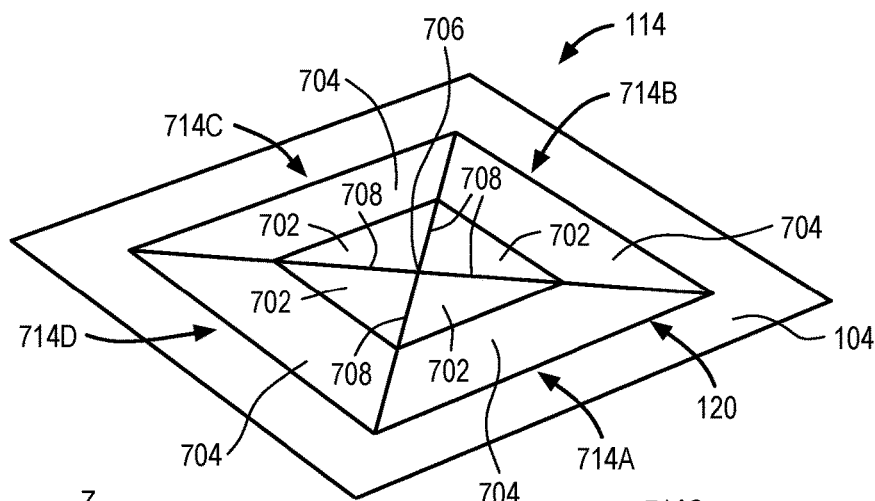
FIG. 7 illustrates a perspective view of one aspect of a valve of the portable electronic device and/or transducer assembly of FIG. 1 in a closed position.
Figure 8:
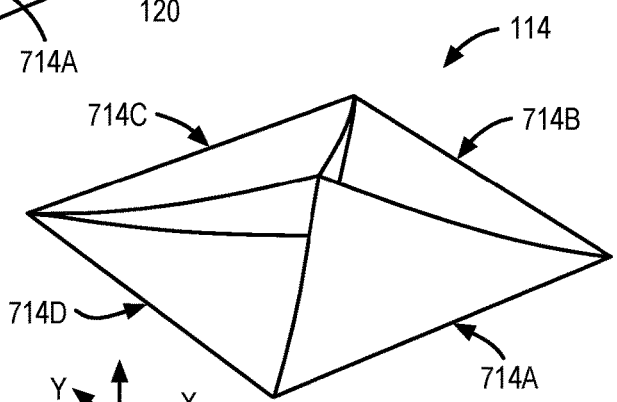
FIG. 8 illustrates a perspective view of one aspect of a valve of the portable electronic device and/or transducer assembly of FIG. 7 in an open position.

FIG. 7 and FIG. 8 illustrate magnified top perspective views of another representative valve from FIG. 1 having movable members in a non-actuated or resting (e.g., closed) position and an actuated (e.g., open) position, respectively. Representatively, FIG. 7 illustrates a valve 114 in a resting configuration and FIG. 8 illustrates valve 114 in an actuated configuration. From this view, it can be seen that valve 114 includes a number of movable portions or members 714A, 714B, 714C, 714D that are positioned over opening 120 to open/close opening 120 as desired. In some aspects, members 714A-D may be flaps or cantilevers that are connected to the enclosure wall 104 (or fixed portion 104) at one end and meet at center 706 of opening 120 at the other end. Each of members 714A-D may have a tapered or triangular shape and be separated from one another by slits 708. Members 714A-D and slits 708 may be considered radially arranged or orientated in that they are arranged like rays and converge at the center 706 of opening 120. It should be understood, however, that while a square shaped opening 120 and/or tapered members 714A-D are shown, other shapes and sizes of openings 120 and/or members 714A-D are contemplated (e.g., triangular, rectangular, circular, etc.). The size and shape of opening 120 and members 714A-D should be complimentary such that the members 714A-D are of a sufficient size and/or shape to cover the opening 120 in the closed configuration and uncover the opening 120 in the open configuration. It further may be understood that in some aspects, each of members 714A-D may be individually controlled by application of a voltage such that some may be open (e.g., not covering opening 120) while others may be closed (e.g., covering opening 120) depending on the desired level of venting. The opening and/or closing of members 714A-D may be driven in parallel or separately controlled by the application of a voltage to give a variable impedance and/or resistance control. For example, in some aspects, the application of an electric voltage may be used to open one or more of members 714A-D and termination of the voltage results in members 714A-D returning to the closed, or resting, state.

Representatively, in some aspects, each of movable members 714A-D may include an inactive material layer 702 and an active material layer 704 that deforms upon application of a voltage. For example, in some aspects, the inactive material layer 702 may be a single-crystal silicon or oxide MEMS material that is formed into a shape of the movable members 714A-H using a MEMS processing operation. The active material layer 704 may be a piezoelectric material this is formed or applied to a portion of the inactive material layer 702 using a MEMS processing operation. In some aspects, active material layer 704 may be formed or applied to less than an entire area of the inactive material layer 702 in a pattern found optimal for deformation of the inactive material layer 702. For example, in some aspects, active material layer 704 is formed or applied around only a perimeter or area of inactive material layer 702 near the enclosure wall (or fixed portion) 104 as shown in FIG. 7. In this aspect, when a voltage is applied to the active material layer 704 of one or more of movable members 714A-D, the active material layer 704 deforms and causes a further deformation of the inactive material layer 702 extending to the center 706 of opening 120 to open the valve. In some aspects, a small opening, slit or vent may remain at center 706 between the ends of movable members 714A and 714F even when they are in the closed position as shown to allow for separation of the members when actuated to the open position. The movable members 714A-D including the inactive material layers 702 and active material layers 704 may be formed of a stack up one or more of the same materials as discussed in reference to the previously Figures. For example, each of movable members 714A-D may include a stack up of the inactive material layer 702, a bottom conductive or electrode layer, the active material layer 704 and a top conductive or electrode layer as previously discussed.

Similar to the previously discussed configurations, to actuate movable members 714A-D, an input driving voltage may be applied to the bottom or top conductive or electrode layers above and below the active material layer 704. Representatively, in one aspect, a voltage (e.g., +10V or −10V) may be applied to one of the conductive or electrode layers above or below active material layer 704, and the other conductive or electrode layer may be ground (e.g., 0V). The application of the voltage causes active layer 704 to deform to an out of plane configuration or position. This deformation of active layer 704, in turn, causes the inactive layer 702 attached to the active layer 704 to also deform (e.g., curve or bend) to an out of plane configuration (e.g., above or below the resting plane of members 714A-D) depending on the voltage applied. Representatively, the applied voltage may cause adjacent movable members 714A-D to move or deform out of plane (e.g., an x-y plane) in opposite directions. For example, as can be seen from FIG. 8, in one aspect movable members 714A and 714C may move or deform in an upward direction (above the resting plane of members 714A-D) and their adjacent movable members 714B and 714D (e.g., members sharing a same slit 708) move or deform in a downward direction (below the resting plane of members 714A-D). The direction of movement of movable members 714A-D can be controlled by the driving voltages. For example, the application of opposite voltages will drive the adjacent members 714A-D in opposite directions. In this aspect, the opening area between two adjacent movable members 714A-D can be maximized.

Figure 9:
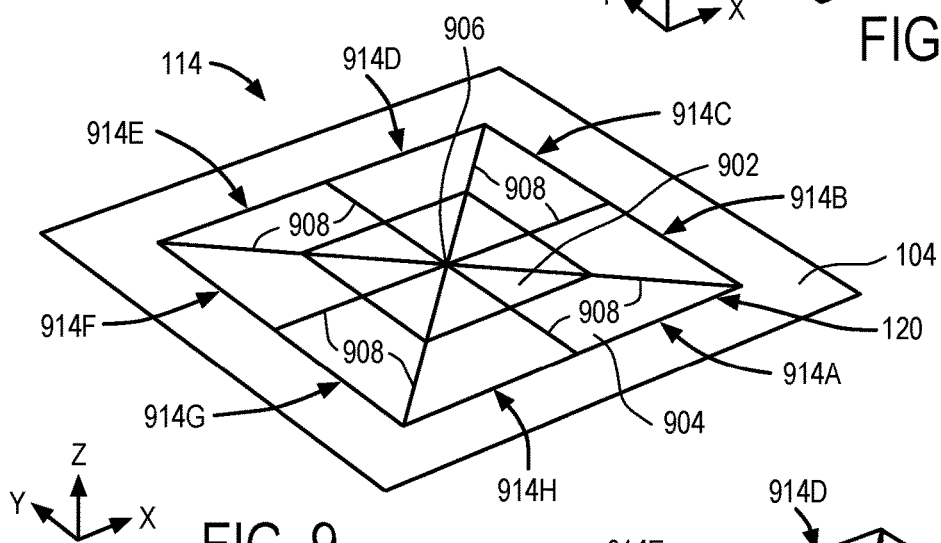
FIG. 9 illustrates a perspective view of one aspect of a valve of the portable electronic device and/or transducer assembly of FIG. 1 in a closed position.
Figure 10:
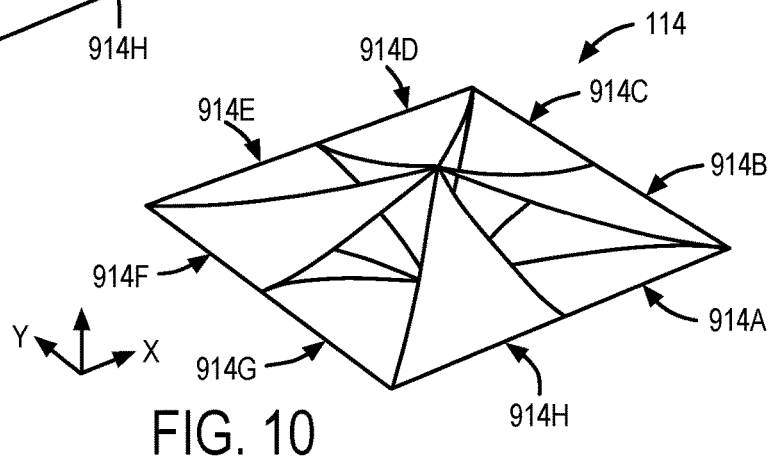
FIG. 10 illustrates a perspective view of one aspect of a valve of the portable electronic device and/or transducer assembly of FIG. 9 in an open position.

FIG. 9 and FIG. 10 illustrate magnified top perspective views of another representative valve from FIG. 1 having movable members in non-actuated or resting (e.g., closed) position and an actuated (e.g., open) position, respectively. Representatively, FIG. 9 illustrates a valve 114 in a resting configuration and FIG. 10 illustrates valve 114 in an actuated configuration. From this view, it can be seen that valve 114 includes a number of movable portions or members 914A, 914B, 914C, 914D, 914E, 914F, 914G, 914H that are positioned over opening 120 to open/close opening 120 as desired. In some aspects, members 914A-H may be flaps or cantilevers that are connected to the enclosure wall 104 (or fixed portion 104) at one end and meet at center 906 of opening 120 at the other end. Each of members 914A-H may have a tapered or triangular shape and be separated from one another by slits 908.

Similar to the previously discussed configurations, each of movable members 914A-H may include an inactive material layer 902 and an active material layer 904 that deforms upon application of a voltage. For example, in some aspects, the inactive material layer 902 may be a MEMS material that is formed into a shape of the movable members 914A-H using a MEMS processing operation. The active material layer 904 may be a piezoelectric material that is formed or applied to a portion of the inactive material layer 902 using a MEMS processing operation. In some aspects, active material layer 904 may be formed or applied to less than an entire area of the inactive material layer 902 in a pattern found optimal for deformation of the inactive material layer 902. For example, in some aspects, active material layer 904 is formed or applied around only a perimeter or area of inactive material layer 902 near the enclosure wall (or fixed portion) 104 as shown in FIG. 9. In this aspect, when a voltage is applied to the active material layer 904 of one or more of movable members 914A-H, the active material layer 904 deforms and causes a further deformation of the inactive material layer 902 extending to the center 906 of opening 120 to open the valve. In some aspects, a small opening, slit or vent may remain at center 906 between the ends of movable members 914A-H even when they are in the closed position as shown to allow for separation of the members when actuated to the open position. The movable members 914A-H including the inactive material layers 902 and active material layers 904 may be formed of a stack up one or more of the same materials as discussed in reference to the previously Figures. For example, each of movable members 914A-H may include a stack up of the inactive material layer 902, a bottom conductive or electrode layer, the active material layer 904 and a top conductive or electrode layer as previously discussed.

To actuate movable members 914A-H, an input driving voltage may be applied to the bottom or top conductive or electrode layers above and below the active material layer 904. Representatively, in one aspect, a voltage (e.g., +10V or −10V) may be applied to one of the conductive or electrode layers above or below active material layer 904, and the other conductive or electrode layer may be ground (e.g., 0V). The application of the voltage causes active layer 904 to deform to an out of plane configuration or position. This deformation of active layer 904, in turn, causes the inactive layer 902 attached to the active layer 904 to also deform (e.g., curve or bend) to an out of plane configuration (e.g., above or below the resting plane of members 914A-H) depending on the voltage applied. Representatively, the applied voltage may cause adjacent movable members 914A-H to move or deform out of plane (e.g., an x-y plane) in opposite directions. For example, as can be seen from FIG. 10, in one aspect movable members 914A, 914C, 914E, 914G may move or deform in a downward direction (below the resting plane of members 914A-H) and their adjacent movable members 914B, 914D, 914F, 914H (e.g., members sharing a same slit 908) move or deform in an upward direction (above the resting plane of members 914A-H). The direction of movement of movable members 914A-H can be controlled by the driving voltages. For example, the application of opposite voltages will drive the adjacent members 914A-H in opposite directions. In this aspect, the opening area between two adjacent movable members 914A-H can be maximized.

Figure 11:
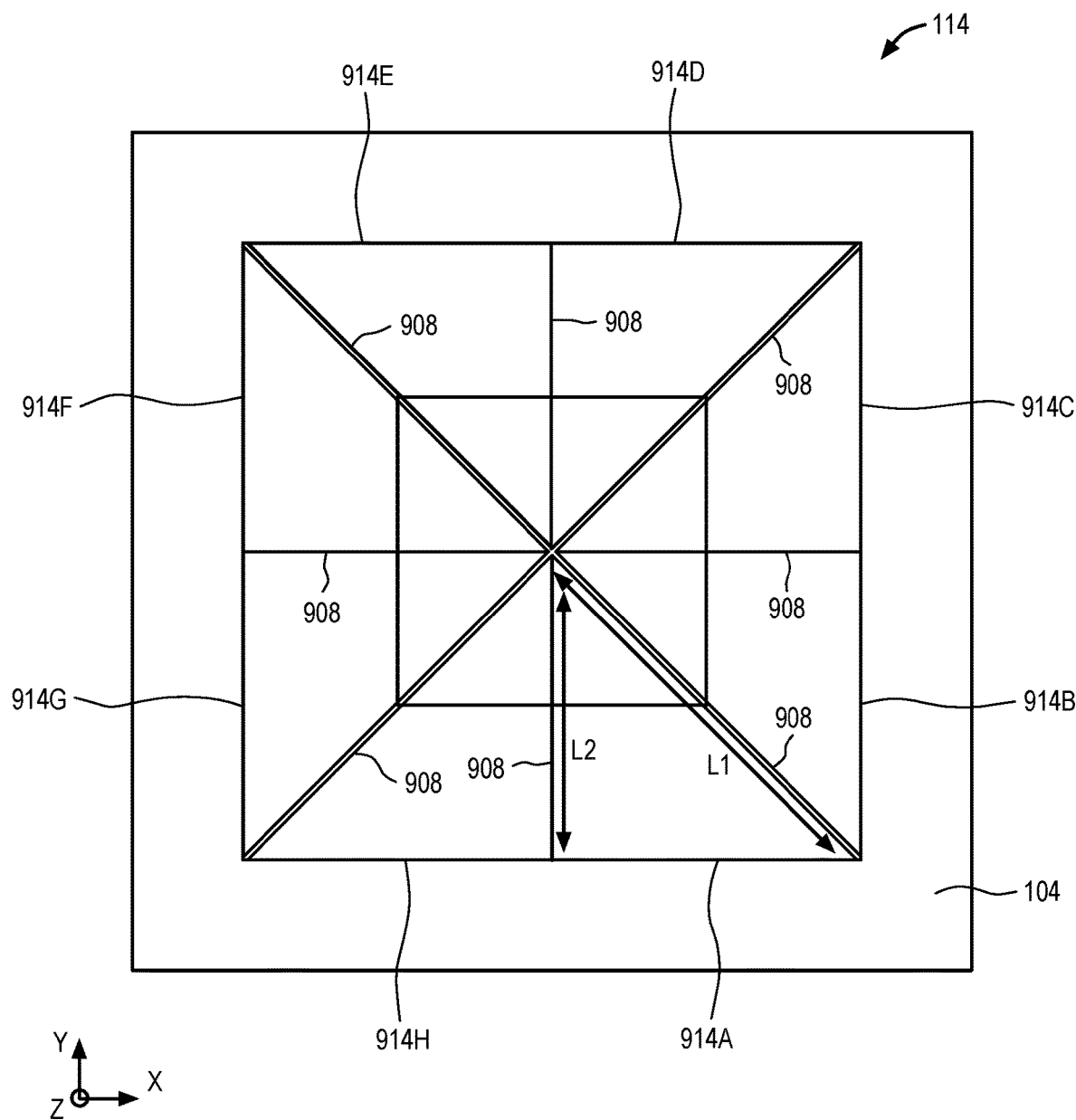
FIG. 11 illustrates a top plan view of one aspect of a valve of the portable electronic device and/or transducer assembly of FIG. 1 in a closed position.

In addition, in some aspects, to have more open areas, the overall perimeter lengths of the movable members 914A-H and/or slits 908 can be increased. For example, as illustrated by FIG. 11, each of movable members 914A-H may have three sides, with two sides that define the movable members and the slits 908. The sides defining the slits 908 may have a first length (L1) and a second length (L2). In some aspects, the first and second lengths (L1, L2) may be different to optimize the overall movable members and/or slit open areas. For example, first length (L1) may be greater than second length (L2). In some aspects, when there are eight movable members 914A-H as shown in FIG. 11, the first and second lengths (L1, L2) may be different and the movable members 914A-H are considered to form the shape of a right triangle. In other aspects, the first and second lengths (L1, L2) may be the same, as shown in FIGS. 7-8, such that the movable members are in the shape of equilateral triangles.

Figure 12:
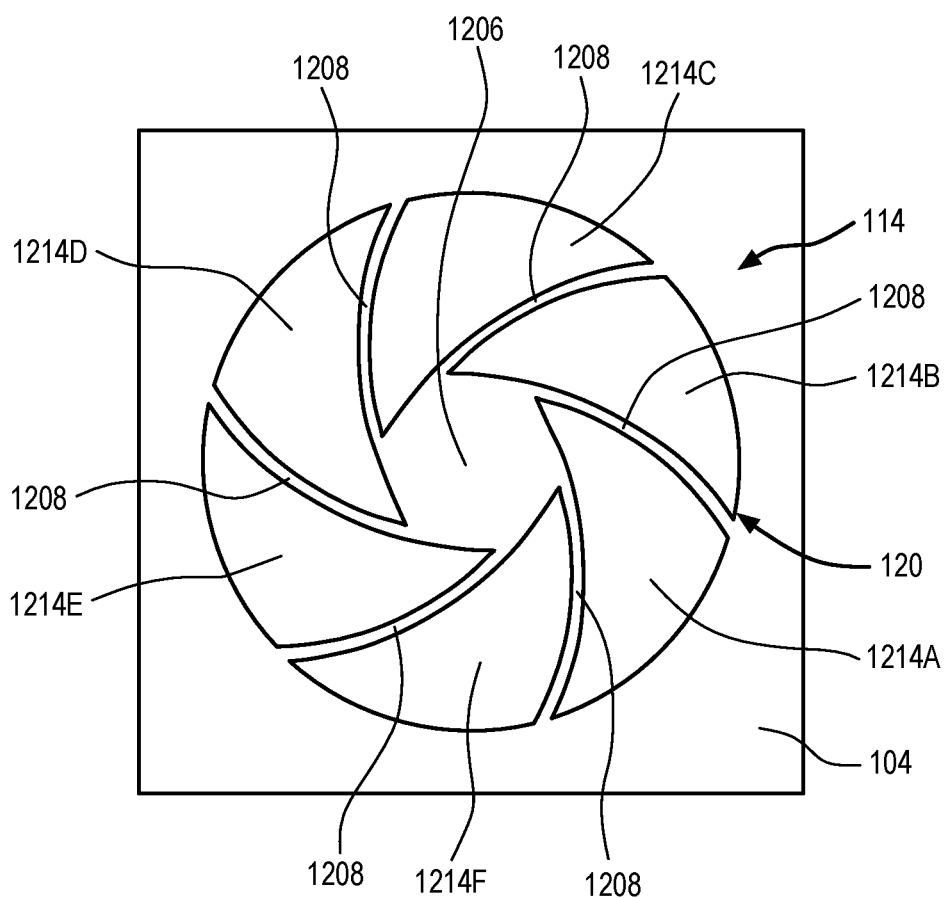
FIG. 12 illustrates a top plan view of one aspect of a valve of the portable electronic device and/or transducer assembly of FIG. 1 in a closed position.

FIG. 12 illustrates a magnified top perspective view of another representative valve from FIG. 1 having movable members in a non-actuated or resting (e.g., closed) position. From this view, it can be seen that valve 114 includes a number of movable portions or members 1214A, 1214B, 1214C, 1214D, 1214E, 1214F that are positioned over opening 120 to open/close opening 120 as desired. In some aspects, members 1214A-F may be flaps or cantilevers that are connected to the enclosure wall 104 (or fixed portion 104) at one end and meet at center 1206 of opening 120 at the other end. Each of members 1214A-F may be considered radially oriented and have a tapered or triangular shape and be separated from one another by radially oriented slits 1208. In addition, in some aspects, each of movable members 1214A-F may be considered to be arranged in a spiral or a spiral pattern, or otherwise arranged around the center 1206 on a flat plane of opening 120. For example, members 214A-F may have a triangular like shape that curves around and converges toward center 1206.

Although not shown, similar to the previously discussed configurations, each of movable members 1214A-F may include an inactive material layer and an active material layer that deforms upon application of a voltage. For example, in some aspects, the inactive material layer may be a MEMS material that is formed into a shape of the movable members 1214A-F using a MEMS processing operation. The active material layer may be a piezoelectric material that is formed or applied to a portion of the inactive material layer using a MEMS processing operation. In some aspects, the active material layer may be formed or applied to less than an entire area of the inactive material layer in a pattern found optimal for deformation of the inactive material layer. For example, in some aspects, the active material layer may be formed or applied around only a perimeter or area of inactive material layer, near the enclosure wall (or fixed portion) 104 as previously discussed (e.g. see FIG. 3). In this aspect, when a voltage is applied to the active material layer of one or more of movable members 1214A-F, the active material layer deforms and causes a further deformation of the inactive material layer extending to the center 1206 of opening 120 to open the valve. In some aspects, a small opening, slit or vent may remain at center 1206 between the ends of movable members 1214A-F even when they are in the closed position as shown to allow for separation of the members when actuated to the open position. The movable members 1214A-F including the inactive material layers and active material layers may be formed of a stack up one or more of the same materials as discussed in reference to the previously Figures. For example, each of movable members 1214A-F may include a stack up of the inactive material layer, a bottom conductive or electrode layer, the active material layer and a top conductive or electrode layer as previously discussed.

To actuate adjacent movable members 1214A-F to deform in opposite out of plane directions, an input driving voltage may be applied to the bottom or top conductive or electrode layers above and below the active material layer as previously discussed. For example, the application of the voltage may cause movable members 1214A, 1214C, 1214E to move or deform in a downward direction (below the resting plane of members 914A-H) and their adjacent movable members 1214B, 1214D, 1214F (e.g., members sharing a same slit 1208) to move or deform in an upward direction (above the resting plane of members 1214A-F). The direction of movement of movable members 1214A-F can be controlled by the driving voltages. For example, the application of opposite voltages will drive the adjacent members 1214A-F in opposite directions. In this aspect, the opening area between two adjacent movable members 1214A-F can be maximized.

Figure 13:
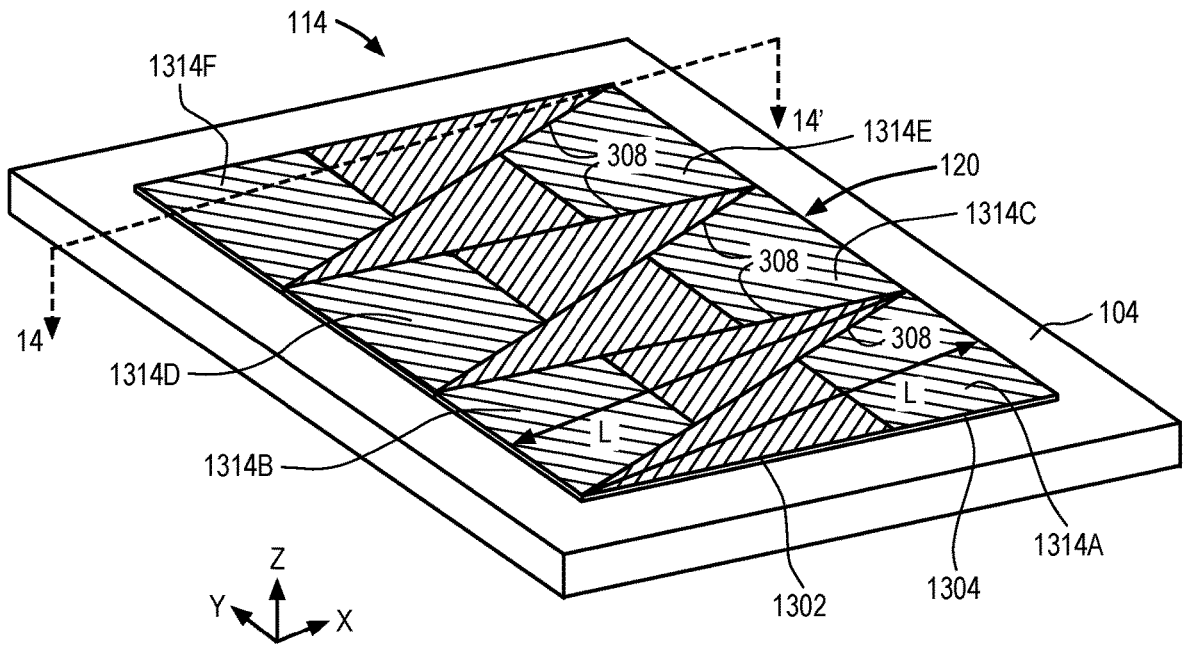
FIG. 13 illustrates a perspective view of one aspect of a valve of the portable electronic device and/or transducer assembly of FIG. 1 in an open position.
Figure 14:
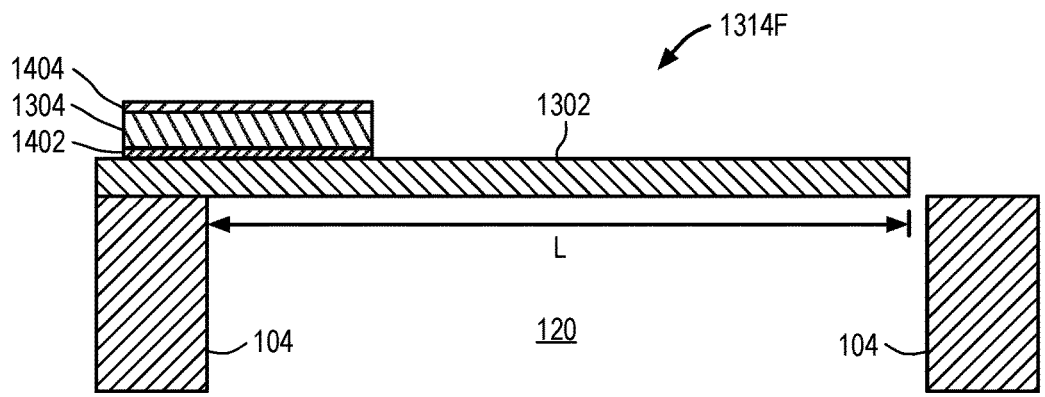
FIG. 14 illustrates a cross-sectional side view along line 14-14' of one aspect of a valve of a portable electronic device and/or transducer assembly of FIG. 13.
Figure 15:
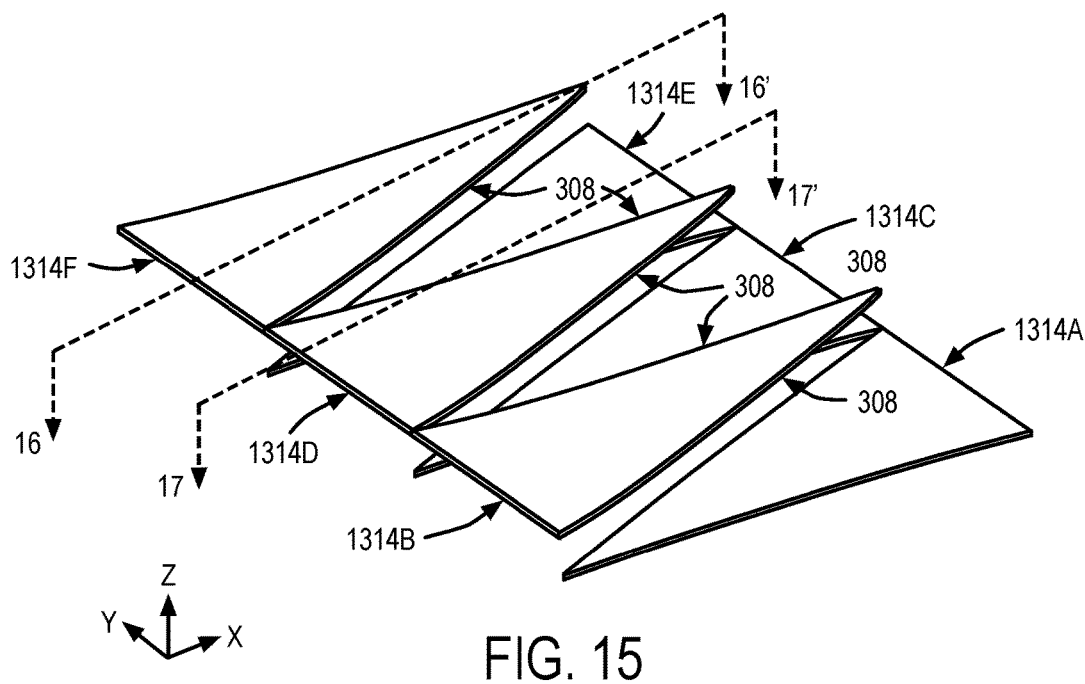
FIG. 15 illustrates a perspective view of one aspect of a valve of the portable electronic device and/or transducer assembly of FIG. 1 in an open position.
Figure 16:
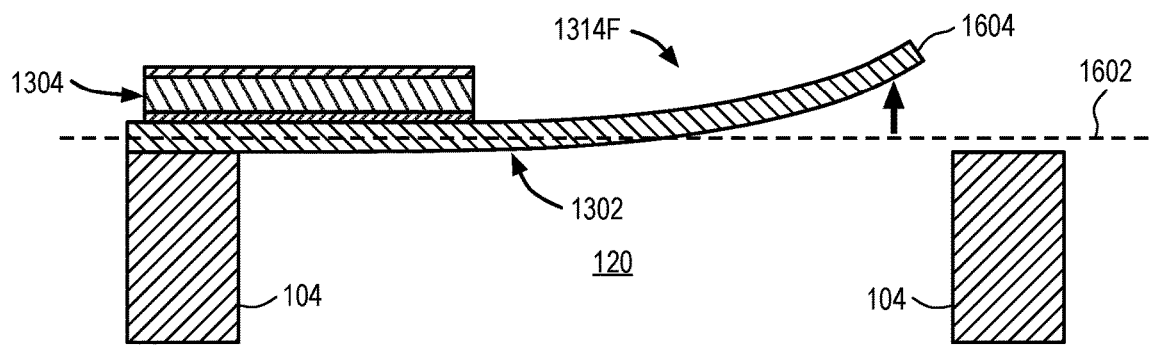
FIG. 16 illustrates a cross-sectional side view along line 16-16' of one aspect of a valve of a portable electronic device and/or transducer assembly of FIG. 15.
Figure 17:
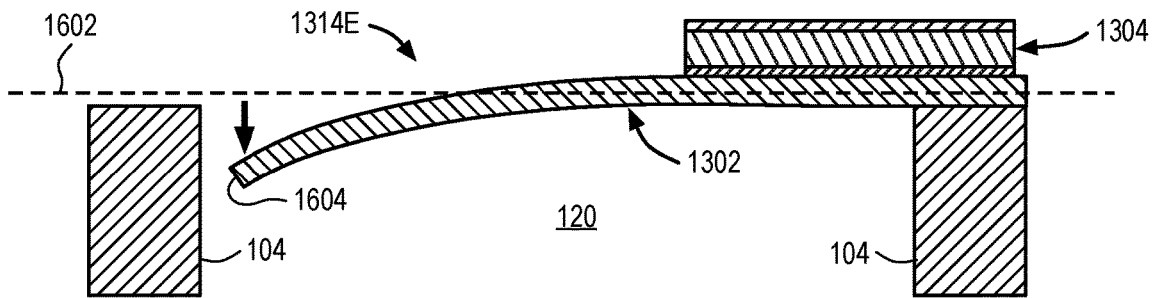
FIG. 17 illustrates a cross-sectional side view along line 17-17' of one aspect of a valve of a portable electronic device and/or transducer assembly of FIG. 15.

FIGS. 13-16 illustrate another representative valve from FIG. 1 having movable members in a non-actuated or resting (e.g., closed) position or an actuated or deformed (e.g., open) position. Representatively, FIGS. 13-14 show valve 114 in the non-actuated or closed position and FIGS. 15-17 show valve 114 in the actuated or open position. From these views, it can be seen that valve 114 includes a number of movable portions or members 1314A, 1314B, 1314C, 1314D, 1314E, 1314F that are positioned over opening 120 to open/close opening 120 as desired. In some aspects, members 1314A-F may be considered interdigital flaps or cantilevers. Members 1314A-F may be considered "interdigital" in that they are formed by two sets of interleaving or alternating fingers or finger-like processes that extend from opposite sides of the opening 120. Movable members 1314A-F may be connected to the enclosure wall 104 (or fixed portion 104) at one end and have a free or movable end that extends to the opposite side of opening 120. Each of movable members 1314A-F may have a tapered or triangular shape and be separated from one another by slits 1308. The opening 120 may have a polygon shape, for example, a rectangular shape such that when movable members 1314A-F are arranged side by side they extend across and cover opening 120. In some aspects, movable members 1314A-F and slits 1308 may be considered laterally arranged or orientated in that they extend from one side to the other side of opening 120. For example, in some aspects, each of movable members 1314A-F may be considered to have a length dimension (L) running parallel to the x-axis as shown, and the length dimensions (L) of each of movable members 1314A-F may be parallel to one another. It should be understood, however, that while a polygon shaped opening 120 and/or tapered members 1314A-F are shown, other shapes and sizes of openings 120 and/or members 1314A-F suitable for covering the opening 120 as disclosed herein are contemplated (e.g., triangular, rectangular, circular, etc.). The opening and/or closing of members 1314A-F may be driven in parallel or separately controlled by the application of a voltage to give a variable impedance and/or resistance control as previously discussed. For example, in some aspects, the application of an electric voltage may be used to open one or more of members 1314A-F and termination of the voltage results in members 1314A-F returning to the closed, or resting, state.

Representatively, in some aspects, each of movable members 1314A-F may include an inactive material layer 1302 and an active material layer 1304 that deforms upon application of a voltage. For example, in some aspects, the inactive material layer 1302 may be any one or more of the previously discussed MEMS materials formed into a shape of the movable members 1314A-F using a MEMS processing operation. The active material layer 1304 may be a piezoelectric material that is formed or applied to a portion of the inactive material layer 1302 using a MEMS processing operation. In some aspects, active material layer 1304 may be formed or applied to less than an entire area of the inactive material layer 1302 in a pattern found optimal for deformation of the inactive material layer 1302. For example, in some aspects, active material layer 1304 is formed or applied around only a portion or area of inactive material layer 1302 near the enclosure wall (or fixed portion) 104 as shown in FIG. 13. In other words, active material layer 1304 does not extend all the way to the free or deformable end of movable members 1314A-F. In this aspect, when a voltage is applied to the active material layer 1304 of one or more of movable members 1314A-F, the active material layer 1304 deforms and causes a further deformation of the inactive material layer 1302 extending to the opposite side of opening 120 to open the valve. In some aspects, a small opening, slit or vent may remain between movable members 1314A-F and/or the ends of movable members 1314A-F and the fixed portion 104 even when they are in the closed position as shown to allow for separation of the members when actuated to the open position.

One representative stack-up of the layers forming movable members 1314A-F will now be described in more detail in reference to FIG. 14. FIG. 14 illustrates a cross-sectional side view along line 14-14' through movable member 1314F of FIG. 13. From this view, it can be seen that the enclosure (or fixed portion) 104 defines opening 120. In some aspects, the enclosure (or fixed portion) 104 may be a substrate material formed to have opening 120 using MEMS processing techniques as previously discussed. Movable member 1314F may include a stack-up of the inactive material layer 1302, bottom conductive or electrode layer 1402, active layer 1304 and top conductive or electrode layer 1404. In addition, although not shown, in some aspects, an optional seed layer for achieving good piezoelectric crystalline structure during the deposition process may be formed between inactive material layer 1302 and bottom electrode layer 1402. Inactive material layer 1302 may be formed at one end on portion 104 and extend toward the other side of opening 120 as shown. The inactive material layer 1302 may be considered as defining, occupying, or otherwise extending, the entire length dimension (L) of the movable member 1314F. The inactive material layer 1302 may be a layer with some elasticity and which is made of any of the previously discussed MEMS materials.

The active material layer 1304 and the bottom or top conductive or electrode layers 1402, 1404 may cover only a portion of inactive material layer 1302 and be made of any of the previously discussed conductive MEMS materials using MEMS processing techniques. For example, active material layer 1304 and electrode layers 1402, 1404 may cover or otherwise occupy less than an entire length dimension (L) of movable member 1314F as shown. For example, as previously discussed, active material layer 1304 may be applied in a pattern, shape or arrangement that optimizes a displacement of inactive material layer 1302. For example, active material layer 1304 may be formed on a portion of the inactive material layer 1302 near the fixed portion or enclosure wall 104 and extend across opening 120 over less than half the length (L), or less than one quarter the length (L), of the inactive material layer 1302.

To actuate movable members 1314A-F, an input driving voltage may be applied to the bottom or top conductive or electrode layers 1402, 1404 as previously discussed. Representatively, in one aspect, a voltage (e.g., +10V or −10V) may be applied to the top electrode layer 1404 or bottom electrode layer 1402 of members 1314A-F, and the other electrode layer may be ground (e.g., 0V). The application of the voltage to members 1314A-F causes active layer 1304 to deform to an out of plane configuration or position. This deformation of active layer 1304, in turn, causes the inactive layer 1302 attached to the active layer 1304 to also deform (e.g., curve or bend) to an out of plane configuration (e.g., above or below the resting plane of members 1314A-F) depending on the voltage applied. In some aspects, the applied voltage may be controlled or otherwise selected so that adjacent movable members 1314A-F move or deform in opposite directions thereby optimizing the open area of the valve 114 in the open position.

Representatively, referring now to FIG. 15, FIG. 15 shows movable members 1314A-F in an actuated or deformed (e.g., open) position. In particular, it can be seen that the applied voltage causes adjacent movable members 1314A-F to move or deform out of plane (e.g., an x-y plane) in opposite directions. Representatively, as shown in FIG. 14, movable members 1314A, 1314C and 1314E move or deform in a downward direction (below the resting plane of members 1314A-F) and the adjacent movable members 1314B, 1314D and 1314F move or deform in an upward direction (above the resting plane of members 1314A-F). It should be understood that movable members sharing a same slit 1308, or that are otherwise directly next to one another or side by side, are considered "adjacent." For example, movable member 1314B would be considered adjacent to, and sharing the same slits 1308 as, movable members 1314A, 1314C. Movable member 1314B will therefore move in an opposite direction to movable members 1314A and 1314C. In this aspect, as can be seen from FIG. 15, upon application of a voltage, half (or three) of the movable members (e.g., movable members 1314A, 1314C, 1314E) may move in one direction (e.g., a downward direction) and the other half (or remaining three) movable members (e.g., movable members 1314B, 1314D, 1314F) move in an opposite direction (e.g., an upward direction). The direction of movement of movable members 1314A-F can be controlled by the driving voltages. For example, the application of opposite voltages will drive the adjacent members 1314A-F in opposite directions. In this aspect, the opening area between two adjacent movable members 1314A-F can be maximized.

For example, FIG. 16 and FIG. 17 illustrate adjacent movable members moving in opposite directions upon application of a voltage. FIG. 16 and FIG. 17 are cross-sections along dashed lines 16-16' and dashed lines 17-17' of FIG. 15, respectively. Representatively, FIG. 16 is a cross-section through movable member 1314F and FIG. 17 is a cross section through the adjacent movable member 1314E. Movable member 1314E is considered adjacent to movable member 1314F in that they share the same slit 1308. As can be seen from FIG. 16, upon application of a voltage (e.g., −10V), movable member 1314F moves out of plane 1602 in an upward direction, as illustrated by the arrow. On the other hand, as can be seen from FIG. 17, the movable member 1314E which is adjacent to movable members 1314F and 1314D moves out of plane 1602 in a downward direction when a voltage (e.g., +10V) is applied, as illustrated by the arrow.

In addition, as can be seen from FIG. 16 and FIG. 17, the movement or deformation of the movable members 1314E and 1314F occurs mainly at the free end defined by the inactive material layer 1302. Representatively, as can be seen from FIG. 16, when the voltage is applied to the active material layer 1304 of movable member 1314F, the deformation of the active material layer 1304 causes the free end, or end 1604 distal to active material layer 1304, to bend or curve out of plane in an upward direction. The portion of the movable member 1314F near the fixed portion 104, however, remain relatively in plane 1602. On the other hand, as can be seen from FIG. 17, when the voltage is applied to the active material layer 1304 of movable member 1314E, the deformation of the active material layer 1304 causes the free end, or end 1604 distal to active material layer 1304, to bend or curve out of plane in a downward direction. The portions of the movable member 1314E near the fixed portion 104, however, remains relatively in plane 1602. Thus, the members 1314E-F are considered to have some kind of curve, bend, angle or the like when they move or deform such that they are no longer flat or straight (e.g., planar) as shown in the resting or inactive configuration of FIG. 13.

Figure 18:
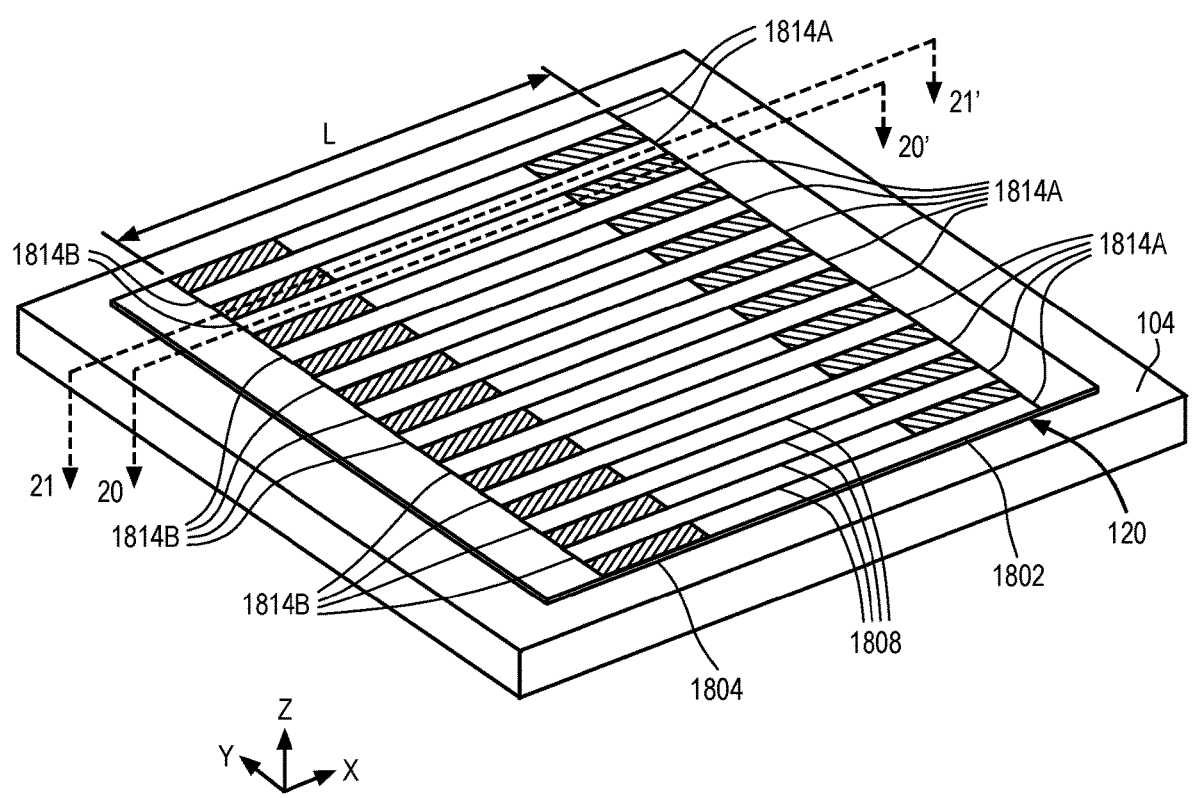
FIG. 18 illustrates a perspective view of one aspect of a valve of the portable electronic device and/or transducer assembly of FIG. 1 in a closed position.
Figure 19:
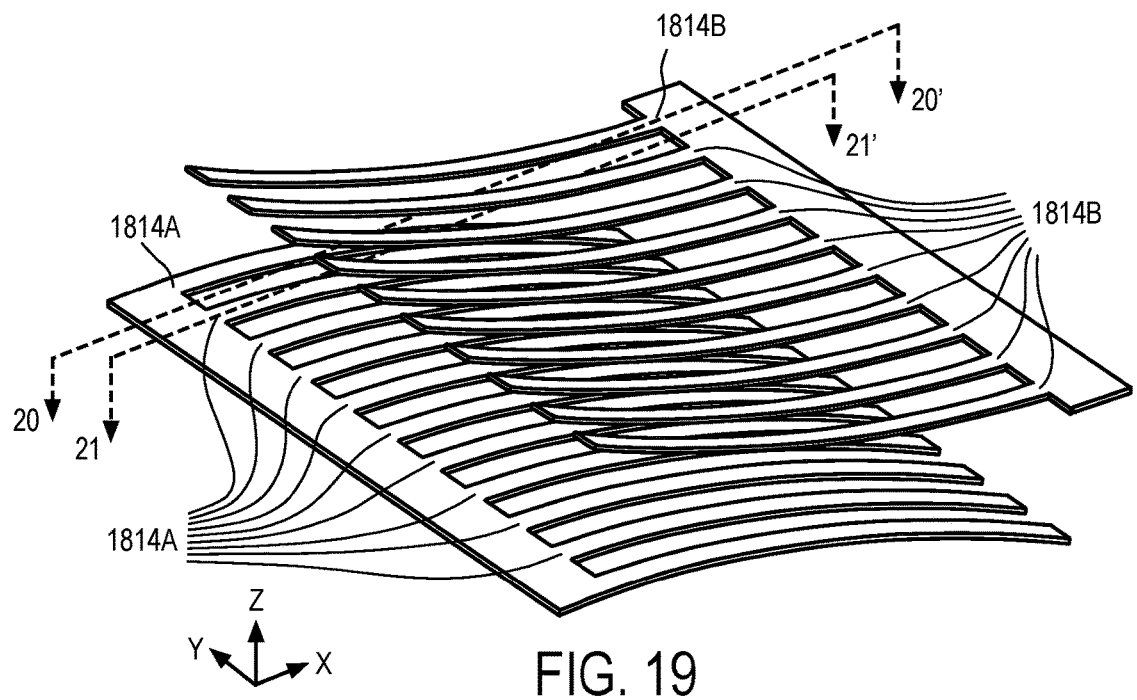
FIG. 19 illustrates a perspective view of one aspect of a valve of the portable electronic device and/or transducer assembly of FIG. 1 in an open position.
Figure 20:
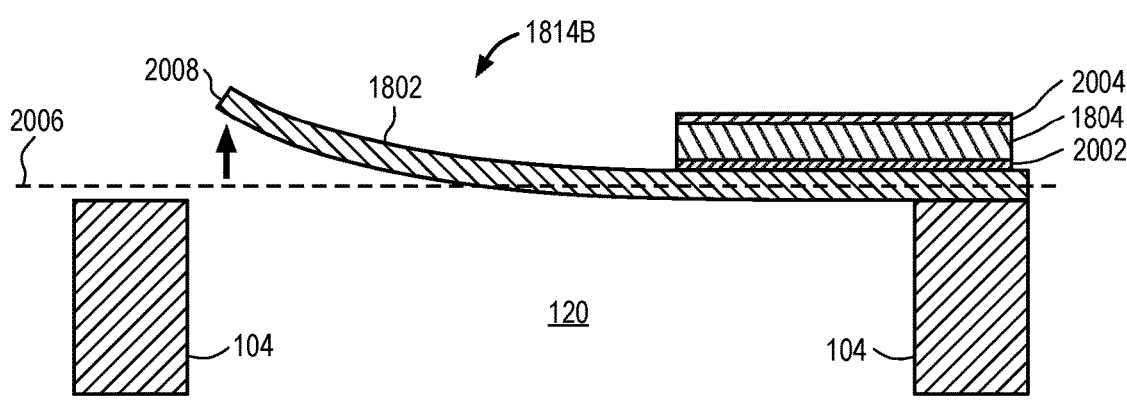
FIG. 20 illustrates a cross-sectional side view along line 20-20' of one aspect of a valve of a portable electronic device and/or transducer assembly of FIG. 19.
Figure 21:
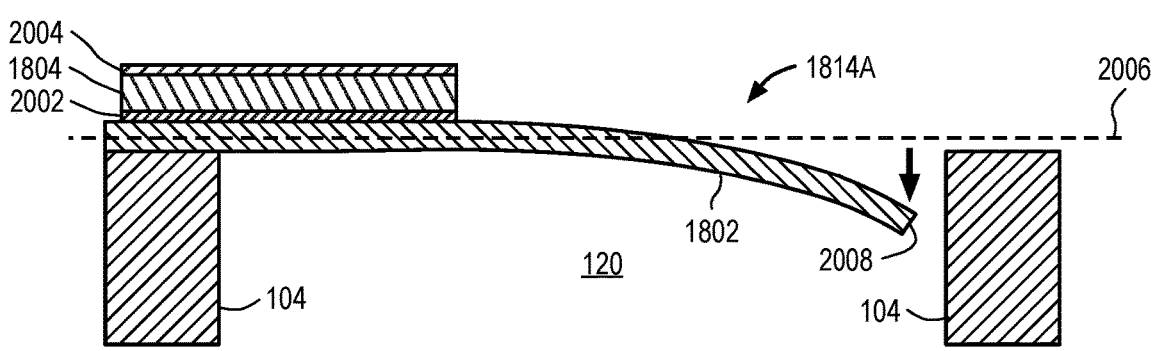
FIG. 21 illustrates a cross-sectional side view along line 21-21' of one aspect of a valve of a portable electronic device and/or transducer assembly of FIG. 19.

FIGS. 18-21 illustrate another representative valve from FIG. 1 having movable members in a non-actuated or resting (e.g., closed) position or an actuated or deformed (e.g., open) position. Representatively, FIG. 18 shows valve 114 in the non-actuated or closed position and FIGS. 19-21 show valve 114 in the actuated or open position. From these views, it can be seen that valve 114 includes a number of movable portions or members 1814A and 1814B that are positioned over opening 120 to open/close opening 120 as desired. In some aspects, members 1814A and 1814B may be considered sets of interdigital flaps or cantilevers. For example, movable members 1814A may be considered a first set made up of eleven movable members extending from one side of opening 120 and movable members 1814B may be considered a second set made up of ten movable members extending from the other side of opening 120. Each of the movable members making up the set of movable members 1814A may interleave or alternative with each of the movable members making up the set of movable members 1814B. Similar to the previously discussed movable members, movable members 1814A and 1814B may be connected to the enclosure wall 104 (or fixed portion 104) at one end and have a free or movable end that extends to the opposite side of opening 120. In this configuration, however, each of movable members 1814A-B may be elongated rectangular or finger-like processes that are separated from one another by slits 1808. The opening 120 may have a polygon shape, for example, a rectangular or square shape such that when movable members 1814A-B are arranged side by side they extend across and cover opening 120. In some aspects, movable members 1814A-B and slits 1808 may be considered laterally arranged or orientated in that they extend from one side to the other side of opening 120. For example, in some aspects, each of movable members 1814A-B may be considered to have a length dimension (L) running parallel to the x-axis as shown, and the length dimensions (L) of each of movable members 1814A-B may be parallel to one another. It should be understood, however, that while a polygon shaped opening 120 and/or rectangular members 1814A-B are shown, other shapes and sizes of openings 120 and/or members 1814A-B suitable for covering the opening 120 as disclosed herein are contemplated (e.g., triangular, rectangular, circular, etc.). The opening and/or closing of members 1814A-B may be driven in parallel or separately controlled by the application of a voltage to give a variable impedance and/or resistance control as previously discussed. For example, in some aspects, the application of an electric voltage may be used to open one or more of members 1814A-B and termination of the voltage results in members 1814A-B returning to the closed, or resting, state.

Similar to the previously discussed configurations, each of movable members 1814A-B may include an inactive material layer 1802 and an active material layer 1804 that deforms upon application of a voltage. For example, in some aspects, the inactive material layer 1802 may be any one or more of the previously discussed MEMS materials formed into a shape of the movable members 1814A-B using a MEMS processing operation. The active material layer 1804 may be a piezoelectric material that is formed or applied to a portion of the inactive material layer 1802 using a MEMS processing operation. In some aspects, active material layer 1804 may be formed or applied to less than an entire area of the inactive material layer 1802 in a pattern found optimal for deformation of the inactive material layer 1802. The particular stack up and pattern of the inactive and active material layers 1802, 1804 is similar to the previously discussed configurations and will be described in more detail in reference to FIGS. 20-21. As can be seen from FIG. 19, however, the application of a voltage causes adjacent movable members 1814A-B to move or deform in opposite directions. For example, movable members 1814A may move out of plane in a downward direction, and the adjacent movable members 1814B may move out of plane in an upward direction.

One representative stack-up of the layers forming movable members 1814A-B, as well as their movement in opposite directions, will now be described in more detail in reference to FIG. 20 and FIG. 21. FIG. 20 illustrates a cross-sectional side view along line 20-20' through movable member 1814B of FIG. 19 and FIG. 21 illustrates a cross-sectional side view along line 21-21' through movable member 1814A of FIG. 19. From this view, it can be seen that the enclosure (or fixed portion) 104 defines opening 120. In some aspects, the enclosure (or fixed portion) 104 may be a substrate material formed to have opening 120 using MEMS processing techniques as previously discussed. Movable members 1814A and 1814B may include a stack-up of the inactive material layer 1802, bottom conductive or electrode layer 2002, active layer 1804 and top conductive or electrode layer 2004. In addition, although not shown, in some aspects, an optional seed layer for achieving good piezoelectric crystalline structure during the deposition process may be formed between inactive material layer 1802 and bottom electrode layer 2002. Inactive material layer 1802 may be formed at one end on portion 104 and extend toward the other side of opening 120 as shown. The inactive material layer 1802 may be considered as defining, occupying, or otherwise extending, the entire length dimension (L) of the movable member 1814A-B. The inactive material layer 1802 may be a layer with some elasticity and which is made of any of the previously discussed MEMS materials.

The active material layer 1804 and the bottom or top conductive or electrode layers 2002, 2004 may cover only a portion of inactive material layer 1802 and be made of any of the previously discussed conductive MEMS materials using MEMS processing techniques. For example, active material layer 1804 and electrode layers 2002, 2004 may cover or otherwise occupy less than an entire length dimension (L) of movable member 1814A-B as shown. For example, as previously discussed, active material layer 1804 may be applied in a pattern, shape or arrangement that optimizes a displacement of inactive material layer 1802. For example, active material layer 1804 may be formed on a portion of the inactive material layer 1802 near the fixed portion or enclosure wall 104 and extend across opening 120 over less than half the length (L), or less than one quarter the length (L), of the inactive material layer 1802.

To actuate movable members 1814A-B, an input driving voltage may be applied to the bottom or top conductive or electrode layers 2002, 2004. Representatively, in one aspect, a voltage (e.g., +10V or −10V) may be applied to the top electrode layer 2004 or bottom electrode layer 2002 of members 1814A-B, and the other electrode layer may be ground (e.g., 0V). The application of the voltage to members 1814A-B causes active layer 1804 to deform to an out of plane configuration or position. This deformation of active layer 1804, in turn, causes the inactive layer 1802 attached to the active layer 1804 to also deform (e.g., curve or bend) to an out of plane configuration (e.g., above or below the resting plane of members 1814A-B) depending on the voltage applied. In some aspects, the applied voltage may be controlled or otherwise selected so that adjacent movable members 1814A-B to move or deform in opposite directions thereby optimizing the open area of the valve 114 in the open position.

For example, FIG. 20 and FIG. 21 illustrate adjacent movable members moving in opposite directions upon application of a voltage. Representatively, FIG. 20 shows that, upon application of a voltage (e.g., −10V), movable member 1814B moves out of plane 2006 in an upward direction, as illustrated by the arrow. On the other hand, as can be seen from FIG. 21, the movable member 1814A which is adjacent to movable member 1814B, moves out of plane 2006 in a downward direction when a voltage (e.g., +10V) is applied, as illustrated by the arrow.

In addition, as can be seen from FIG. 20 and FIG. 21, the movement or deformation of the movable members 1814A-B occurs mainly at the free end defined by the inactive material layer 1802. Representatively, the deformation of the active material layer 1804 causes the free end, or end 2008 distal to active material layer 1804, to bend or curve out of plane in an upward or downward direction. The portion of the movable member 1814A-B near the fixed portion 104, however, remains relatively in plane 2006. Thus, the members 1814A-B are considered to have some kind of curve, bend, angle or the like when they move or deform such that they are no longer flat or straight (e.g., planar) as shown in the resting or non-actuated configuration of FIG. 18.

Figure 22:
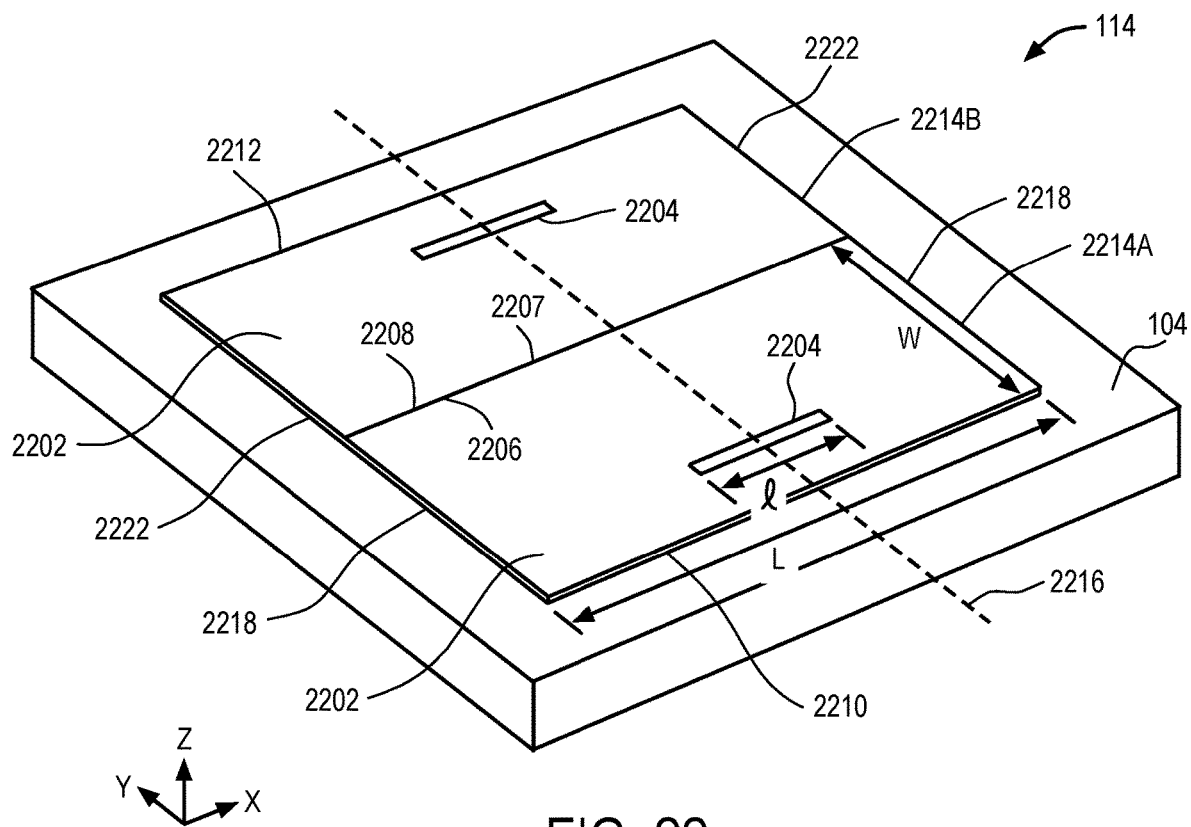
FIG. 22 illustrates a perspective view of one aspect of a valve of the portable electronic device and/or transducer assembly of FIG. 1 in a closed position.

FIGS. 22-26 illustrate another representative valve from FIG. 1 having movable members in a non-actuated or resting (e.g., closed) position or an actuated or deformed (e.g., open) position. Representatively, FIG. 22 shows valve 114 in the non-actuated or closed position and FIGS. 23-26 show valve 114 in the actuated or open position. From these views, it can be seen that valve 114 includes a number of movable portions or members 2214A and 2214B that are positioned over opening 120 to open/close opening 120 as desired. In some aspects, members 2214A and 2214 B may be considered plates or other similarly flat or planar structure having a relatively large surface area. For example, movable member 2214A may be a first plate that extends from one side of opening 120 to a center of opening 120 such that it covers half of opening 120. Movable member 2214B may be a second plate that extends from another side of opening 120 to the center of opening 120 such that it covers the other half of opening 120. Similar to the previously discussed movable members, movable members 2214A and 2214B may be connected to the enclosure wall 104 (or fixed portion 104) at one side and have a free or movable end or side that extends to the center of opening 120. In this configuration, however, each of movable members 2214A and 2214B may have four sides, for example they may be rectangular structures, that are separated from one another by slit 2207. The opening 120 may have a polygon shape, for example a rectangular or square shape, such that when movable members 2214A and 2214B extend across opening 120, their edges or sides 2206, 2208 meet in the center and cover opening 120. In some aspects, movable members 2214A-B and slits 2208 may be considered laterally arranged or orientated in that they extend from one side to the other side of opening 120. It should be understood, however, that while a polygon shaped opening 120 and/or rectangular members 2214A-B are shown, other shapes and sizes of openings 120 and/or members 2214A-B suitable for covering the opening 120 as disclosed herein are contemplated (e.g., triangular, rectangular, circular, etc.). The opening and/or closing of members 2214A-B may be driven in parallel or separately controlled by the application of a voltage to give a variable impedance and/or resistance control as previously discussed. For example, in some aspects, the application of an electric voltage may be used to open one or more of members 2214A-B and termination of the voltage results in members 2214A-B returning to the closed, or resting, state.

Similar to the previously discussed configurations, each of movable members 2214A-B may include an inactive material layer 2202 and an active material layer 2204 that deforms upon application of a voltage. For example, in some aspects, the inactive material layer 2202 may be any one or more of the previously discussed MEMS materials formed into a shape of the movable members 2214A-B using a MEMS processing operation. The active material layer 2204 may be a piezoelectric material that is formed or applied to a portion of the inactive material layer 2202 using a MEMS processing operation. In some aspects, active material layer 2204 may be formed or applied to less than an entire area of the inactive material layer 2202 in a pattern found optimal for deformation of the inactive material layer 2202. Representatively, in this configuration, active material layer 2204 may cover a relatively small area near the sides 2210, 2212 of members 2214A-B closest to the fixed portion 104. For example, active material layer 2204 may be a rectangular shaped, anchor like structure, that has a length dimension (l) running parallel to the length dimension (L) of members 2214A-B. Active material layer 2204 may further be considered centered about the axis of symmetry or midline 2216 of members 2214A-B forming valve 114. This particular pattern or arrangement of active material layer 2204 relative to inactive material layer 2202 enables maximum deflection at the tips or corners of members 2214A-B and a relatively high displacement of the shorter edges 2218, 2222 defining the width dimension as shown in FIGS. 23-26.

Figure 23:
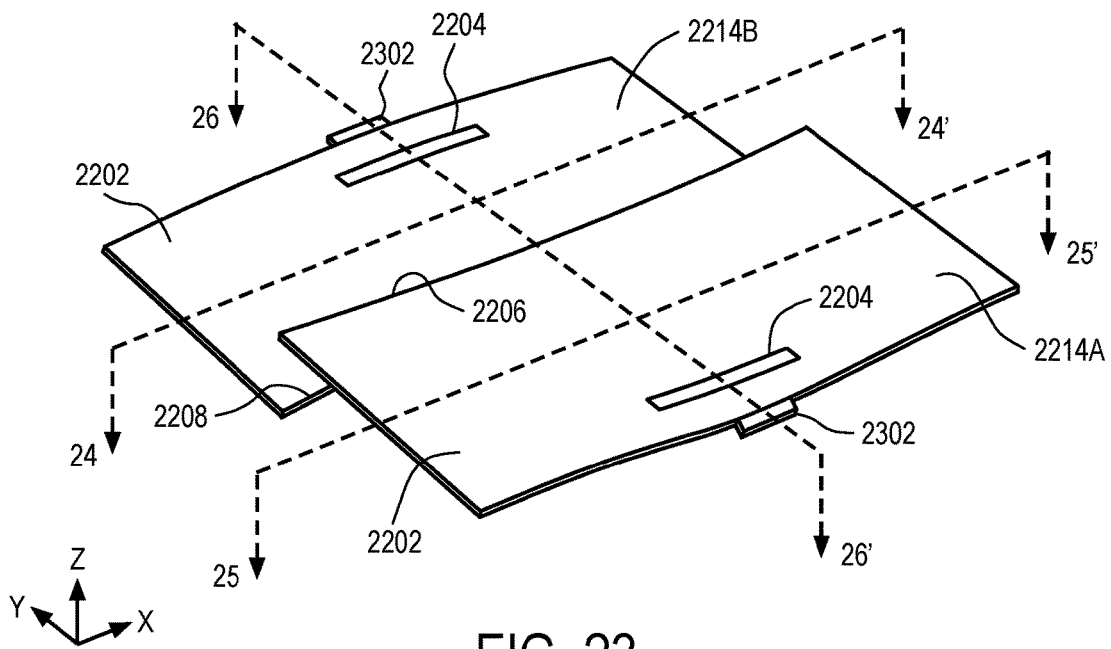
FIG. 23 illustrates a perspective view of one aspect of a valve of the portable electronic device and/or transducer assembly of FIG. 22 in an open position.
Figure 24:
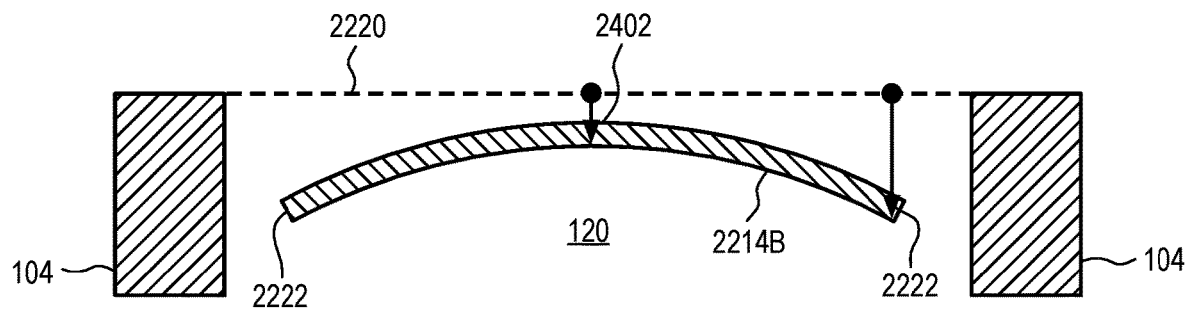
FIG. 24 illustrates a cross-sectional side view along line 24-24' of one aspect of a valve of a portable electronic device and/or transducer assembly of FIG. 23.
Figure 25:
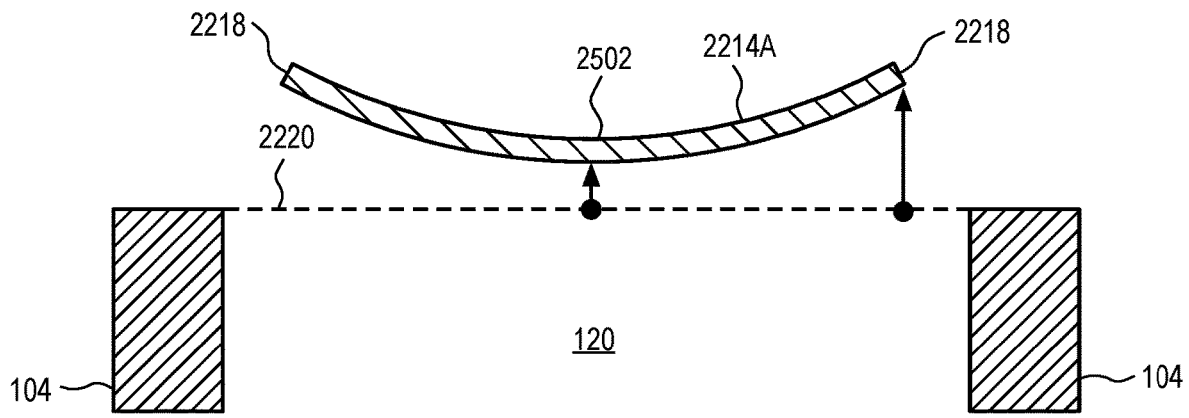
FIG. 25 illustrates a cross-sectional side view along line 25-25' of one aspect of a valve of a portable electronic device and/or transducer assembly of FIG. 23.
Figure 26:
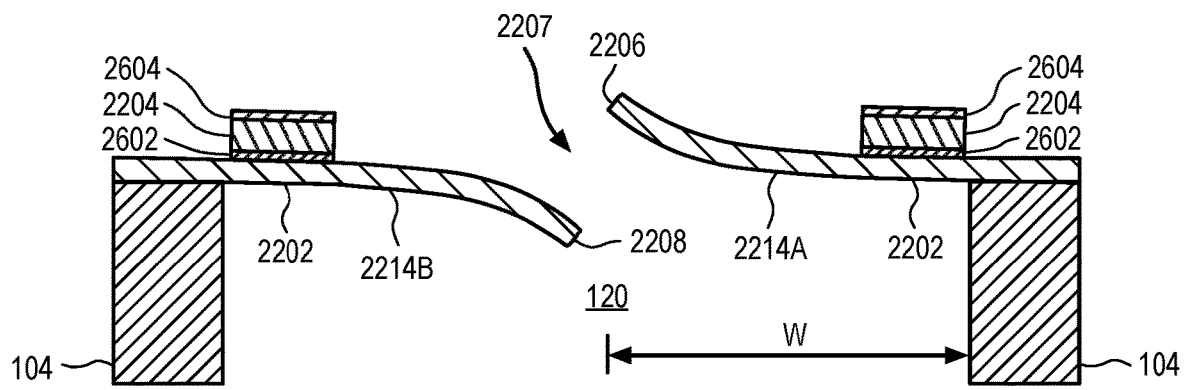
FIG. 26 illustrates a cross-sectional side view along line 26-26' of one aspect of a valve of a portable electronic device and/or transducer assembly of FIG. 23.

For example, FIGS. 23-26 illustrate movable members moving in opposite directions upon application of a voltage. Representatively, FIG. 23 is a top perspective view of members 2214A-B in the actuated or open position, FIG. 24 is a cross-sectional side view along line 24-24' through member 2214B of FIG. 23, FIG. 25 is a cross-sectional side view along line 25-25' through member 2214A of FIG. 23, and FIG. 26 is a cross-sectional side view along line 26-26' through members 2214A-B of FIG. 23. Representatively, as can be seen from FIG. 23, each of movable members 2214A-B are anchored to the fixed portion by a fastening member 2302 near a center of the length dimension, and upon application of a voltage, movable member 2214A deforms out of plane in an upward direction while movable member 2214B deforms out of plane in a downward direction. For example, as can be seen from FIG. 24, movable member 2214B curves out of plane 2220 in a downward direction such that sides 2222 are farther out of plane than the center 2402 of member 2214B as shown by the arrows. On the other hand, as can be seen from FIG. 25, movable member 2214A curves out of plane 2220 in an upward direction such that sides 2218 are farther out of plane than the center 2502 of member 2214A as shown by the arrows. In addition, as can be seen from FIG. 26, the end or side 2206 of member 2214A also deforms or curves in an upward direction, while the end or side 2208 of member 2214B deforms or curves in a downward direction. As can be seen from FIG. 26, the deformation of members 2214A-B in this manner maximizes the open area of slit 2207 between the sides or ends 2206, 2208.

In addition, as can be seen from FIG. 26, the particular stack up and pattern of the inactive and active material layers 2202, 2204 is similar to the previously discussed configurations. For example, the enclosure (or fixed portion) 104 may be a substrate material formed to have opening 120 using MEMS processing techniques as previously discussed. Movable members 2214A and 2214B may include a stack-up of the inactive material layer 2202, bottom conductive or electrode layer 2602, active layer 2204 and top conductive or electrode layer 2604. In addition, although not shown, in some aspects, an optional seed layer for achieving good piezoelectric crystalline structure during the deposition process may be formed between inactive material layer 2202 and bottom electrode layer 2602. Inactive material layer 2202 may be formed at one end on portion 104 and extend toward the other side of opening 120 as shown. The inactive material layer 2202 may be considered as defining, occupying, or otherwise extending, the entire width dimension (W) of the movable member 2214A-B. The inactive material layer 2202 may be a layer with some elasticity and which is made of any of the previously discussed MEMS materials. The active material layer 2204 and the bottom or top conductive or electrode layers 2602, 2604 may cover only a portion of inactive material layer 1802 and be made of any of the previously discussed conductive MEMS materials using MEMS processing techniques. For example, active material layer 2204 and electrode layers 2602, 2604 may cover or otherwise occupy less than an entire width dimension (W) of movable member 2214A-B as shown. For example, as previously discussed, active material layer 2204 may be applied in a pattern, shape or arrangement that optimizes a displacement of inactive material layer 2202. For example, active material layer 2204 may be formed on a portion of the inactive material layer 2202 near the fixed portion or enclosure wall 104 and extend across opening 120 over less than half the width (W), or less than one quarter the width (W), of the inactive material layer 2202.

Similar to the previously discussed configurations, to actuate movable members 2214A-B, an input driving voltage may be applied to the bottom or top conductive or electrode layers 2602, 2604. Representatively, in one aspect, a voltage (e.g., +10V or −10V) may be applied to the top electrode layer 2604 or bottom electrode layer 2602 of members 2214A-B, and the other electrode layer may be ground (e.g., 0V). The application of the voltage to members 2214A-B causes active layer 2204 to deform to an out of plane configuration or position. This deformation of active layer 2204, in turn, causes the inactive layer 2202 attached to the active layer 2204 to also deform (e.g., curve or bend) to an out of plane configuration (e.g., above or below the resting plane of members 2214A-B) depending on the voltage applied. For example, a voltage (e.g. +10V) may be applied to one of the electrode layers 2602, 2604 of member 2214B to drive member 2214B out of plane in a downward direction, while an opposite voltage (e.g., −10V) may be applied to one of the electrode layers 2602, 2604 of member 2214A to drive member 2214A out of plane in an upward direction. In some aspects, the applied voltage may be controlled or otherwise selected so that adjacent movable members 2214A-B move or deform in opposite directions thereby optimizing the open area of the valve 114 in the open position.

Figure 27:
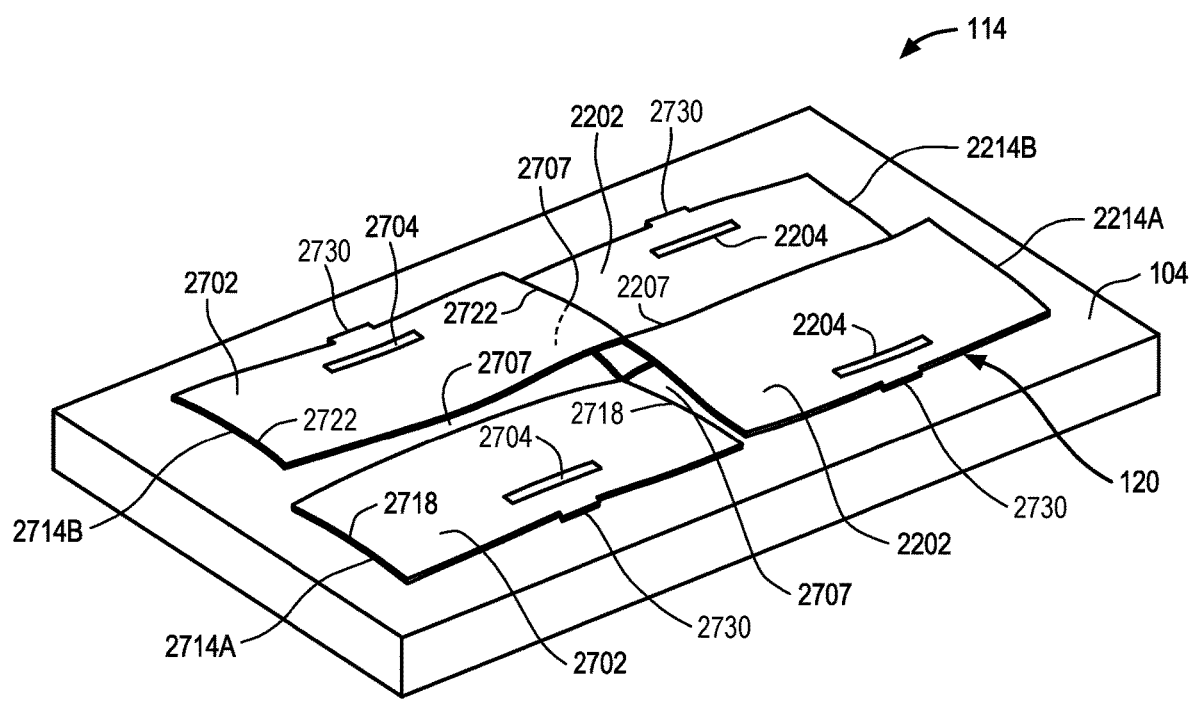
FIG. 27 illustrates a perspective view of one aspect of a valve of the portable electronic device and/or transducer assembly of FIG. 1 in an open position.

FIG. 27 illustrates another representative valve from FIG. 1 having movable members in an actuated or deformed (e.g., open) position. Representatively, FIG. 27 shows valve 114 in the actuated or open position and including movable portions or members 2214A and 2214B as previously discussed in reference to FIGS. 22-26. In this configuration, however, two additional movable members 2714A and 2714B are further included to create a 2×2 array of movable members as shown. Movable members 2714A-B may be the same as movable members 2214A-B. For example, movable members 2714A-B may be plate or other similarly flat or planar structures having a relatively large surface area. For example, similar to movable members 2214A-B, movable members 2714A-B may have a rectangular shape and may be attached to opposite sides of opening 120 at one end or side by anchors or fasteners 2730, then extend to a center of opening 120 at the other end or side. Each of movable members 2214A-B and 2714A-B may be separated from one another by slits 2207, 2702 around at least three sides of each member. The opening and/or closing of members 2214A-B and 2714A-B may be driven in parallel or separately controlled by the application of a voltage to give a variable impedance and/or resistance control as previously discussed. For example, in some aspects, the application of an electric voltage may be used to open one or more of members 2214A-B and 2714A-B, and termination of the voltage results in members 2214A-B and 2714A-B returning to the closed, or resting, state.

Similar to the previously discussed movable members 2214A-B, each of movable members 2714A-B may include an inactive material layer 2702 and an active material layer 2704 that deforms upon application of a voltage. For example, in some aspects, the inactive material layer 2702 may be any one or more of the previously discussed MEMS materials formed into a shape of the movable members 2714A-B using a MEMS processing operation. The active material layer 2704 may be a piezoelectric material that is formed or applied to a portion of the inactive material layer 2702 using a MEMS processing operation. In some aspects, active material layer 2704 may be formed or applied to less than an entire area of the inactive material layer 2702 in a pattern found optimal for deformation of the inactive material layer 2702. Representatively, as previously discussed, in this configuration, active material layer 2704 may cover a relatively small area near the sides 2710, 2712 of members 2714A-B closest to the fixed portion 104. For example, active material layer 2704 may be a rectangular shaped, anchor like structure, that has a length dimension running parallel to the length dimension of members 2714A-B. Active material layer 2704 may further be considered centered about an axis of symmetry or midline of members 2714A-B, similar to the previously discussed arrangement of active material layers 2204 relative to inactive layers 2202 of members 2214A-B. This particular pattern or arrangement of active material layer 2704 relative to inactive material layer 2702 enables maximum deflection at the tips or corners of members 2714A-B and a relatively high displacement of the shorter edges 2718, 2722 defining the width dimension as shown in FIG. 27. In addition, it should be understood that upon application of a voltage, the adjacent movable members 2214A-B and 2714A-B will move in opposite directions as shown to maximize the open area of the valve. For example, movable members 2214A and 2714B will deform or curve out of plane in an upward direction and the adjacent movable members 2214B and 2714A will deform or curve out of plane in a downward direction. The deformation or curving of members 2714A-2714B will be substantially the same as previously discussed in reference to members 2214A-B and shown in FIGS. 24-26. For example, members 2714A-B will have a maximum deflection at the tip while the edge is curled with higher displacement as shown in FIGS. 24-26. It is further noted that although not shown, the cross-section for the non-actuated or resting (closed) position would be flat without any displacement or curl of members 2214A-B and 2714A-B.

Figure 28:
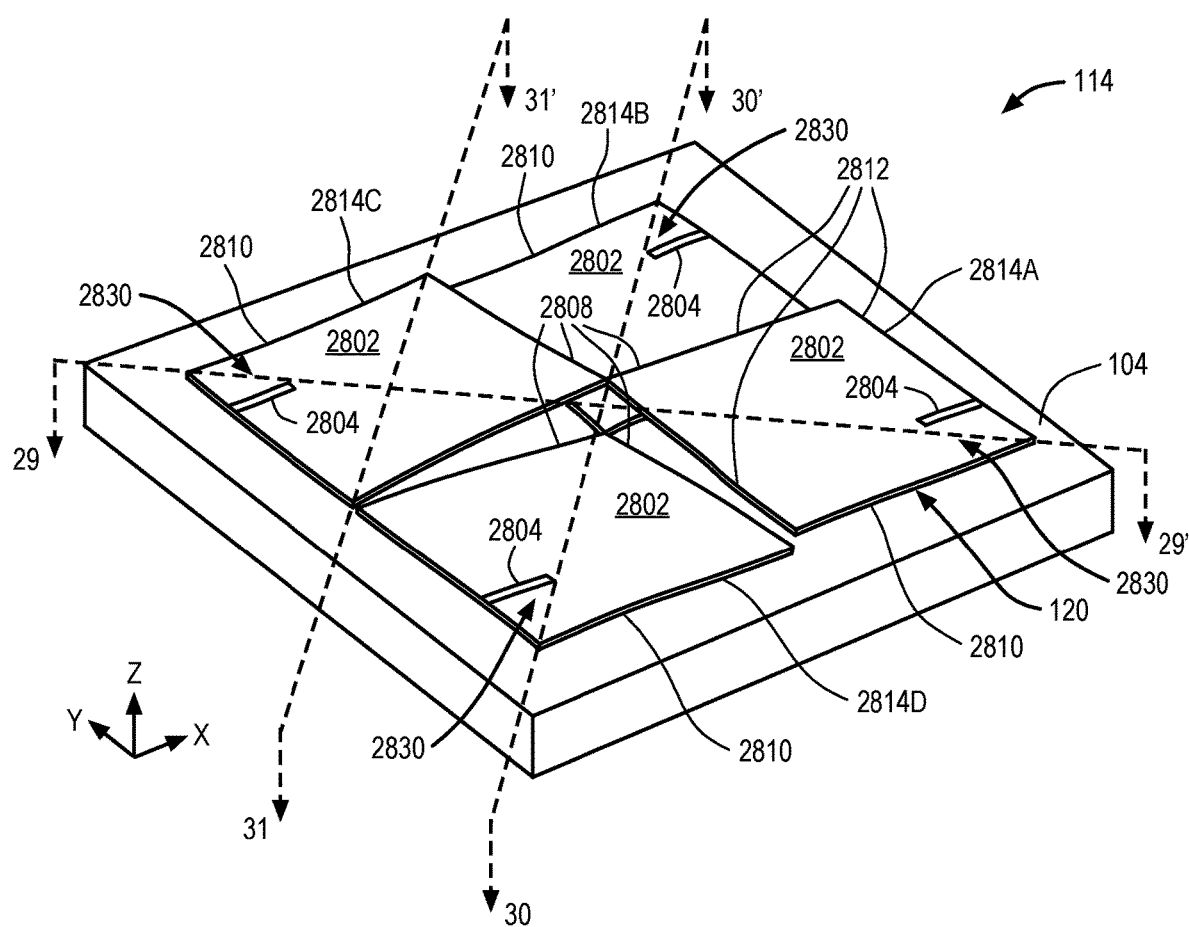
FIG. 28 illustrates a perspective view of one aspect of a valve of the portable electronic device and/or transducer assembly of FIG. 1 in an open position.

FIGS. 28-31 illustrate another representative valve from FIG. 1 having movable members in an actuated or deformed (e.g., open) position. Representatively, FIG. 28 shows valve 114 in the actuated or open position. From these views, it can be seen that similar to FIG. 27, valve 114 includes a number of movable portions or members 2814A, 2814B, 2814C and 2814D in a 2×2 array and positioned over opening 120 to open/close opening 120 as desired. In some aspects, members 2814A-D may be considered plates or other similarly flat or planar structures having a relatively large surface area. For example, movable members 2814A-D may be plates that have one side 2810 connected at its end or corner by an anchor or fastener 2830 to an edge of fixed portion 104 defining one side of opening 120, and then the three remaining sides 2812 extend over and cover opening 120. In this configuration, however, each of movable members 2814A-D may have four sides and be in the shape of squares that are separated from one another by slits 2808. The opening 120 may have a polygon shape, for example a square shape, such that when movable members 2814A-D extend across opening 120, their edges or sides 2812 meet at slits 2808 and cover opening 120. In some aspects, movable members 2814A-D and slits 2808 may be considered laterally arranged or orientated in that they extend from one side to the other side of opening 120. It should be understood, however, that while a polygon shaped opening 120 and/or square members 2814A-D are shown, other shapes and sizes of openings 120 and/or members 2814A-BD suitable for covering the opening 120 as disclosed herein are contemplated (e.g., triangular, rectangular, circular, etc.). The opening and/or closing of members 2814A-D may be driven in parallel or separately controlled by the application of a voltage to give a variable impedance and/or resistance control as previously discussed. For example, in some aspects, the application of an electric voltage may be used to open one or more of members 2814A-D and termination of the voltage results in members 2814A-D returning to the closed, or resting, state.

Similar to the previously discussed configurations, each of movable members 2814A-D may include an inactive material layer 2802 and an active material layer 2804 that deforms upon application of a voltage. For example, in some aspects, the inactive material layer 2802 may be any one or more of the previously discussed MEMS materials formed into a shape of the movable members 2814A-D using a MEMS processing operation. The active material layer 2804 may be a piezoelectric material that is formed or applied to a portion of the inactive material layer 2802 using a MEMS processing operation. In some aspects, active material layer 2804 may be formed or applied to less than an entire area of the inactive material layer 2802 in a pattern found optimal for deformation of the inactive material layer 2802. Representatively, in this configuration, active material layer 2804 may cover a relatively small area near a corner formed by side 2810 and the outer side 2812 of members 2814A-D closest to the fixed portion 104. For example, active material layer 2804 may be a rectangular shaped, anchor like structure, that has one end next to the outer side 2812 nearest fixed member 104 and that extends toward the opposite side 2812 such that the length dimension runs parallel to the side 2810 of members 2814A-D. This particular pattern or arrangement of active material layer 2804 relative to inactive material layer 2802 enables maximum deflection at the tips or corners of members 2814A-D and while the edge 2812 is curled with higher displacement upon application of the voltage. In addition, as previously discussed, adjacent movable members 2814A-D may deform or move in opposite directions to maximize the valve open area at slits 2808.

Figure 29:
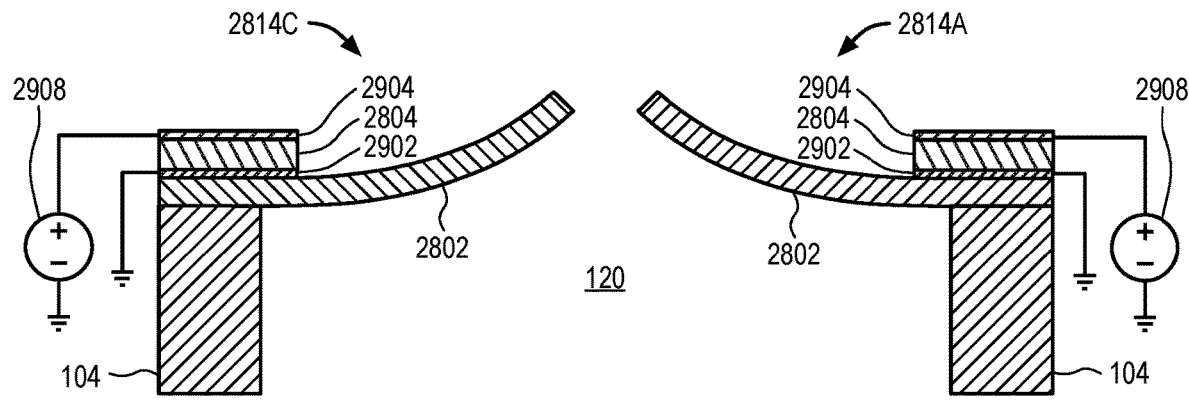
FIG. 29 illustrates a cross-sectional side view along line 28-28' of one aspect of a valve of a portable electronic device and/or transducer assembly of FIG. 28.
Figure 30:
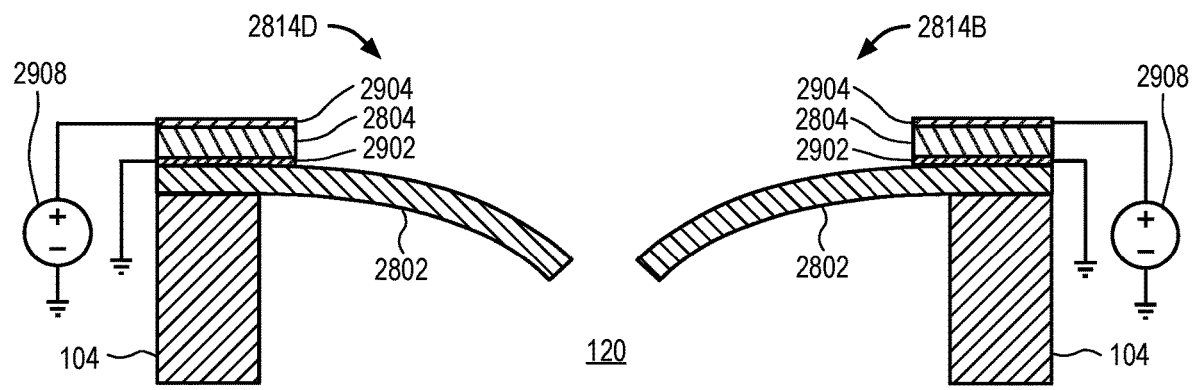
FIG. 30 illustrates a cross-sectional side view along line 30-30' of one aspect of a valve of a portable electronic device and/or transducer assembly of FIG. 28.
Figure 31:
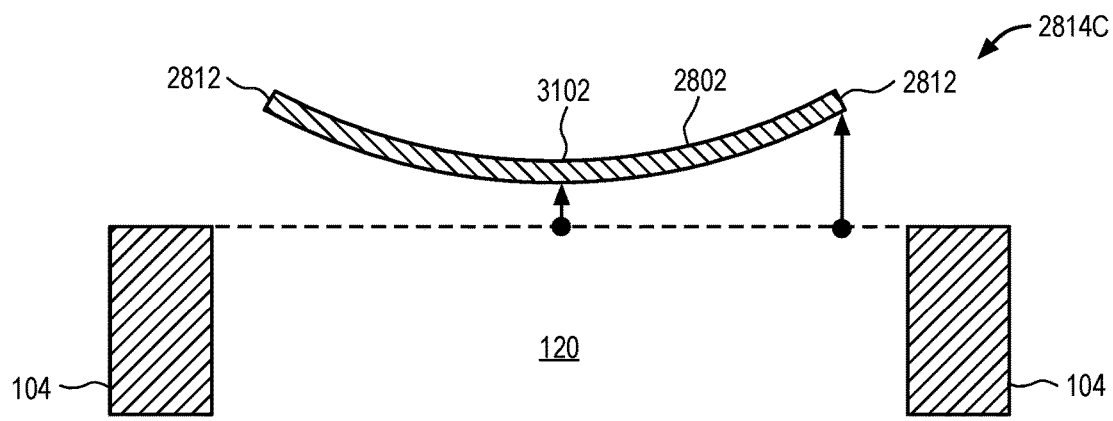
FIG. 31 illustrates a cross-sectional side view along line 31-31' of one aspect of a valve of a portable electronic device and/or transducer assembly of FIG. 28.

For example, FIGS. 29-31 illustrate movable members moving in opposite directions upon application of a voltage. Representatively, FIG. 29 is a cross-sectional side view along line 29-29' through members 2814A and 2814C of FIG. 28, FIG. 30 is a cross-sectional side view along line 30-30' through members 2814B and 2814D of FIG. 28, and FIG. 31 is a cross-sectional side view along line 30-30' through member 2814C of FIG. 28. Representatively, as can be seen from FIGS. 29-30, upon application of a voltage 2908, movable members 2814A and 2814C deform out of plane in an upward direction while movable member 2814B and 2814D deform out of plane in a downward direction. For example, as can be seen from FIG. 31, movable member 2814C curves out of plane in an upward direction such that sides 2812 are farther out of plane than the center 3102 of member 2814C as shown by the arrows. As can be seen from FIGS. 29-30, the deformation of members 2814A-D in this manner maximizes the open area of slit 2808 between the free sides or ends 2812.

In addition, as can be seen from FIGS. 29-30, the particular stack up and pattern of the inactive and active material layers 2802, 2804 is similar to the previously discussed configurations. For example, the enclosure (or fixed portion) 104 may be a substrate material formed to have opening 120 using MEMS processing techniques as previously discussed. Movable members 2814A-D may include a stack-up of the inactive material layer 2802, bottom conductive or electrode layer 2902, active layer 2804 and top conductive or electrode layer 2904. In addition, although not shown, in some aspects, an optional seed layer for achieving good piezoelectric crystalline structure during the deposition process may be formed between inactive material layer 2802 and bottom electrode layer 2902. Inactive material layer 2802 may be formed at one end on portion 104 and extend toward the other side of opening 120 as shown. The inactive material layer 2802 may be considered as defining, occupying, or otherwise extending, the entire are (e.g., length and width dimensions) of the movable member 2814A-D. The inactive material layer 2802 may be a layer with some elasticity and which is made of any of the previously discussed MEMS materials. The active material layer 2804 and the bottom or top conductive or electrode layers 2902, 2904 may cover only a portion of inactive material layer 2802 and be made of any of the previously discussed conductive MEMS materials using MEMS processing techniques. For example, active material layer 2804 and electrode layers 2902, 2904 may cover or otherwise occupy less than an entire width dimension of movable member 2814A-D as shown. For example, as previously discussed, active material layer 2804 may be applied in a pattern, shape or arrangement that optimizes a displacement of inactive material layer 2802.

Similar to the previously discussed configurations, to actuate movable members 2814A-D, an input driving voltage 2908 may be applied to the bottom or top conductive or electrode layers 2902, 2904. Representatively, in one aspect, a voltage (e.g., +10V or −10V) may be applied to the top electrode layer 2904 or bottom electrode layer 2902 of members 2814A-D, and the other electrode layer may be ground (e.g., 0V). The application of the voltage to members 2814A-D causes active layer 2804 to deform to an out of plane configuration or position. This deformation of active layer 2804, in turn, causes the inactive layer 2802 attached to the active layer 2804 to also deform (e.g., curve or bend) to an out of plane configuration (e.g., above or below the resting plane of members 2814A-D) depending on the voltage applied. In some aspects, the applied voltage may be controlled or otherwise selected so that adjacent movable members 2814A-D move or deform in opposite directions thereby optimizing the open area of the valve 114 in the open position.

Figure 32:
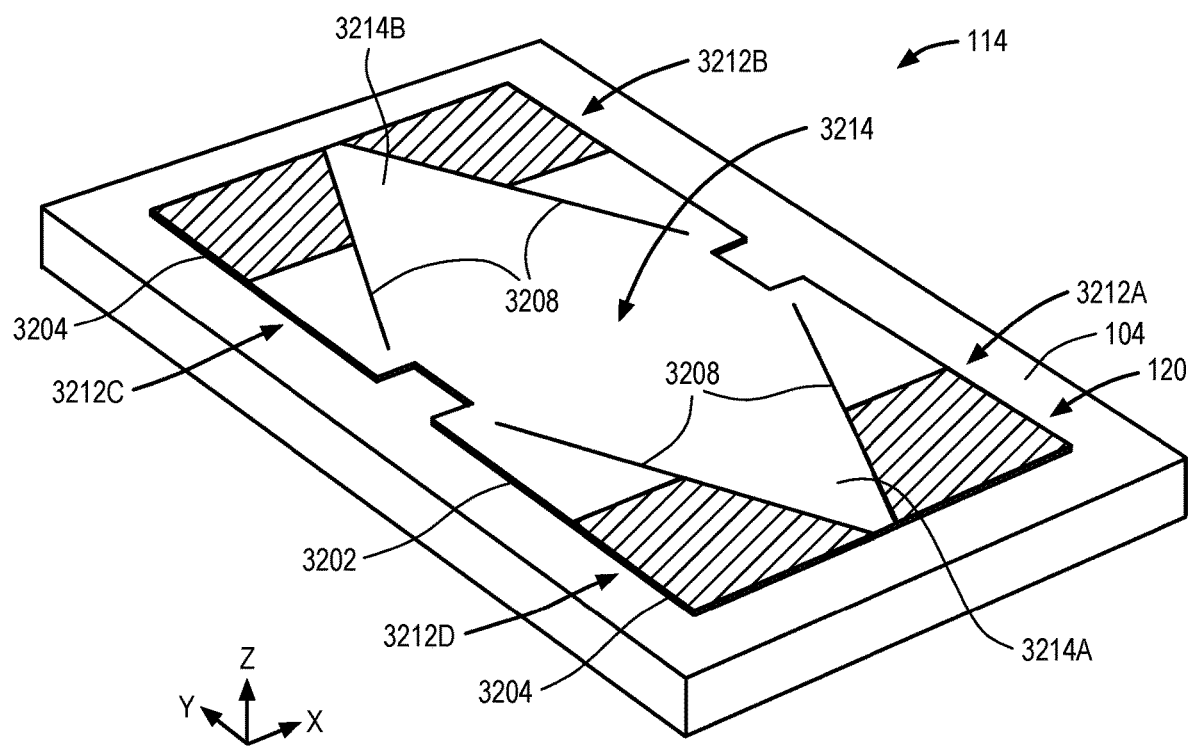
FIG. 32 illustrates a perspective view of one aspect of a valve of the portable electronic device and/or transducer assembly of FIG. 1 in a closed position.

FIGS. 32-35 illustrate another representative valve from FIG. 1 having movable members in a non-actuated or undeformed (e.g., closed) position or an actuated or deformed (e.g., open) position. Representatively, FIG. 32 shows valve 114 in the non-actuated or undeformed (e.g., closed) position. In this configuration, valve 114 includes a movable member formed by a rotational plate 3214 connected to a number of anchors 3212A, 3212B, 3212C and 3212D. For example, rotational plate 3214 may be a diamond shaped plate having a first rotating end 3214A and a second rotating end 3214B. The first rotating end 3214A and second rotating end 3214B may be triangular shaped and meet at their base to form the overall diamond shaped plate 3214. The plate 3214 may be connected along its center portion to anchors 3212A-D. In some aspects, anchors 3212A-D may be tapered to match the shape of the diamond shaped plate 3214 and connected to the fixed portion 102 defining opening 120 so that plate 3214 is positioned over opening 120. Plate 3214 may be separated from anchors 3212A-D by slits 3208. In some aspects, plate 3214 and anchors 3212A-D may be formed from a same material or otherwise as one integrally formed unit or structure. The plate 3214 may be rotated relative to anchors 3212A-D and opening 120 to open or close the valve 114. For example, in some aspects, the application of an electric voltage may be used to rotate plate 3214 in one direction and termination of the voltage results in the rotation of plate 3214 in another direction to open and close the valve.

To allow for such actuation using a voltage, similar to the previously discussed configurations, plate 3214 and/or anchors 3212A-D may include an inactive material layer 3202 and an active material layer 3204 that deforms upon application of a voltage. For example, in some aspects, the inactive material layer 3202 may be any one or more of the previously discussed MEMS materials formed into a shape of the plate 3214 and anchors 3212A-D using a MEMS processing operation. The active material layer 3204 may be a piezoelectric material that is formed or applied to a portion of the inactive material layer 3202 using a MEMS processing operation. In some aspects, active material layer 3204 may be formed or applied to less than an entire area of the inactive material layer 3202 in a pattern found optimal for deformation of the inactive material layer 3202. Representatively, in this configuration, active material layer 3204 may cover portions of the anchors 3212A-B coupled to the fixed portion 104 as shown. This particular pattern or arrangement of active material layer 3204 relative to inactive material layer 3202 enables maximum rotation of plate 3214 upon application of the voltage. In addition, this pattern or configuration may allow first rotating end 3214A and second rotating end 3214B deform or move in opposite directions to maximize the valve open area at slits 3208. It should further be understood that although not shown, the stack up of the material layers forming the movable member may be the same as previously discussed. For example, the inactive material layer 3202 may be formed or otherwise coupled to fixed portion 102, a bottom conductive or electrode layer is formed on inactive material layer 3202, the active material layer 3204 is then formed on the electrode layer followed by a top electrode layer formed on top of the active material layer 3204. In this aspect, an application of a voltage to one or more of the electrode layers causes the active material layer 3204 to deform, which in turn deforms the inactive material layer 3202 and causes a rotation of plate 3214.

Figure 33:
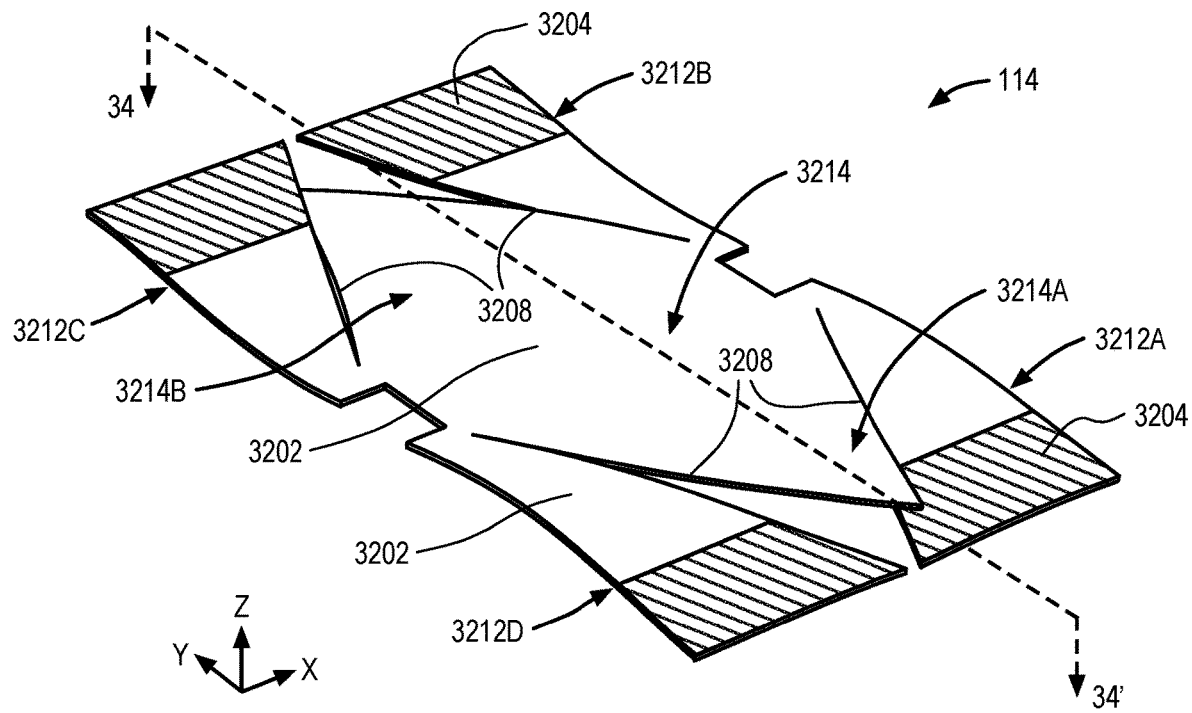
FIG. 33 illustrates a perspective view of one aspect of a valve of the portable electronic device and/or transducer assembly of FIG. 32 in an open position.
Figure 34:
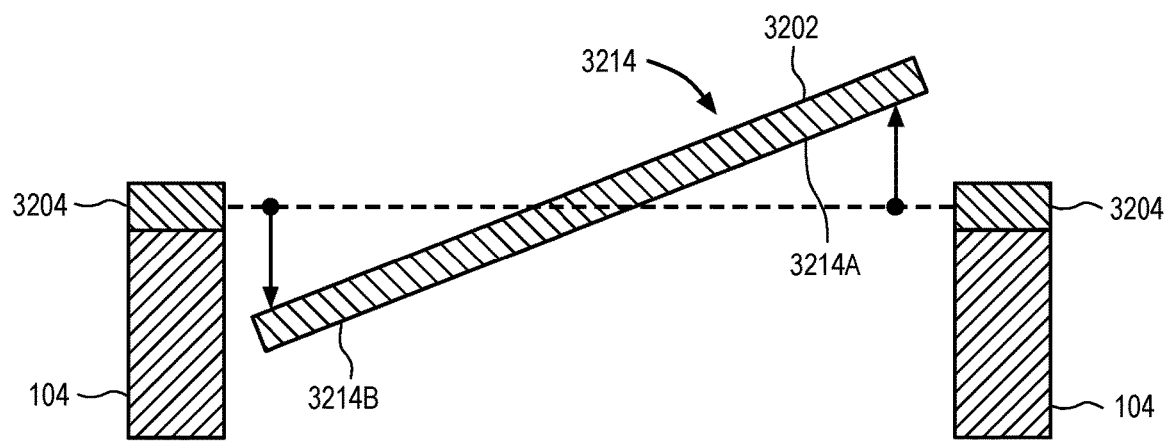
FIG. 34 illustrates a cross-sectional side view along line 34-34' of one aspect of a valve of a portable electronic device and/or transducer assembly of FIG. 32.

For example, FIGS. 33-34 illustrate a rotation of plate 3214 to open the valve upon application of a voltage. Representatively, as can be seen from FIG. 33, and the cross-sectional along line 34-34' shown in FIG. 34, upon application of a voltage, anchors 3212A-D deform or curve upward or downward, which in turn causes plate 3214 to move or rotate such that end 3214A moves out of plane in an upward direction while end 3214B deforms out of plane in a downward direction. For example, as can be seen from FIGS. 33-34, anchors 3212A and 3212D curve or deform upward causing plate 3214 to rotate such that end 3214A moves out of plane in an upward direction. In addition, anchors 3212B and 3212C curves out of plane in a downward direction causing plate 3214 to rotate such that end 3214B moves out of plane in a downward direction. As can be seen from FIGS. 33-34, the deformation of plate 3214 and anchors 3212A-D in this manner maximizes the open area of slit 3208.

Figure 35:
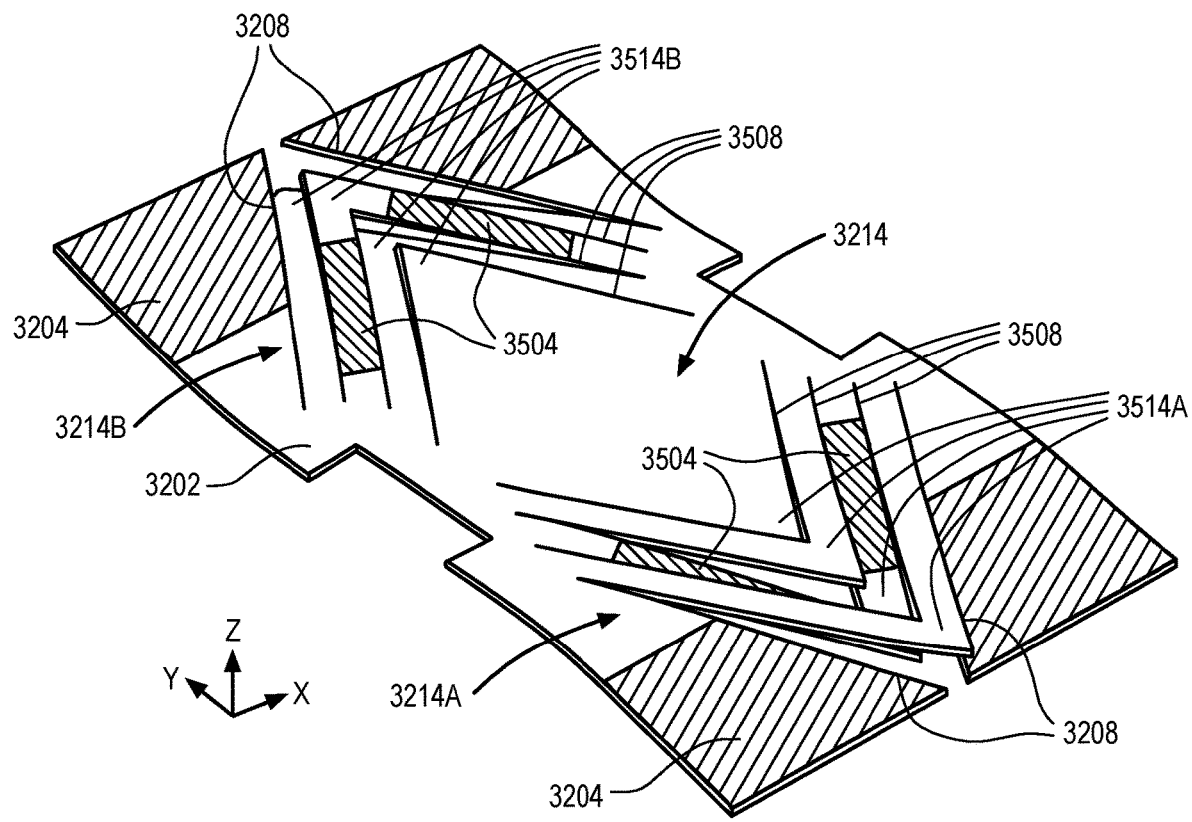
FIG. 35 illustrates a perspective view of one aspect of a valve of the portable electronic device and/or transducer assembly of FIG. 1 in an open position.

In addition, in some aspects, to further maximize the open area of the valve 114, additional slits 3508 and active material layers 3504 may be included in the ends 3214A-B as shown in FIG. 35. For example, in some aspects, three additional v-shaped slits 3508 having a same shape as slits 3208 may be formed in end 3214A of plate 3214. Similarly, three additional v-shaped slits 3508 having a same shape as slits 3208 may be formed in the end 3214B of plate 3214. In addition, active material layers 3504 may be formed on portions of the inactive material layer 3202 between the slits 3508 as shown in FIG. 35. In this aspect, upon application of a voltage, the v-shaped structures 3514A and 3514B formed between slits 3508 at each end will separate from one another thus further maximizing the open area of the slits 3208, 3508. For example, in some aspects, a positive voltage may be applied to the active material layer 3504 of structures 3514A and a negative voltage may be applied to the active material layer 3504 of structures 3514B to drive structures 3514A-B out of plane in different directions.

Figure 36:
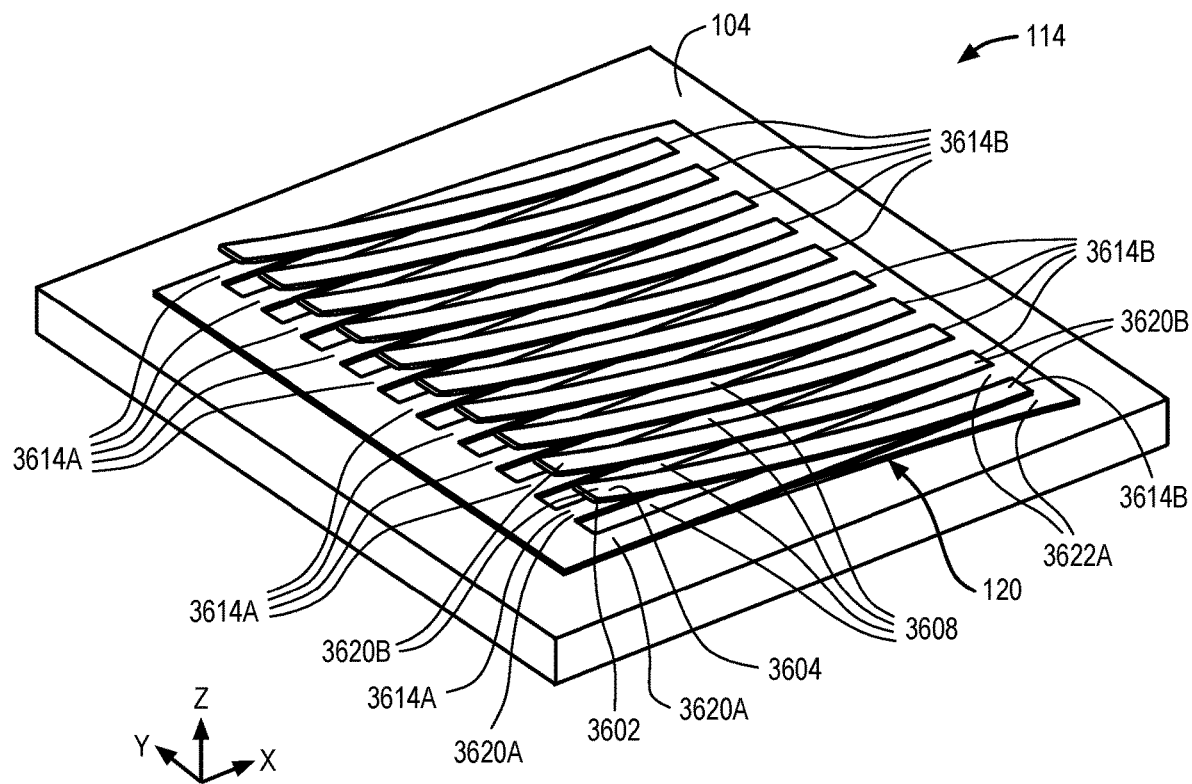
FIG. 36 illustrates a perspective view of one aspect of a valve of the portable electronic device and/or transducer assembly of FIG. 1 in an open position.
Figure 37:
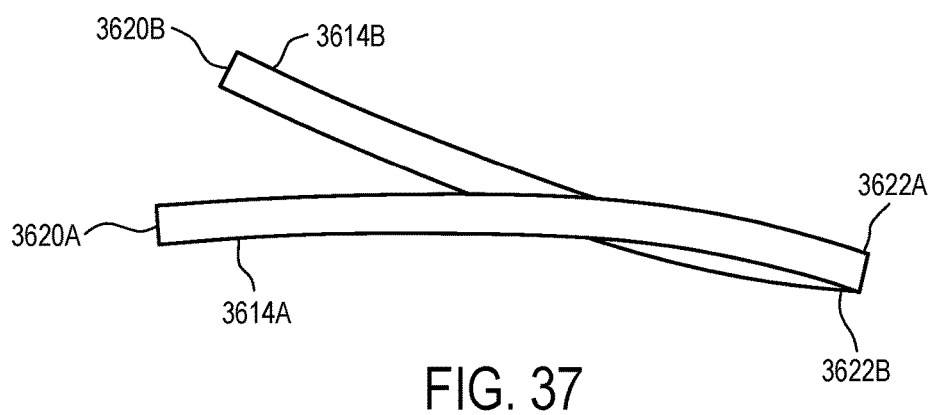
FIG. 37 illustrates a magnified perspective view of one aspect of a valve of the portable electronic device and/or transducer assembly of FIG. 36 in an open position.

FIGS. 36-37 illustrate another representative valve from FIG. 1 having movable members in an actuated or deformed (e.g., open) position. Representatively, FIG. 36 shows valve 114 in the actuated or open position. From these views, it can be seen that valve 114 includes a number of movable portions or members 3614A and 3614B that are positioned over opening 120 to open/close opening 120 as desired. In some aspects, members 3614A and 3614 B may be considered sets of interdigital flaps or cantilevers. For example, movable members 3614A may be considered a first set made up of eleven movable members extending from one side of opening 120 and movable members 3614B may be considered a second set made up of ten movable members extending from the other side of opening 120. Each of the movable members making up the set of movable members 3614A may interleave or alternative with each of the movable members making up the set of movable members 3614B. For example, each of movable members 3614A-B may be elongated rectangular or finger-like processes that are separated from one another by slits 3608. Similar to the movable members previously discussed in reference to FIG. 18, movable members 3614A and 3614B may extend across opening 120 and each have a first end 3620A-B and a second end 3622A-B, respectively. In this configuration, however, the first ends 3620A-B and the second ends 3622A-B are connected to the fixed portion 102 and/or each other to form a zig-zag like cantilever configuration as shown in FIG. 37. Representatively, first end 3620A of member 3614A may be considered an anchored end that is attached to fixed portion 102 at one side of opening 120. The second end 3622A of member 3614A extends to the other side of opening 120 and connects to the fixed portion 102. In addition, second end 3622A may connect to the second end 3622B of member 3614B. The second end 3622B of member 3614B is therefore connected to the second end 3622A of member 3614A and the fixed portion 102 forming the other side of opening 120. Member 3614B then extends across the opening 120 and the first end 3620B is a free or movable end that is not connected to either the fixed portion 102 or member 3614A such that it is free to move. Thus, it can be seen from FIG. 36 and FIG. 37, when members 3614A-B are actuated by a voltage, the deform in a zig-zag or scissor like configuration that increases the open area at slits 3608. Although only two of members 3614A and 3614B are described, it should be understood that all of the members 3614A and 3614B are connected in a similar zig-zag or scissor like arrangement such that they are actuated and separated upon application of a voltage, as shown in FIG. 36. For example, in some aspects, every pair or two adjacent members 3614A and 3614B are connected in the zig-zag or scissor like configuration shown in FIG. 37.

The opening and/or closing of members 3614A-B may be driven in parallel or separately controlled by the application of a voltage to give a variable impedance and/or resistance control as previously discussed. For example, in some aspects, the application of an electric voltage may be used to open one or more of members 3614A-B and termination of the voltage results in members 3614A-B returning to the closed, or resting, state. Similar to the previously discussed configurations, each of movable members 3614A-B may include an inactive material layer 3602 and an active material layer 3604 that deforms upon application of a voltage. For example, in some aspects, the inactive material layer 3602 may be any one or more of the previously discussed MEMS materials formed into a shape of the movable members 3614A-B using a MEMS processing operation. The active material layer 3604 may be a piezoelectric material that is formed or applied to the inactive material layer 3602 using a MEMS processing operation. In some aspects, both inactive material layer 3602 and active material layer 3604 may extend along the entire length dimension of members 3614A-B. The particular stack up and pattern of the inactive and active material layers 3602, 3604 is similar to the previously discussed configurations. For example, members 3614A-B may be formed by a stack up of inactive material layer 3602, a bottom conductive or electrode layer, an active material layer 3604, and a top conductive or electrode layer (see e.g., FIG. 20). The application of a voltage causes adjacent movable members 3614A-B to move or deform out of plane, for example, in opposite directions to increase the open area between members 3614A-B. For example, movable members 3614A may curve out of plane in an upward direction so that the ends 3620A, 3622A move in a somewhat downward direction (relative to the center of member 3614A). The adjacent movable members 3614B may curve out of plane downward so the ends 3620B, 3622B move in a somewhat upward direction (relative to the center of member 3614B).

To actuate movable members 3614A-B, an input driving voltage may be applied to the bottom or top conductive or electrode layers of each of members 3614A-B. Representatively, in one aspect, to deform or move members 3614A, a voltage (e.g., +10V) may be applied to the top or bottom electrode layer of members 3614A, and the other electrode layer may be ground (e.g., 0V). In addition, to deform or move members 3614B, a voltage (e.g., −10V) may be applied to the top or bottom electrode layer of members 3614B, and the other electrode layer may be ground (e.g., 0V). In some aspects, an opposite voltage may be applied to members 3614A (e.g., a positive voltage) than to members 3614B (e.g., a negative voltage) to deform or move them out of plane in opposite directions thereby optimizing the open area of the valve 114 in the open position. It should further be understood that although not shown, when the voltage is not applied, members 3614A-B may return to a non-actuated or resting (e.g., closed) position or configuration in which they are all relatively in plane with each other and the fixed portion 102 such that opening 120 and/or valve 114 is considered closed.

Figure 38:
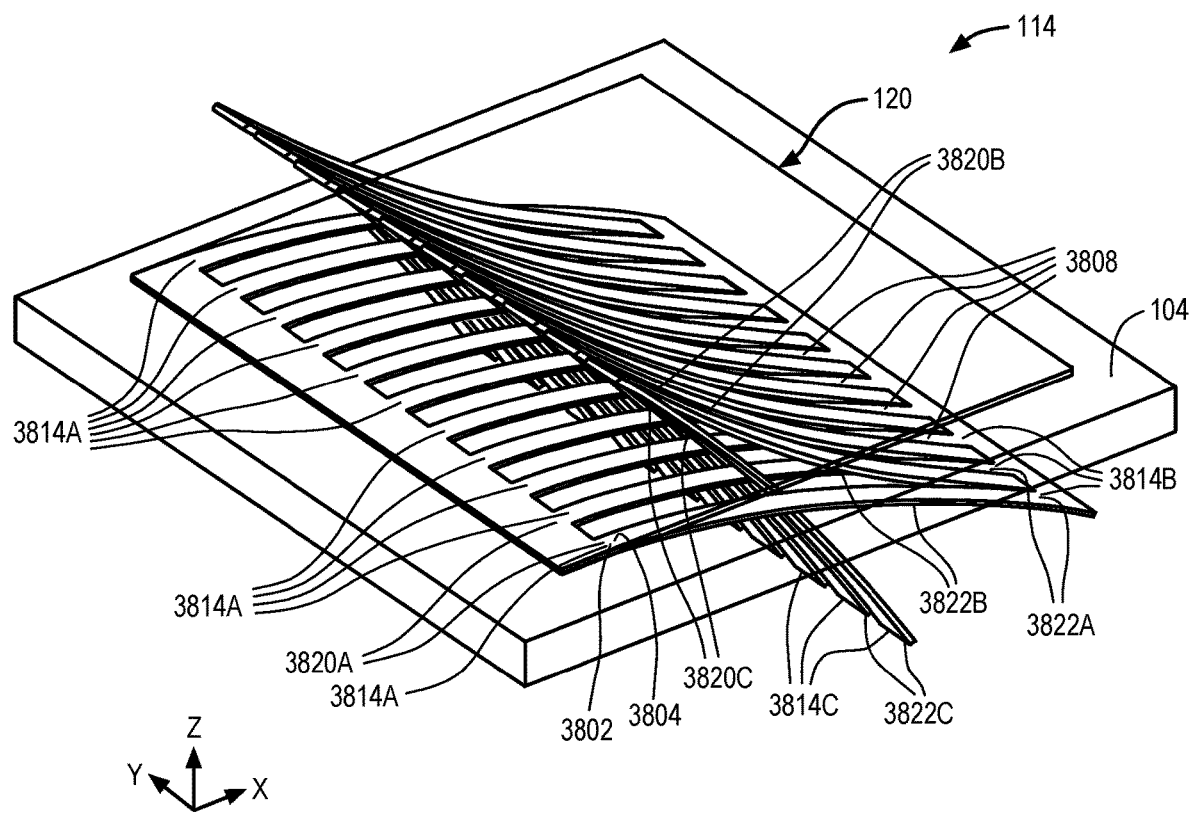
FIG. 38 illustrates a perspective view of one aspect of a valve of the portable electronic device and/or transducer assembly of FIG. 1 in an open position.
Figure 39:
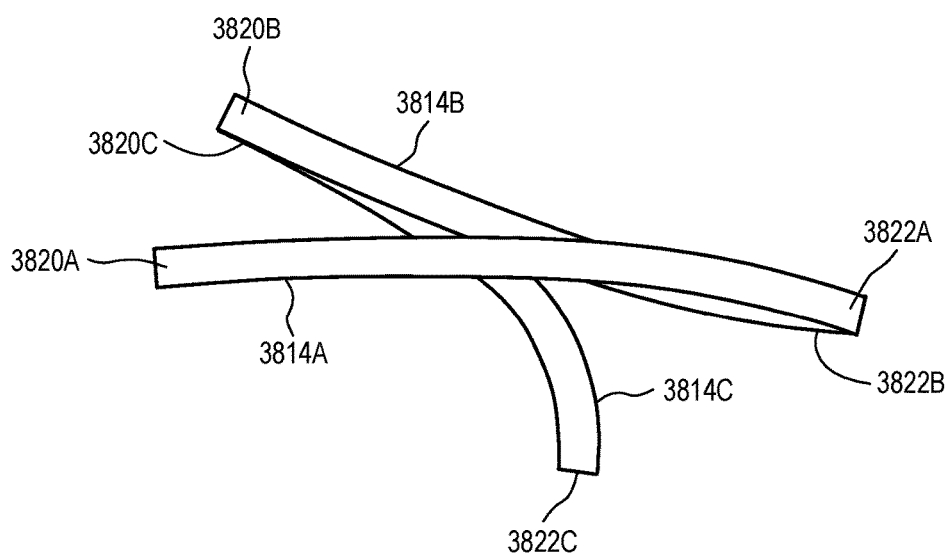
FIG. 39 illustrates a magnified perspective view of one aspect of a valve of the portable electronic device and/or transducer assembly of FIG. 38 in an open position.

FIGS. 38-39 illustrate another representative valve from FIG. 1 having movable members in an actuated or deformed (e.g., open) position. Representatively, FIG. 38 shows valve 114 in the actuated or open position. From these views, it can be seen that valve 114 includes a number of movable portions or members 3814A, 3814B and 3814C that are positioned over opening 120 to open/close opening 120 as desired. In some aspects, members 3814A, 3814B and 3814C may be considered sets of interdigital flaps or cantilevers. For example, movable members 3814A may be considered a first set made up of a number of movable members extending across opening 120, movable members 3814B may be considered a second set made up of a number of movable members extending across opening 120, and movable members 3814C may be considered a third set made up of a number of movable members extending across opening 120. Each of the movable members making up the sets of movable members 3814A, 3814B and 3814C may interleave or alternative with other movable members. For example, each of movable members 3814A-C may be elongated rectangular or finger-like processes that are separated from one another by slits 3808. Similar to the movable members previously discussed in reference to FIG. 36, movable members 3814A, 3814B and 3814C may extend across opening 120 and each have a first end 3820A-C and a second end 3822A-C, respectively. In this configuration, however, every three movable members making up the movable members 3814A-C may be connected to one another. For example, the first ends 3820A-C and the second ends 3822A-C are connected to the fixed portion 102 and/or each other to form a zig-zag like cantilever configuration made up of three members as shown in FIG. 39. Representatively, first end 3820A of member 3814A may be considered an anchored end that is attached to fixed portion 102 at one side of opening 120. The second end 3822A of member 3814A extends to the other side of opening 120 and connects to the second end 3822B of member 3814B. Member 3814B then extends across the opening 120 to the first end 3820B which connects to the first end 3820C of member 3814C. Thus, movable member 3814B is connected at the first end 3820B to movable member 3814C and at the second end 3822B to movable member 3814A. Member 3820C then extends across opening 120 and terminates at the second end 3822C which is a free end not connected to any other movable member or the fixed portion. Thus, it can be seen from FIG. 38 and FIG. 39, when members 3614A-C are actuated by a voltage, the deform in a zig-zag or scissor like configuration that increases the open area at slits 3808. Although only three of members 3814A, 3814B and 3814C are described, it should be understood that all of the members 3814A-C are connected in a similar zig-zag or scissor like arrangement including three movable members such that they are actuated and separated upon application of a voltage, as shown in FIG. 38.

The opening and/or closing of members 3814A-C may be driven in parallel or separately controlled by the application of a voltage to give a variable impedance and/or resistance control as previously discussed. For example, in some aspects, the application of an electric voltage may be used to open one or more of members 3814A-C and termination of the voltage results in members 3814A-C returning to the closed, or resting, state. Similar to the previously discussed configurations, each of movable members 3814A-C may include an inactive material layer 3802 and an active material layer 3804 that deforms upon application of a voltage. For example, in some aspects, the inactive material layer 3802 may be any one or more of the previously discussed MEMS materials formed into a shape of the movable members 3814A-C using a MEMS processing operation. The active material layer 3804 may be a piezoelectric material that is formed or applied to the inactive material layer 3802 using a MEMS processing operation. In some aspects, both inactive material layer 3802 and active material layer 3804 may extend along the entire length dimension of members 3814A-C. The particular stack up and pattern of the inactive and active material layers 3802, 3804 is similar to the previously discussed configurations. For example, members 3814A-C may be formed by a stack up of inactive material layer 3802, a bottom conductive or electrode layer, an active material layer 3804, and a top conductive or electrode layer (see e.g., FIG. 20). The application of a voltage causes adjacent movable members 3814A-C to move or deform out of plane, for example, in opposite directions to increase the open area between members 3814A-C. For example, movable members 3814A may curve out of plane in an upward direction so that the ends 3820A, 3822A move in a somewhat downward direction (relative to the center of member 3814A). The adjacent movable member 3814B may curve out of plane downward so the ends 3820B, 3822B move in a somewhat upward direction (relative to the center of member 3814B). The adjacent movable member 3814C may curve out of plane upward so the ends 3820C, 3822C move in a somewhat downward direction (relative to the center of member 3814C).

To actuate movable members 3814A-C, an input driving voltage may be applied to the bottom or top conductive or electrode layers of each of members 3814A-C. Representatively, in one aspect, to deform or move members 3814A, a voltage (e.g., +10V) may be applied to the top or bottom electrode layer of members 3814A, and the other electrode layer may be ground (e.g., 0V). In addition, to deform or move members 3814B, a voltage (e.g., −10V) may be applied to the top or bottom electrode layer of members 3814B, and the other electrode layer may be ground (e.g., 0V). To deform or move members 3814C, a voltage (e.g., +10V) may be applied to the top or bottom electrode layer of members 3814C, and the other electrode layer may be ground (e.g., 0V). In some aspects, an opposite voltage may be applied to members 3814A and 3814C (e.g., a positive voltage) than to members 3614B (e.g., a negative voltage) to deform or move them out of plane in opposite directions thereby optimizing the open area of the valve 114 in the open position. It should further be understood that although not shown, when the voltage is not applied, members 3814A-C may return to a non-actuated or resting (e.g., closed) position or configuration in which they are all relatively in plane with each other and the fixed portion 102 such that opening 120 and/or valve 114 is considered closed.

Figure 40:
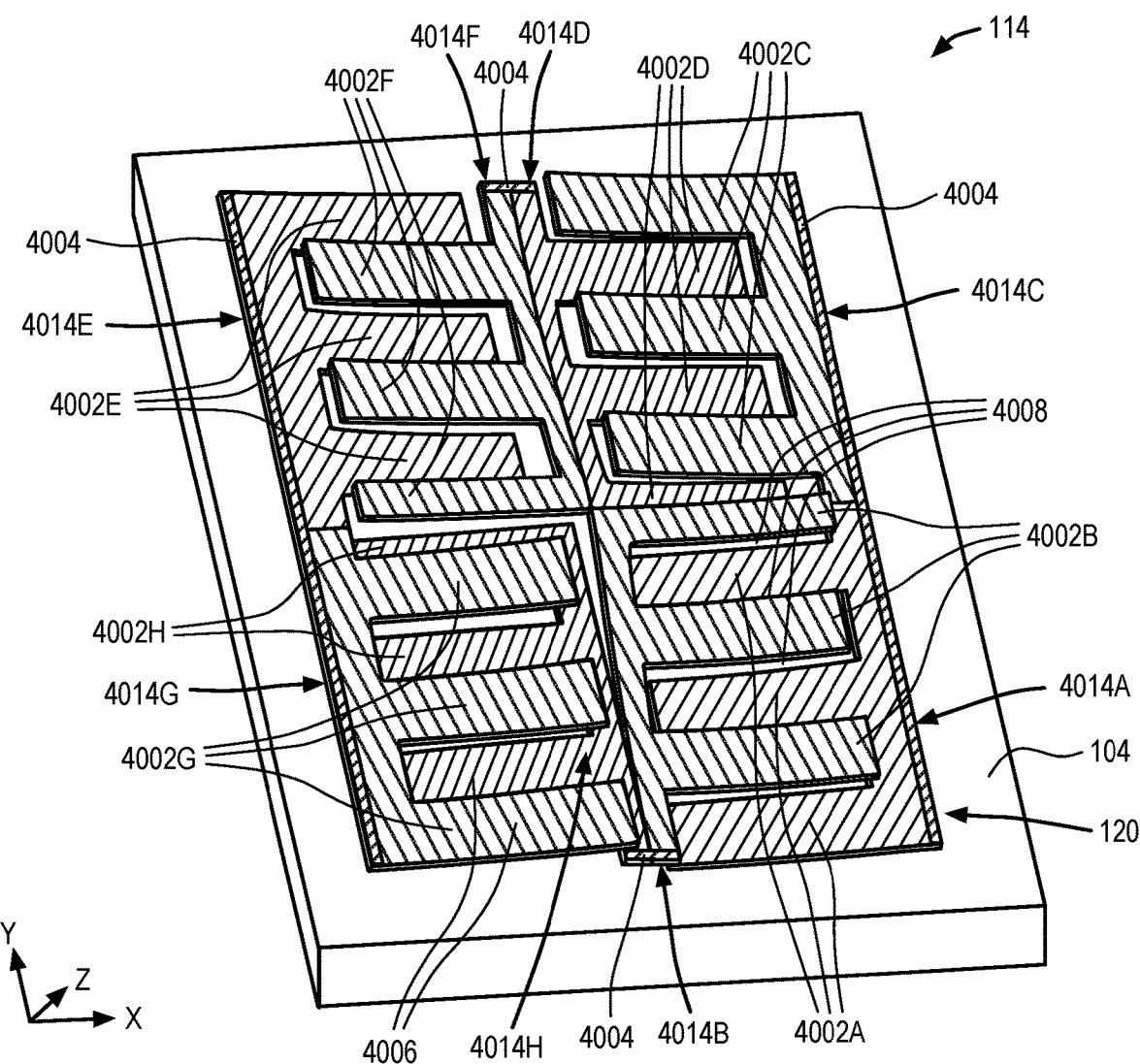
FIG. 40 illustrates a perspective view of one aspect of a valve of the portable electronic device and/or transducer assembly of FIG. 1 in an open position.

FIG. 40 illustrates another representative valve from FIG. 1 having movable members in an actuated or deformed (e.g., open) position. Representatively, FIG. 40 shows valve 114 in the actuated or open position. From these views, it can be seen that valve 114 includes a number of movable portions or members 4014A, 4014B, 4014C, 4014D, 4014E, 4014F, 4014G, 4014H that are positioned over opening 120 to open/close opening 120 as desired. In some aspects, members 4014A, 4014B, 4014C, 4014D, 4014E, 4014F, 4014G, 4014H may be considered sets or units of interdigital flaps or cantilevers. For example, movable member 4014A may be considered a first set or unit made up of a number of movable members 4002A extending across opening 120. Movable members 4014B may be considered a second set or unit made up of a number of movable members 4002B extending across opening 120. Movable members 4014C may be considered a third set or unit made up of a number of movable members 4002C extending across opening 120. Movable members 4014D may be considered a fourth set or unit made up of a number of movable members 4002D extending across opening 120. Movable members 4014E may be considered a fifth set or unit made up of a number of movable members 4002E extending across opening 120. Movable members 4014F may be considered a sixth set or unit made up of a number of movable members 4002F extending across opening 120. Movable members 4014G may be considered a seventh set or unit made up of a number of movable members 4002G extending across opening 120.

Movable members 4014H may be considered a seventh set or unit made up of a number of movable members 4002H extending across opening 120. Each of the movable members 4014A-H may be anchored to the fixed structures 104 by fasteners or attachment members 4004.

Each of the movable members 4002A-H making up the sets of movable members 4014A-H may interleave or alternative with other movable members. For example, each of movable members 4002A-H may be elongated rectangular or finger-like processes that are separated from one another by slits 4008. Similar to the movable members previously discussed in reference to FIG. 36, the movable members 4002A-H making up the sets or units of movable members 4014A-H may extend across opening 120. In this configuration, however, every two adjacent sets or units of movable members 4014A-H may interleave with one another and move in opposite directions when actuated. For example, the movable members 4002A and 4002B of sets of movable members 4014A and 4014B may interleave with one another and move in opposite directions when actuated, as shown. The movable members 4002C and 4002D of sets of movable members 4014C and 4014D may interleave with one another and move in opposite directions when actuated. The movable members 4002E and 4002F of sets of movable members 4014E and 4014F may interleave with one another and move in opposite directions when actuated. The movable members 4002G and 4002H of sets of movable members 4014G and 4014H may interleave with one another and move in opposite directions when actuated. The base portion of the members 4014A-H from which the movable members 4002A-H extend may be connected to the fixed portion 102 as shown.

The opening and/or closing of members 4014A-H may be driven in parallel or separately controlled by the application of a voltage to give a variable impedance and/or resistance control as previously discussed. For example, in some aspects, the application of an electric voltage may be used to open one or more of members 4014A-H and termination of the voltage results in members 4014A-H returning to the closed, or resting, state. Similar to the previously discussed configurations, each of movable members 4014A-H may include an inactive material layer 4006 and an active material layer that deforms upon application of a voltage. For example, in some aspects, the inactive material layer 4006 may be any one or more of the previously discussed MEMS materials formed into a shape of the movable members 4014A-H using a MEMS processing operation. The active material layer may be a piezoelectric material that is formed or applied to the inactive material layer 4006 using a MEMS processing operation. In some aspects, active material layer may have a particular pattern or arrangement found suitable for optimal displacement of members 4014A-H. For example, in some aspects, active material layer may extend along the base portions of members 4014A-H or may extend along more than the base portions of members 401A-H, as discussed in previous configurations. The particular stack up and pattern of the inactive and active material layers is similar to the previously discussed configurations. For example, members 4014A-H may be formed by a stack up of inactive material layer 4006, a bottom conductive or electrode layer, an active material layer, and a top conductive or electrode layer (see e.g., FIG. 20). The application of a voltage causes adjacent movable members 4014A-H to move or deform out of plane, for example, in opposite directions to increase the open area between members 4014A-H. For example, movable members 4014A, 4014D, 4014E and 4014H may curve out of plane in a downward direction. The adjacent movable member 4014B, 4014C, 4014F and 4014G may curve out of plane in an upward direction.

To actuate movable members 4014A-H, an input driving voltage may be applied to the bottom or top conductive or electrode layers of each of members 4014A-H. Representatively, in one aspect, to deform or move members 4014A, 4014D, 4014E and 4014H, a voltage (e.g., −10V) may be applied to the top or bottom electrode layer of members 4014A, 4014D, 4014E and 4014H, and the other electrode layer may be ground (e.g., 0V). In addition, to deform or move members 401B, 4014C, 4014F and 4014G, a voltage (e.g., +10V) may be applied to the top or bottom electrode layer of members 401B, 4014C, 4014F and 4014G, and the other electrode layer may be ground (e.g., 0V). In some aspects, an opposite voltage may be applied to members 4014A, 4014D, 4014E and 4014H (e.g., a negative voltage) than to members 401B, 4014C, 4014F and 4014G (e.g., a positive voltage) to deform or move them out of plane in opposite directions thereby optimizing the open area of the valve 114 in the open position. It should further be understood that although not shown, when the voltage is not applied, members 4014A-H may return to a non-actuated or resting (e.g., closed) position or configuration in which they are all relatively in plane with each other and the fixed portion 102 such that opening 120 and/or valve 114 is considered closed.

Figure 41:
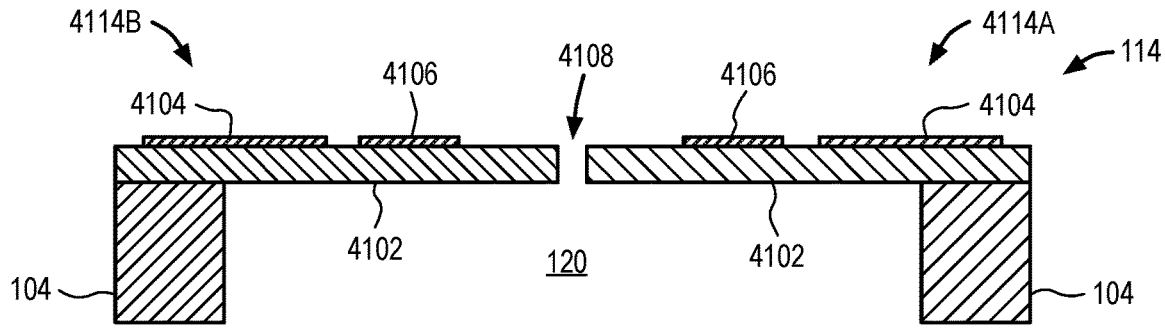
FIG. 41 illustrates a cross-sectional side view of one aspect of a valve of a portable electronic device and/or transducer assembly of FIG. 1.
Figure 42:
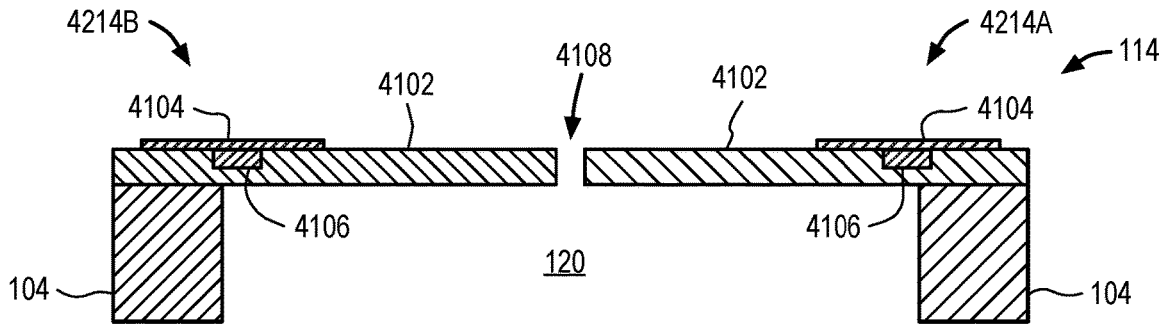
FIG. 42 illustrates a cross-sectional side view of one aspect of a valve of a portable electronic device and/or transducer assembly of FIG. 1.

Referring now to FIGS. 41-48, FIGS. 41-48 illustrate cross-sectional side views of some alternative movable member configurations that may be applied to any of the previously discussed movable members. Representatively, FIG. 41 illustrates valve 114 including movable members 4114A and 4114B which are in a resting or non-actuated position and arranged on opposite sides of opening 120 similar to the previously discussed configurations. In addition, movable members 4114A-B may be attached to fixed portion 102 and formed by a stack up of an inactive material layer 4102 and active material layer 4104 formed from any of the previously discussed MEMS materials using MEMS processing techniques. For example, the stack up forming members 4114A-B may be similar to the previously discussed stack up and include inactive material layer 4102, a bottom conductive or electrode layer, an active material layer 4104, and a top conductive or electrode layer (see e.g., FIG. 20) formed by any of the previously discussed MEMS materials using MEMS processing techniques. The application of a voltage may therefore be used to cause movable members 4114A-B to move or deform out of plane to increase the open area between members 4114A-B as previously discussed. In addition, in this configuration, members 4114A-B may further include a sensor material layer 4106. The sensor material layer 4106 may be a sensing element applied to a top side of inactive material layer 4102 as shown in FIG. 41. In other aspects, as shown in FIG. 42, sensor material layer 4106 may be a sensing element applied or otherwise formed under active material layer 4104 of members 4214A-B, within a recess or groove formed in inactive material layer 4102 as shown in FIG. 42. The sensor material layer 4106 may allow for the valve to have a controlled feedback function. For example, the stability of members 4114A-B or 4214A-B during use is critical. Members 4114A-B or 4214A-B may, however, become unstable if loud sounds start to impinge on them causing them to flutter, which in turn could change the acoustic impedance. Sensor material layer 4106 may be used to detect such instability and provide feedback to, for example a processor associated with the valve, letting the system know that one or more of members 4114A-B or 4214A-B may be subject to an undesirable deformation or otherwise not in the desired or intended position. The system may then be able to compensate for this instability and control and/or modify the applied voltage to achieve the desired valve opening/closing based on the position the members 4114A-B or 4214A-B are actually in. In some aspects, sensor material layer 4106 may be any sensing element suitable for providing the desired feedback sensing, for example, a piezoelectric material, a piezoresistive material, a capacitive sensing mechanism, or the like. In addition, although not shown, it should be understood that sensor material layer 4106 may be implemented in any of the previously discussed valve configurations.

Figure 43A:
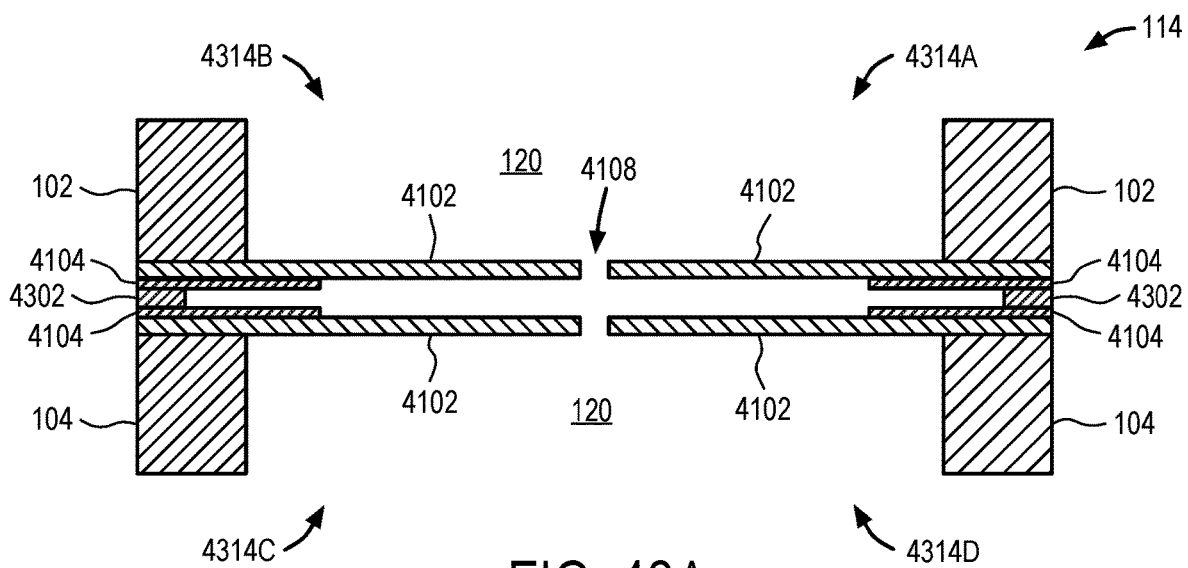
FIG. 43A illustrates a cross-sectional side view of one aspect of a valve of a portable electronic device and/or transducer assembly of FIG. 1.

Referring now to FIG. 43A, FIG. 43A illustrates valve 114 including movable members 4314A, 4314B, 4314C and 4314D in a stacked arrangement. Representatively, movable members 4314A-D are similar to the previously discussed movable members shown in the resting or non-actuated position, except in this configuration member 4314A is stacked on top of member 4314D and member 4314B is stacked on top of member 4314D. For example, member 4314A may be inverted and stacked on top of member 4314D such that the inactive material layers 4102 run parallel to each other and their active material layers 4104 are interfacing one another. Similarly, member 4314B may be inverted and stacked on top of member 4314C such that the inactive material layers 4102 run parallel to each other and their active material layers 4104 are interfacing one another. Each of the top members 4314A and 4314B may be attached to each of the bottom members 4314D and 4314C by an attachment member 4302, formed by bonding, glue or the like. Each of movable members 4314A-D may be attached to fixed portion 102 and formed by a stack up of an inactive material layer 4102 and active material layer 4104 formed from any of the previously discussed MEMS materials using MEMS processing techniques. For example, the stack up forming members 4314A-D may be similar to the previously discussed stack up and include inactive material layer 4302, a bottom conductive or electrode layer, an active material layer 4304, and a top conductive or electrode layer (see e.g., FIG. 20) formed by any of the previously discussed MEMS materials using MEMS processing techniques. The application of a voltage may therefore be used to cause movable members 4314A-D to move or deform out of plane to increase the open area between members 4314A-D as previously discussed. For example, in some aspects, upon application of the voltage, one or more of movable members 4314A-D may move or deform out of plane in the same and/or different directions to maximize the open area.

In addition, an alternative arrangement is further contemplated in which one of the movable members 4314A or 4314B is omitted and one of movable members 4314C or 4314D is omitted such that the top assembly or chip and the bottom assembly or chip do not have an overlapped area in one cross-section as shown. For example, in one aspect, movable member 4314B is omitted from the top assembly and movable member 4314D is omitted from the bottom assembly such that only movable members 4314A and 4314C are included in the top and bottom assemblies, respectively. Upon application of a voltage, movable members 4314A and 4314C will move in opposite out of plane directions to open the valve. For example, movable member 4314A may move out of plane in an upward direction upon application of a voltage (e.g., −10V) and movable member 4314C may move out of plane in a downward direction upon application of a voltage (e.g., +10V). In addition, although not shown, it should be understood that a stacked valve configuration as described in reference to FIG. 43A may be implemented in any of the previously discussed valve configurations.

In addition, in a still further alternative arrangement, the assembly may have a further sensing function suitable for providing the desired feedback sensing as previously discussed in reference to FIGS. 41-42. For example, in some aspects, the assembly may have an integrated capacitive sensor to provide the previously discussed sensing capabilities. For example, in some aspects the top and bottom layer 4102 of the movable members 4314A-D may be electrodes that provide capacitive sensing. Representatively, in one aspect, layer 4102 of member 4314B and layer 4102 of member 4314C may have different sized areas. The top layer 4102 and bottom layer 4102 may be top and bottom electrodes that form a capacitor that senses a deformation and/or position of the members 4314B and 4314C that can then be used for to provide feedback to, for example a processor associated with the valve that one or more of members 4314A-D may be subject to an undesirable deformation or otherwise not in the desired or intended position as previously discussed.

Figure 43B:
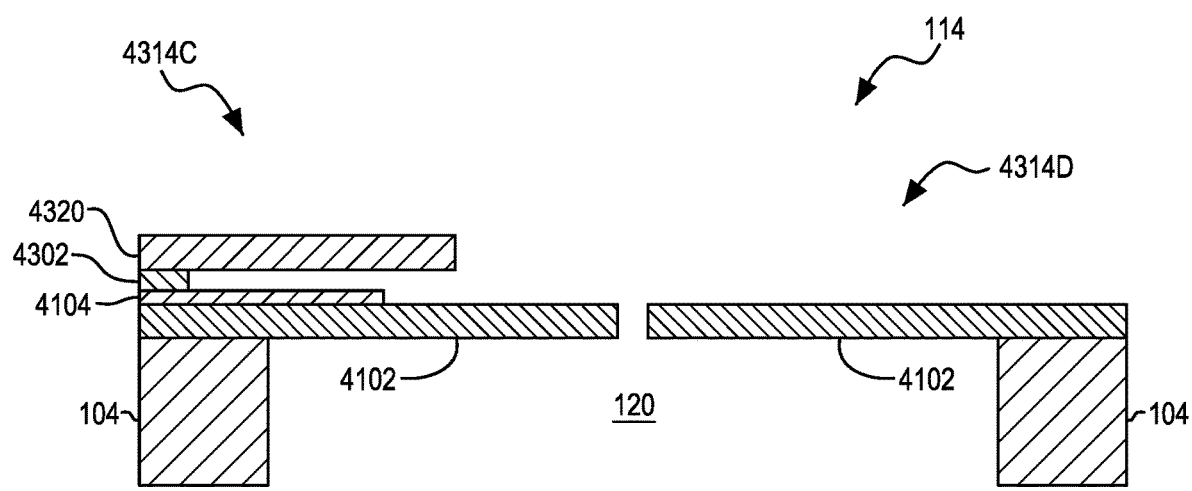
FIG. 43B illustrates a cross-sectional side view of one aspect of a valve of a portable electronic device and/or transducer assembly of FIG. 1.

In addition, in a still further configuration illustrated in FIG. 43B, one or more of the members 4314A-D may include a further conductive member or layer 4320 over the active layer 4104 and inactive layer 4102. The conductive member or layer 4320 may be a conductive layer that runs parallel to the active layer 4104 and inactive layer 4102. The conductive member or layer 4320 may be attached to the member 104 by a spacer, bonding alloy, or adhesive member 4302. In this aspect, the active layer 4104 and the capacitive sensing element 4302 form a capacitor and the gap is determined by the size of the spacer 4302 and/or the attachment distance between the layer 4104 and element 4302.

Figure 44:
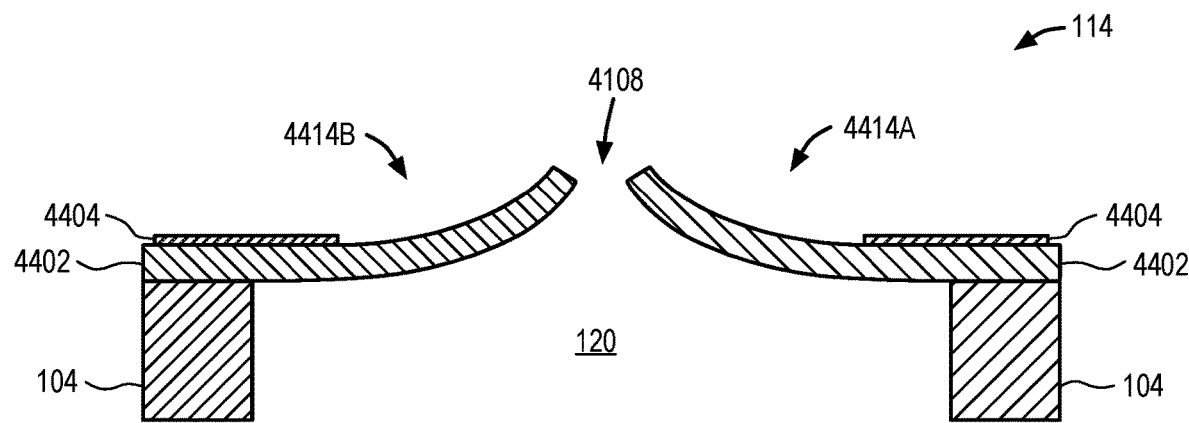
FIG. 44 illustrates a cross-sectional side view of one aspect of a valve of a portable electronic device and/or transducer assembly of FIG. 1 in an open position.
Figure 45:
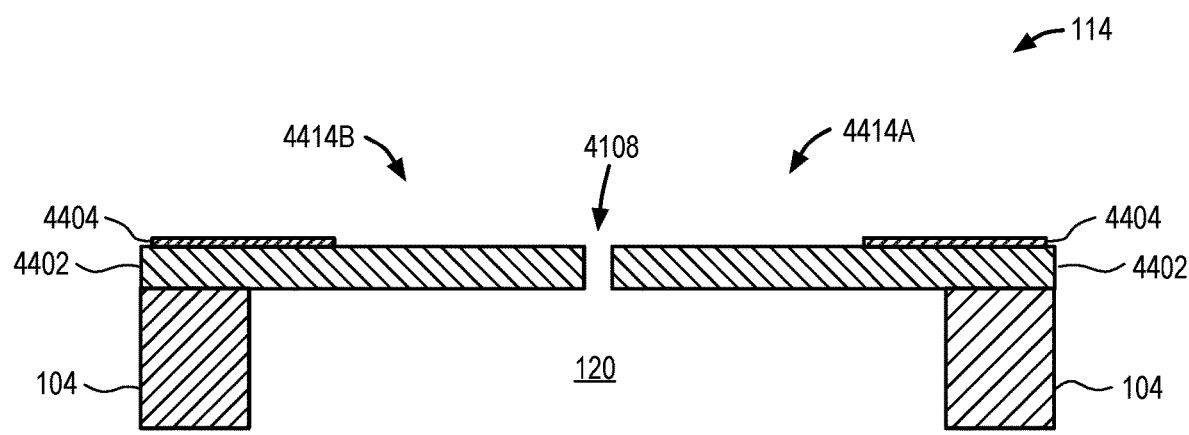
FIG. 45 illustrates a cross-sectional side view of one aspect of a valve of a portable electronic device and/or transducer assembly of FIG. 44 in a closed position.

Referring now to FIGS. 44-45, FIGS. 44-45 illustrate a valve 114 having an open resting state and a closed actuated state. Representatively, in some aspects, piezoelectric materials may have built in anisotropic stresses such that in their resting or default state, they deform out of plane in the absence of any voltage. On the other hand, the application of the voltage causes them to deform to a more planar position. FIGS. 44-45 contemplate using these stresses and the associated natural deformation to form a valve that is open in the non-actuated or resting position and closed when actuated. Representatively, as shown in FIG. 44, in the resting state, members 4414A and 4414B are deformed due to residual stress. On the other hand, in the actuated state shown in FIG. 45, the members 4414A-B return to the in plane position and the valve is closed. Movable members 4414A-B are similar to the previously discussed movable members including the inactive material layers 4402 attached to the fixed portion and the active material layer 4404 attached to the inactive material layer 4402 formed from any of the previously discussed MEMS materials using MEMS processing techniques. In this configuration, however, the residual stress causes an initial deformation of members 4414A-B when the voltage is not applied such that they curve upward and open the valve 114. The application of a voltage may therefore be used to cause movable members 4414A-B to move or deform back to the in plane position shown in FIG. 45, and therefore closing the valve 114. In addition, although not shown, it should be understood that a resting open state and actuated closed state as described in reference to FIGS. 44-45 may be implemented in any of the previously discussed valve configurations. It may further be understood that valve 114 having an open resting state and a closed actuated state, or a closed resting state and an open actuated state, may be selected depending on which mode (ANC or transparency) will be used the majority of the time by the user, so as to reduce power consumption (and increase battery life). For example, if the user wishes to consume zero or negligible power in transparency mode, the user may prefer a normally open design (e.g., zero power consumed in open state, apply voltage to close). On the other hand, if the user wishes to consume zero or negligible power in ANC mode, the user may want a normally closed design (e.g., zero power consumed in closed state, apply voltage to open). In some aspects, where the user may prefer transparency mode for most of their usage, and then switch to ANC in the presence of noise or traveling, the user may generally select a normally open topology.

Figure 46:
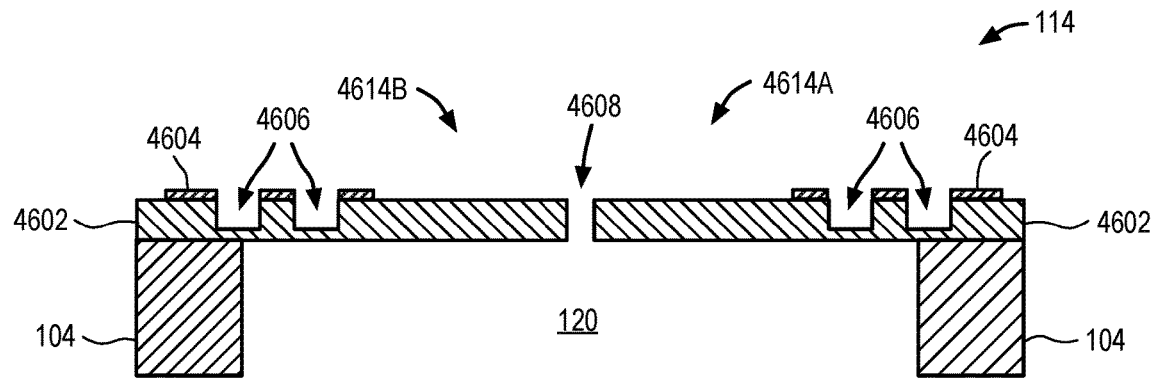
FIG. 46 illustrates a cross-sectional side view of one aspect of a valve of a portable electronic device and/or transducer assembly of FIG. 1.
Figure 47:
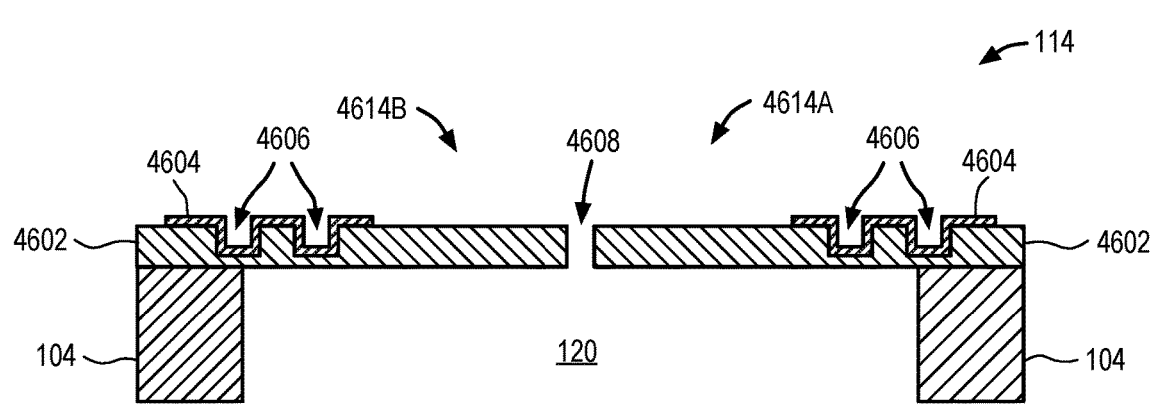
FIG. 47 illustrates a cross-sectional side view of one aspect of a valve of a portable electronic device and/or transducer assembly of FIG. 1.

Referring now to FIGS. 46-47, FIGS. 46-47 illustrate a valve 114 having movable members 4614A and 4614B attached to fixed portion 102 defining opening 120, similar to the previously discussed configurations. For example, movable members 4614A-B may include the inactive material layers 4602 attached to the fixed portion and the active material layer 4604 attached to the inactive material layer 4602 formed from any of the previously discussed MEMS materials using MEMS processing techniques. In this configuration, however, corrugations or grooves 4606 are formed in inactive material layer 4602 as shown to increase the displacement of movable members 4614A-B. Representatively, as shown in FIGS. 46-47, corrugations or grooves 4606 may be recesses formed in the top side of inactive material layer 4602. In some aspects, the active material layer 4604 may then be applied to inactive material layer 4602 between corrugations or grooves 4606 as shown in FIG. 46. In other aspects, the active material layer 4604 may be applied both between and within corrugations or grooves 4606 as shown in FIG. 47. Similar to the previously discussed configurations, the application of a voltage to one or more of the electrodes on both sides of active material layer may be used to cause movable members 4614A-B to move or deform out of plane to increase the open area between members 4614A-B and open the valve 114. It should further be understood that the corrugations or grooves 4606 may be formed in the inactive layers of any of the previously discussed valve configurations to increase displacement of the movable members.

Figure 48:
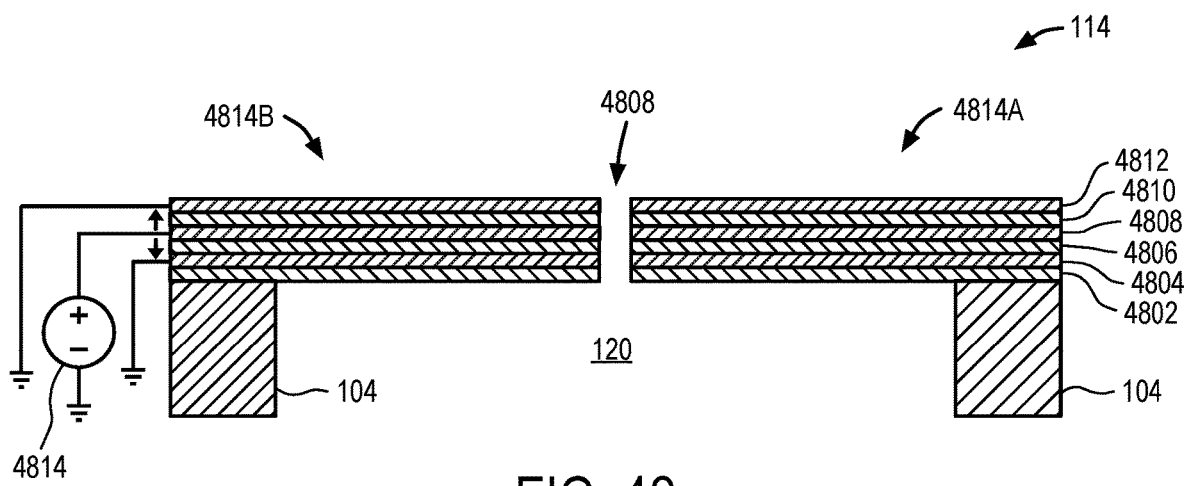
FIG. 48 illustrates a cross-sectional side view of one aspect of a valve of a portable electronic device and/or transducer assembly of FIG. 1.

Referring now to FIG. 48, FIG. 48 illustrates a valve 114 having movable members 4814A and 4814B with a bimorph structure instead of the unimorph structure previously discussed. Representatively, movable members 4814A-B may be similar to the previously discussed movable members except that they may include two active layers to create a bimorph structure. For example, movable members 4814A-B may include a stack up having a seed layer 4802 attached to the fixed portion 102 which defines opening 120. The seed layer 4802 may, for example, be any material suitable for achieving good piezoelectric crystalline structure during the deposition process. For example, in some aspects, seed layer 4802 may be a same material as the active layers. A bottom conductive or electrode layer 4804 may be formed on the seed layer 4802. A first active material layer 4806 may then be formed on the bottom electrode layer 4804 followed by a top electrode layer 4808 formed on top of the first active material layer 4806. A second active material layer 4810 is then formed on the top electrode layer 4808 followed by an additional electrode layer 4812 formed on the second active material layer 4810. The first and second active material layers 4806, 4810 and electrode layers 4804, 4808, 4812 may be made of the same MEMS materials using MEMS processing operations as discussed in reference to the previous unimorph stack up of FIG. 3. In this aspect, the inactive material layer of the unimorph stack up is essentially replaced by an additional piezoelectric layer, and both piezoelectric layers may act as active layers with the top piezoelectric layer having the opposite electrical polarity to the bottom piezoelectric layer.

To deform or otherwise drive the movement of members 4814A-B, a voltage 4814 is applied to at least one of the electrode layers 4804, 4808, 4812. For example, as shown in FIG. 48, in one aspect, the voltage 4814 (e.g., +10V) may be applied to electrode 4808. Both electrodes 4804 and 4812 are then grounded resulting in opposite electrical potentials (see arrows) and deformation of active material layers 4806 and 4810. In other aspects, however, it is contemplated that electrode layer 4808 may be grounded. Instead, a voltage is applied to electrode layers 4804 and 4812, also resulting in opposite electrical potentials and deformation of active material layers 4806 and 4810. Although not shown, the resulting electrical potentials will be exactly the opposite as shown in FIG. 48. It should further be understood that a bimorph stack up as described in FIG. 48 may be used instead of a unimorph stack up as previously discussed in reference to FIGS. 2-47 as desired.

Figure 49:
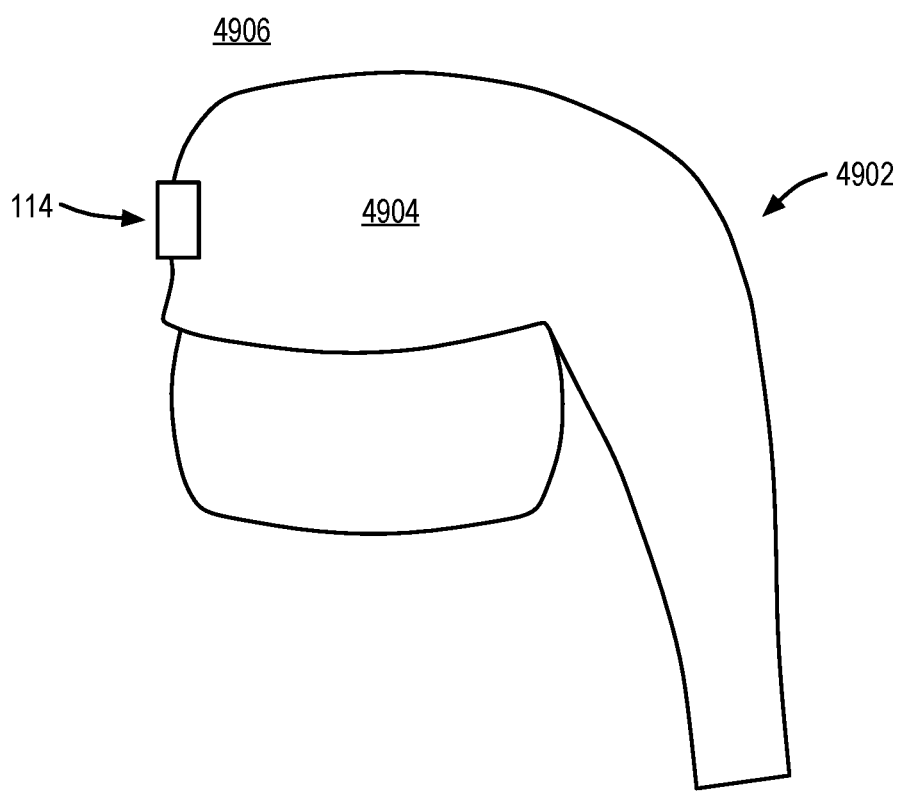
FIG. 49 illustrates a schematic side view of one aspect of an electronic device within which the valve assembly of FIG. 1-FIG. 48 may be implemented.

As previously discussed, any one or more of the valve assemblies disclosed herein in reference to FIGS. 1-48 may be dynamically controlled by the application of a voltage to control the amount of leak between the chambers or volumes that they connect. For example, any one or more of the valve assemblies may be dynamically opened to connect a front volume chamber or a back volume chamber of a transducer to an ambient environment surrounding the chambers and/or device enclosure in which the transducer is implemented. For example, FIG. 49 illustrates a schematic representation of a valve assembly 114 coupled to the housing of a device 4902 and used to connect an interior volume 4904 of the housing (in which a transducer may be positioned) with ambient environment 4906. In other aspects, any one or more of the valve assemblies may be dynamically opened to connect the front volume chamber to the back volume chamber of the transducer. It should further be understood that although the valve assemblies are described as opening/closing various chamber associated with transducers, they may be used to open/close or otherwise connect any chambers where dynamical control of a leak between the chambers or different volumes is desired.

Figure 50:
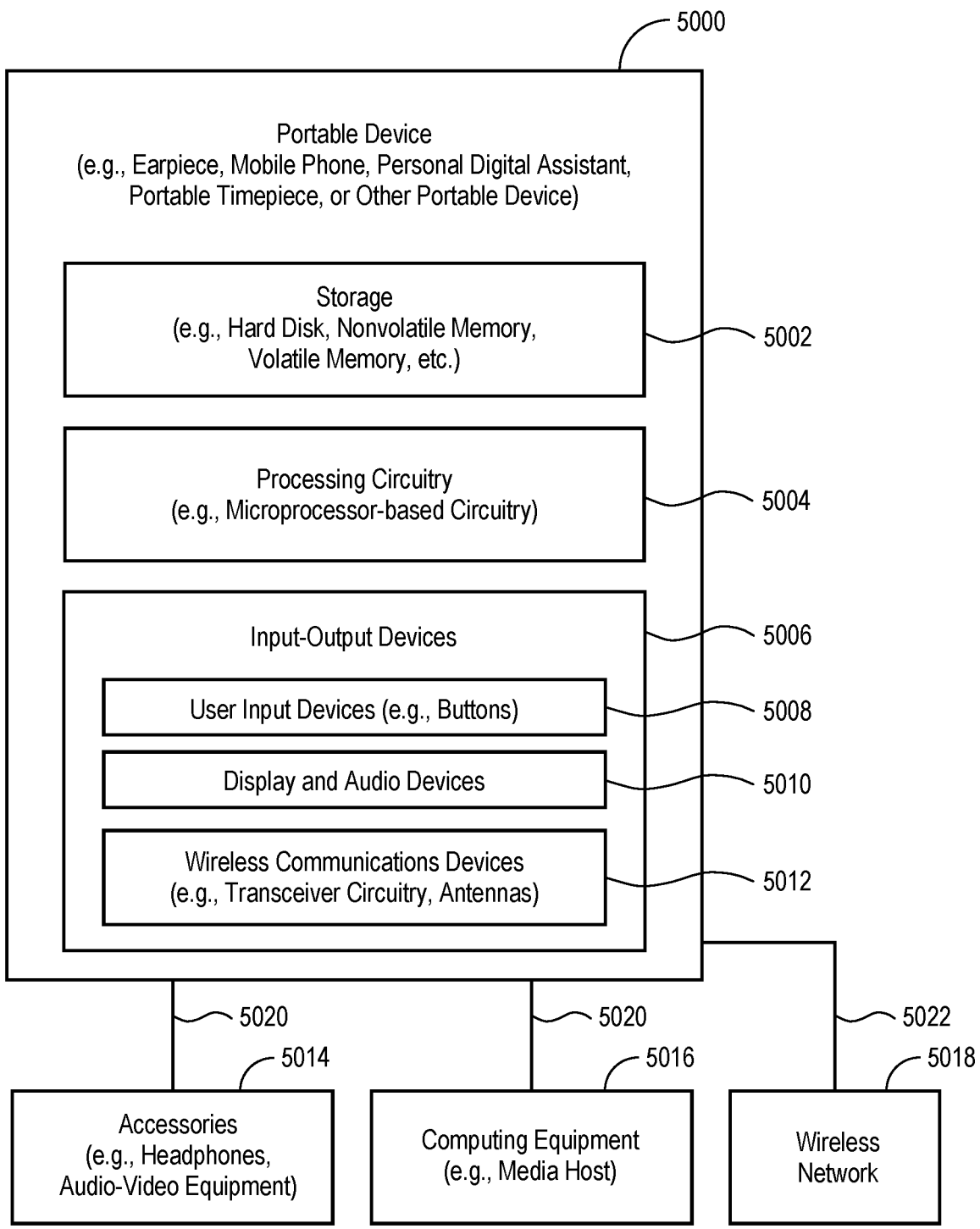
FIG. 50 illustrates a block diagram of one aspect of an electronic device within which valve assembly of FIG. 1-FIG. 48 may be implemented.

FIG. 50 illustrates a block diagram of one aspect of an electronic device within which the previously discussed transducer and/or valve assembly may be implemented. As shown in FIG. 50, device 5000 may be any type of portable device within which a transducer and/or valve assembly disclosed herein may be desired, for example, an earpiece (e.g., in-ear earpiece, hearing aid or the like), mobile phone, personal digital assistant, portable timepiece or other portable device. Device 5000 may include storage 5002. Storage 902 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 5004 may be used to control the operation of device 5000. Processing circuitry 5004 may be based on a processor such as a microprocessor and other suitable integrated circuits. With one suitable arrangement, processing circuitry 5004 and storage 5002 are used to run software on device 5000, such as internet browsing applications, voice-over-internet-protocol (VOIP) telephone call applications, email applications, media playback applications, operating system functions, etc. Processing circuitry 5004 and storage 5002 may be used in implementing suitable communications protocols. Communications protocols that may be implemented using processing circuitry 5004 and storage 5002 include internet protocols, wireless local area network protocols (e.g., IEEE 802.11 protocols—sometimes referred to as Wi-Fi®), protocols for other short-range wireless communications links such as the Bluetooth® protocol, protocols for handling 3G or 4G communications services (e.g., using wide band code division multiple access techniques), 2G cellular telephone communications protocols, etc.

To minimize power consumption, processing circuitry 5004 may include power management circuitry to implement power management functions. For example, processing circuitry 5004 may be used to adjust the gain settings of amplifiers (e.g., radio-frequency power amplifier circuitry) on device 5000. Processing circuitry 5004 may also be used to adjust the power supply voltages that are provided to portions of the circuitry on device 5000. For example, higher direct-current (DC) power supply voltages may be supplied to active circuits and lower DC power supply voltages may be supplied to circuits that are less active or that are inactive. If desired, processing circuitry 5004 may be used to implement a control scheme in which the power amplifier circuitry is adjusted to accommodate transmission power level requests received from a wireless network.

Input-output devices 5006 may be used to allow data to be supplied to device 5000 and to allow data to be provided from device 5000 to external devices. Display screens, microphone acoustic ports, speaker acoustic ports, and docking ports are examples of input-output devices 5006. For example, input-output devices 5006 can include user input-output devices 5008 such as buttons, touch screens, joysticks, click wheels, scrolling wheels, touch pads, key pads, keyboards, microphones, cameras, etc. A user can control the operation of device 5000 by supplying commands through user input devices 5008. Display and audio devices 5010 may include liquid-crystal display (LCD) screens or other screens, light-emitting diodes (LEDs), and other components that present visual information and status data. Display and audio devices 5010 may also include audio equipment such as speakers and other devices for creating sound. Display and audio devices 5010 may contain audio-video interface equipment such as jacks and other connectors for external headphones and monitors.

Wireless communications devices 5012 may include communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications). Representatively, in the case of a speaker acoustic port, the speaker may be associated with the port and be in communication with an RF antenna for transmission of signals from the far end user to the speaker.

Returning to FIG. 50, device 5000 can communicate with external devices such as accessories 5014, computing equipment 5016, and wireless network 5018 as shown by paths 5020 and 5022. Paths 5020 may include wired and wireless paths. Path 5022 may be a wireless path. Accessories 5014 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 5016 may be any suitable computer. With one suitable arrangement, computing equipment 5016 is a computer that has an associated wireless access point (router) or an internal or external wireless card that establishes a wireless connection with device 5000. The computer may be a server (e.g., an internet server), a local area network computer with or without internet access, a user's own personal computer, a peer device (e.g., another portable electronic device), or any other suitable computing equipment.

Wireless network 5018 may include any suitable network equipment, such as cellular telephone base stations, cellular towers, wireless data networks, computers associated with wireless networks, etc. For example, wireless network 5018 may include network management equipment that monitors the wireless signal strength of the wireless handsets (cellular telephones, handheld computing devices, etc.) that are in communication with network 5018.

Figure 51:
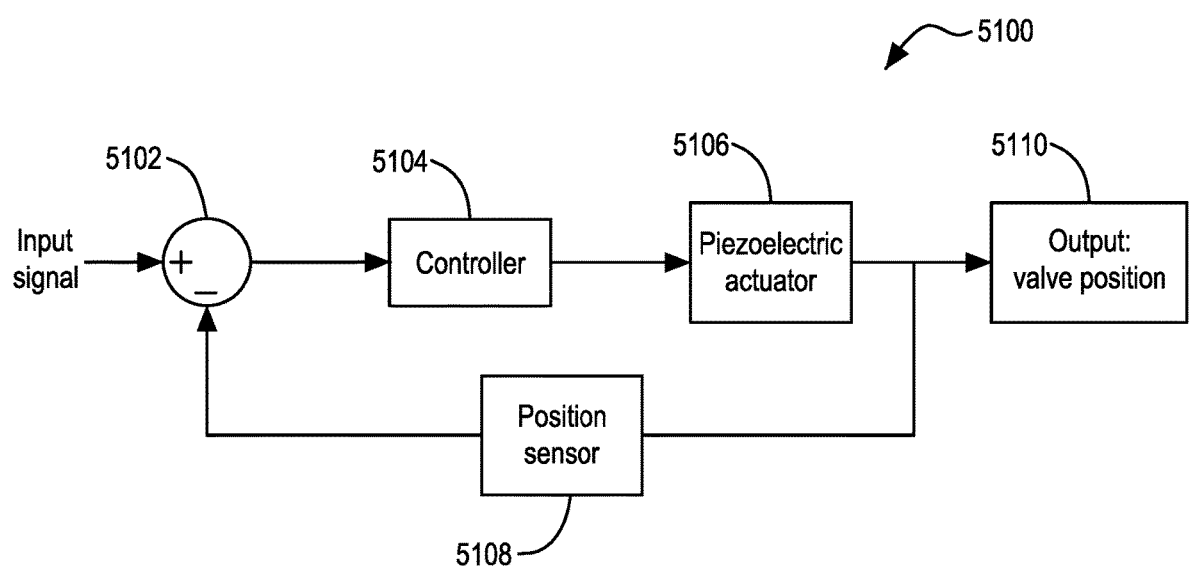
FIG. 51 illustrates a block diagram of one exemplary closed loop system for controlling valve displacement/position to determine acoustic impedance.

FIG. 51 illustrates a block diagram of one exemplary system for controlling valve displacement and/or position to determine acoustic impedance. Representatively, system 5100 may be a closed-loop control system that can precisely control the valve displacement and/or position to determine the acoustic impedance using the position information obtained from the sensing mechanisms previously discussed in reference to FIGS. 41, 42 and 43A-B. For example, the previously discussed sensing mechanisms may measure the moving member's position/deformation and provide an input signal to the system at operation 5102. This information may then be communicated and/or processed by the controller at operation 5104, which provides an input to valve or actuator 5106, which in turn outputs the valve position at operation 5110. The position sensors 5108 measuring the position/deformation of the moving member feeds the information back into the system to form a feedback loop in the valve system that can be used to determine the acoustic impedance.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting. For example, although a speaker is specifically disclosed herein, the valve disclosed herein could be used with other types of transducers, for example, microphones. In addition, in some aspects, the valve could be used to open/close the opening to an acoustic resonator or attenuator coupled to a transducer. Still further, although portable electronic devices (e.g., in-ear earpiece, hearing aid, mobile phone, personal digital assistant, portable timepiece, etc.), any of the previously discussed valve configurations may be implemented within a tablet computer, personal computer, laptop computer, notebook computer, headphones or the like. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A piezoelectric valve comprising:
a fixed portion defining an opening;

a number of movable portions extending from the fixed portion over the opening and separated from one another by radially oriented slits, each movable portion of the number of movable portions comprising a first material layer defining a first side and a second side of the movable portion having different lengths and a second material layer, the first material layer comprises an inactive material layer having corrugations formed in a surface of the inactive material layer and the second material layer comprises a piezoelectric material confined to a perimeter portion of the first material layer between the corrugations and that is operable to drive a displacement of the movable portion in a direction opposite to an adjacent movable portion sharing a same radially oriented slit upon application of a voltage; and a sensor material layer formed on the inactive material layer of each movable portion to sense a position of each movable portion.

2. The piezoelectric valve of claim 1 wherein each movable member comprises a stack up of the first material layer comprising the inactive material layer and the second material layer comprising the piezoelectric material and an electrode layer, and the perimeter portion extends along less than half the first length or the second length of the first material layer.

3. The piezoelectric valve of claim 1 wherein the displacement of the number of movable portions transitions the valve to an open position allowing a fluid to flow through the opening.

4. The piezoelectric valve of claim 1 wherein at least three movable portions of the number of movable portions are operable to be displaced in a first direction and at least three adjacent movable portions of the number of movable portions are operable to be displaced in a second direction opposite to the first direction.

5. The piezoelectric valve of claim 1 wherein each movable portion of the number of movable portions comprises a cantilever having a tapered shape.

6. The piezoelectric valve of claim 1 wherein each movable portion of the number of movable portions comprises a polygon shape.

7. The piezoelectric valve of claim 6 wherein the polygon shape comprises a first side having a different length than a second side.

8. The piezoelectric valve of claim 1 wherein each movable portion of the number of movable portions comprises a length dimension extending to a center of the opening, the inactive material layer extends along an entire length of the movable portion and the second material layer comprises the piezoelectric material layer extending along less than half of the entire length of the movable portion to cause the inactive material layer to bend upon application of the voltage.

9. The piezoelectric valve of claim 1 wherein the sensor material layer is formed within a groove forming the corrugations in the first material layer of each movable portion.

10. A piezoelectric valve comprising:
a fixed portion defining an opening;
a number of movable plates extending from the fixed portion over the opening and separated from one another by slits, each movable plate of the number of movable plates comprising a first material layer and a second material layer, the first material layer comprises an inactive material layer and corrugations formed in a surface of the inactive material layer and the second material layer comprises a piezoelectric material confined to a perimeter portion of the first material layer between the corrugations and that is operable to drive a displacement of edges of the movable plates in opposite directions; and a sensor material layer formed on the inactive material layer of each movable plate to sense a position of each movable plate.

11. The piezoelectric valve of claim 10 wherein each movable plate comprises a stack up of the first material layer and the second material layer comprising the piezoelectric material and an electrode layer.

12. The piezoelectric valve of claim 10 wherein each movable plate of the number of movable plates comprises four edges and the second material layer comprises the piezoelectric material in a rectangular shape that is arranged parallel to at least one of the four edges of each movable plate.

13. The piezoelectric valve of claim 10 wherein the number of movable plates comprises at least four movable plates arranged in a two by two array.

14. The piezoelectric valve of claim 10 wherein the displacement of the edges comprises at least two edges of a first movable plate moving out of plane in a first direction and at least two edge of a second movable plate moving out of plane in a second direction opposite to the first direction.

15. A piezoelectric valve comprising:
a fixed portion defining an opening;
a number of movable portions extending from the fixed portion over the opening and separated from one another by radially oriented slits, each movable portion of the number of movable portions comprising a first material layer defining a first side and a second side of the movable portion having different lengths and a second material layer, the first material layer comprises an inactive material layer and the second material layer comprises a piezoelectric material confined to a perimeter portion of the first material layer and that is operable to drive a displacement of the movable portion in a direction opposite to an adjacent movable portion sharing a same radially oriented slit upon application of a voltage; and a sensor material layer formed within a groove in the inactive material layer of each movable portion to sense a position of each movable portion.

16. The piezoelectric valve of claim 15 wherein each movable member comprises a stack up of the first material layer comprising the inactive material layer and the second material layer comprising the piezoelectric material and an electrode layer, and the perimeter portion extends along less than half the first length or the second length of the first material layer.

17. The piezoelectric valve of claim 15 wherein the displacement of the number of movable portions transitions the valve to an open position allowing a fluid to flow through the opening.

18. The piezoelectric valve of claim 15 wherein at least three movable portions of the number of movable portions are operable to be displaced in a first direction and at least three adjacent movable portions of the number of movable portions are operable to be displaced in a second direction opposite to the first direction.

19. The piezoelectric valve of claim 15 wherein each movable portion of the number of movable portions comprises a cantilever having a tapered shape.

20. The piezoelectric valve of claim 15 wherein each movable portion of the number of movable portions comprises a polygon shape.

21. The piezoelectric valve of claim 20 wherein the polygon shape comprises a first side having a different length than a second side.

22. The piezoelectric valve of claim 15 wherein each movable portion of the number of movable portions comprises a length dimension extending to a center of the opening, the inactive material layer extends along an entire length of the movable portion and the second material layer comprises the piezoelectric material layer extending along less than half of the entire length of the movable portion to cause the inactive material layer to bend upon application of the voltage.

23. The piezoelectric valve of claim 15 wherein corrugations are formed in a surface of the inactive material layer of each movable portion and the piezoelectric material is confined to the perimeter portion of the first material layer between the corrugations.

* * * * *